United States Patent
Takahashi et al.

(10) Patent No.: US 10,988,608 B2
(45) Date of Patent: Apr. 27, 2021

(54) RESIN COMPOSITION, RESIN FILM, METHOD OF MANUFACTURING RESIN FILM, OPTICAL FILTER, SOLID-STATE IMAGING ELEMENT, IMAGE DISPLAY DEVICE, AND INFRARED SENSOR

(71) Applicant: FUJIFILM Corporation, Tokyo (JP)

(72) Inventors: Kazutaka Takahashi, Haibara-gun (JP); Tetsushi Miyata, Haibara-gun (JP); Hiromu Koizumi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 23 days.

(21) Appl. No.: 16/443,114

(22) Filed: Jun. 17, 2019

(65) Prior Publication Data

US 2019/0300694 A1    Oct. 3, 2019

Related U.S. Application Data

(63) Continuation of application No. PCT/JP2017/046284, filed on Dec. 25, 2017.

(30) Foreign Application Priority Data

Feb. 1, 2017 (JP) .............................. JP2017-016785

(51) Int. Cl.
| | | |
|---|---|---|
| C08L 33/14 | (2006.01) | |
| C08K 5/00 | (2006.01) | |
| G02B 5/20 | (2006.01) | |
| G03F 7/004 | (2006.01) | |
| H01L 27/146 | (2006.01) | |
| C08L 101/00 | (2006.01) | |
| G02B 5/22 | (2006.01) | |
| H01L 31/10 | (2006.01) | |

(52) U.S. Cl.
CPC ............... *C08L 33/14* (2013.01); *C08K 5/00* (2013.01); *C08K 5/0041* (2013.01); *C08L 101/00* (2013.01); *G02B 5/20* (2013.01); *G02B 5/208* (2013.01); *G02B 5/22* (2013.01); *G03F 7/004* (2013.01); *H01L 27/146* (2013.01); *H01L 31/10* (2013.01); *C08K 2201/002* (2013.01); *C08L 2203/16* (2013.01)

(58) Field of Classification Search
CPC ..... C08L 33/14; C08L 2203/16; G02B 5/208; C08K 2201/002; C08K 5/0041

USPC .............................................. 524/88
See application file for complete search history.

(56) References Cited

U.S. PATENT DOCUMENTS

| | | | | |
|---|---|---|---|---|
| 2015/0376412 A1* | 12/2015 | Harada | .............. | G03G 9/08726 430/109.2 |
| 2017/0174869 A1* | 6/2017 | Arayama | ............... | G02B 5/223 |
| 2018/0094118 A1 | 4/2018 | Oota et al. | | |

FOREIGN PATENT DOCUMENTS

| | | | | |
|---|---|---|---|---|
| JP | 7-198928 | A | | 8/1995 |
| JP | 07198928 | A | * | 8/1995 |
| JP | 2004-258134 | A | | 9/2004 |
| JP | 2009-92749 | A | | 4/2009 |
| JP | 2009092749 | A | * | 4/2009 |
| JP | 2010-181596 | A | | 8/2010 |
| JP | 2010-181812 | A | | 8/2010 |
| JP | 2011-38061 | A | | 2/2011 |
| JP | 2014-156501 | A | | 8/2014 |
| JP | 2015-030782 | A | | 2/2015 |
| JP | 2015-30783 | A | | 2/2015 |
| WO | WO 2016-035695 | A1 | | 3/2016 |
| WO | WO 2016-19452 | A1 | | 12/2016 |
| WO | WO 2016/203890 | A1 | | 12/2016 |

OTHER PUBLICATIONS

Translation of JP 2009-092749 (Patent application 2007-260945), Apr. 30, 2009. (Year: 2009).*
Translation of JP 07-198928 (Patent application H05-336784), Aug. 1, 1995. (Year: 1995).*
International Preliminary Report on Patentability and Written Opinion of the International Searching Authority (Forms PCT/IB/326, PCT/IB/373 and PCT/ISA/237) for International Application No. PCT/JP2017/046284, dated Aug. 15, 2019, with English translation of the Written Opinion.
International Search Report (From PCT/ISA/210) for International Application No. PCT/JP2017/046284, dated Mar. 20, 2018, with English translation.
Japanese Office Action, dated Jul. 28, 2020, for corresponding Japanese Application No. 2018-565987, with an English translation.
Notice of Reasons for Refusal in Japanese Patent Application No. 2018-565987 dated Feb. 22, 2021 with English translation.

* cited by examiner

*Primary Examiner* — Hui H Chin

(74) *Attorney, Agent, or Firm* — Birch, Stewart, Kolasch & Birch, LLP.

(57) ABSTRACT

A resin composition includes an organic pigment, a resin, and a solvent, in which a content of a Na atom is 0.01 to 50 mass ppm with respect to a total solid content of a resin composition.

21 Claims, 3 Drawing Sheets

RESIN COMPOSITION, RESIN FILM, METHOD OF MANUFACTURING RESIN FILM, OPTICAL FILTER, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2017/046284, filed on Dec. 25, 2017, which claims priority under 35 U.S.C. § 119(a) to Japanese Patent Application No. 2017-016785, filed on Feb. 1, 2017. Each of the above application(s) is hereby expressly incorporated by reference, in its entirety, into the present application.

BACKGROUND OF THE INVENTION

1. Field of the Invention

The present invention relates to a resin composition, a resin film, a method of manufacturing a resin film, an optical filter, a solid-state imaging element, an image display device, and an infrared sensor.

2. Description of the Related Art

In recent years, the demand for solid-state imaging elements such as a charge coupled device (CCD) and a complementary metal oxide semiconductor (CMOS) has been greatly increased due to the widespread use of digital cameras, mobile phones with cameras and the like. Color filters are used as key devices for displays and optical elements.

For example, a color filter has been manufactured by using a composition including a colorant, a resin, and a solvent (for example, JP2011-038061A, JP2010-181812A, JP2010-181596A, and JP2004-258134A).

Since the solid-state imaging element uses a silicon photodiode having sensitivity to near infrared rays at a light receiving section thereof, it is necessary to correct visual sensitivity, and a near infrared cut filter or the like is used in many cases. For example, the near infrared cut filter is manufactured by using a composition including a near infrared absorbing agent, a resin, and a solvent.

SUMMARY OF THE INVENTION

However, according to the study of the present inventor, in a case where a resin film is manufactured by using a composition including an organic pigment and a resin, it has been found that a foreign matter derived from a compound having a coloring agent structure such as an organic pigment is formed in the resin film in some cases.

An object of the present invention is to provide a resin composition capable of manufacturing a resin film having few foreign matters. Another object of the present invention is to provide a resin film having few foreign matters, a method of manufacturing a resin film, an optical filter, a solid-state imaging element, an image display device, and an infrared sensor.

As a result of various studies, the present inventor found that, by setting the content of Na atoms in the resin film to a predetermined range, the resin film having few foreign matters can be obtained, and completed the present invention. Accordingly, the present invention provides the following.

<1> A resin composition comprising: an organic pigment; a resin; and a solvent, in which a content of a Na atom is 0.01 to 50 mass ppm with respect to a total solid content of the resin composition.

<2> The resin composition according to <1>, in which the content of the Na atom is 0.03 to 30 mass ppm with respect to the total solid content of the resin composition.

<3> The resin composition according to <1>, in which the content of the Na atom is 0.1 to 10 mass ppm with respect to the total solid content of the resin composition.

<4> The resin composition according to any one of <1> to <3>, in which the organic pigment is a near infrared absorbing organic pigment having a maximum absorption wavelength in a wavelength range of 600 to 1,200 nm.

<5> The resin composition according to any one of <1> to <4>, in which a content of a K atom is 10 mass ppm or less with respect to the total solid content of the resin composition.

<6> The resin composition according to any one of <1> to <5>, in which a content of a Li atom is 10 mass ppm or less with respect to the total solid content of the resin composition.

<7> The resin composition according to any one of <1> to <6>, further comprising: a pigment derivative.

<8> A resin film obtained from the resin composition according to any one of <1> to <7>.

<9> A resin film comprising: an organic pigment; and a resin, in which a content of a Na atom is 0.01 to 50 mass ppm with respect to a total solid content of the resin film.

<10> A method of manufacturing a resin film, comprising: applying a resin composition including an organic pigment, a resin, and a solvent, onto a support, to manufacture a resin film including 0.01 to 50 mass ppm of a Na atom with respect to a total solid content of the resin film, in which a resin composition in which a content of the Na atom is 0.01 to 50 mass ppm with respect to the total solid content of the resin composition is used as the resin composition, or in a case of manufacturing the resin film, the Na atom is transferred from a layer or a member adjacent to the resin film to the resin film, so as to adjust the content of the Na atom in the resin film to 0.01 to 50 mass ppm with respect to the total solid content of the resin film.

<11> An optical filter comprising: the resin film according to <8> or <9>.

<12> The optical filter according to <11>, in which the optical filter is a color filter, a near infrared cut filter, or an infrared transmitting filter.

<13> A solid-state imaging element comprising: the resin film according to <8> or <9>.

<14> An image display device comprising: the resin film according to <8> or <9>.

<15> An infrared sensor comprising: the resin film according to <8> or <9>.

According to the present invention, it is possible to provide a resin composition capable of manufacturing a resin film having few foreign matters. It is possible to provide a resin film having few foreign matters, a method of manufacturing a resin film, an optical filter, a solid-state imaging element, an image display device, and an infrared sensor.

DESCRIPTION OF THE PREFERRED EMBODIMENTS

Figure 1:
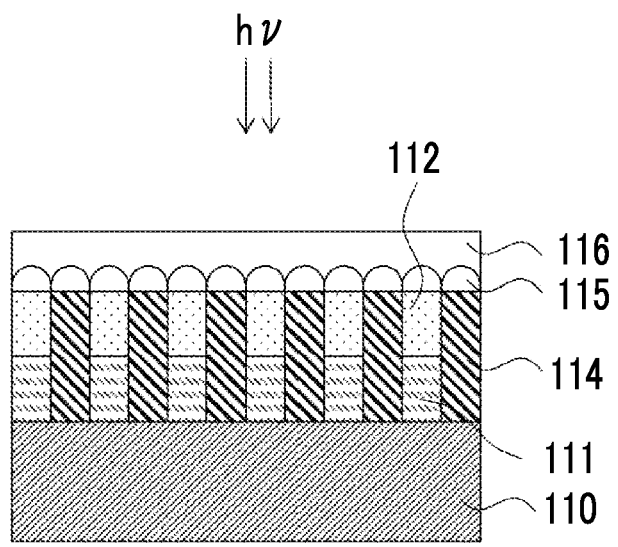
FIG. 1 is a schematic view illustrating an embodiment of an infrared sensor.

Hereinafter, the content of the present invention is specifically described.

In the present specification, "to" is used to mean that the numerical values listed before and after "to" are a lower limit and an upper limit respectively.

In the present specification, "(meth)acrylate" represents both or any one of "acrylate" or "methacrylate", "(meth)allyl" represents both or any one of "allyl" or "methallyl", and "(meth)acryloyl" represents both or any one of "acryloyl" or "methacryloyl".

With respect to an indication of a group (atomic group) in the present specification, an indication in which substitution or unsubstitution is not described includes a group (atomic group) having a substituent together with a group (atomic group) not having a substituent. For example, an "alkyl group" includes not only an alkyl group not having a substituent (unsubstituted alkyl group) but also an alkyl group having a substituent (substituted alkyl group).

In the present specification, Me in the chemical formula indicates a methyl group, Et indicates an ethyl group, Pr indicates a propyl group, Bu indicates a butyl group, and Ph indicates a phenyl group.

In the present specification, the near infrared ray indicates light (electromagnetic waves) having a wavelength range of 700 to 2,500 nm.

In the present specification, the total solid content refers to the total mass of components obtained by removing the solvent from all components of the composition.

In the present specification, the weight-average molecular weight is defined as polystyrene equivalent values measured by gel permeation chromatography (GPC). In the present specification, the weight-average molecular weight (Mw) can be obtained, for example, by using HLC-8220 (manufactured by Tosoh Corporation) as a determination device, TSKgel Super AWM-H (manufactured by Tosoh Corporation, 6.0 mm (inner diameter)×15.0 cm) as a column, and a 10 mmol/L lithium bromide N-methylpyrrolidinone (NMP) solution as an eluent.

<Resin Composition>

The resin composition according to the embodiment of the present invention is a resin composition including an organic pigment, a resin, and a solvent, and the content of a Na atom is 0.01 to 50 mass ppm with respect to a total solid content of the resin composition. It is possible to manufacture a film having few foreign matters by using the resin composition according to the embodiment of the present invention. The reason that the effect can be obtained is assumed as follows.

It is assumed that, by causing 0.01 to 50 mass ppm of a Na atom to be contained in the resin composition, a polar group having a resin is appropriately protected by a Na atom, phase separation from an organic pigment, a resin, or the like in the resin film is suppressed, dispersibility of the organic pigment in the resin film is increased, and as a result, the generation of foreign matters derived from a compound having a coloring agent structure such as the organic pigment in a case of film formation can be effectively suppressed. Meanwhile, in a case where the content of the Na atom in the resin composition is too much, there has been a tendency in that, due to the heating in a case of film formation, a Na atom moves in the resin film to decrease dispersibility of the organic pigment or the like, but in a case where the content of the Na atom in the resin composition is 50 mass ppm or less, it is assumed that the movement of the Na atom in the resin film due to the heating in a case of film formation is suppressed, and as a result, the generation of the foreign matters can be effectively suppressed.

In the related art, there is a tendency in that the foreign matters are easily generated as the content of the organic pigment in the resin composition increases, but according to the present invention, it is possible to form a resin film having few foreign matters even in a case where the content of the organic pigment in the resin composition is increased. Accordingly, the present invention is particularly effective in a case of a resin composition including many organic pigments.

The content of the Na atom in the resin composition according to the embodiment of the present invention is 0.01 to 50 mass ppm, preferably 0.03 to 30 mass ppm, and more preferably 0.1 to 10 mass ppm with respect to the total solid content of the resin composition. According to an aspect, a resin film having fewer foreign matters can be easily formed. Examples of the method of adjusting the content of the Na atom in the resin composition to be in the above range include a method of decreasing the content of the Na atom by using a raw material with a less content of the Na atom or by performing purification after the preparation of the resin composition. For example, in a resin or the like that is used as a raw material, a small amount of Na atoms eluted from a catalyst used in the synthesis or a reaction container are included in a large scale. In a case where the content of the Na atom included in the resin is adjusted to the above range, the content of the Na atom in the resin composition can be easily adjusted in the above range.

The content of the K atom in the resin composition according to the embodiment of the present invention is preferably 10 mass ppm or less, more preferably 7 mass ppm or less, and even more preferably 4 mass ppm or less with respect to the total solid content of the resin composition. In a case where the content of the K atom in the resin composition is 10 mass ppm or less, the number of defects after the film formation is easily suppressed.

The content of the Li atom in the resin composition according to the embodiment of the present invention is preferably 10 mass ppm or less, more preferably 7 mass ppm or less, and even more preferably 4 mass ppm or less with respect to the total solid content of the resin composition. In a case where the content of the Li atom in the resin composition is 10 mass ppm or less, the number of defects after the film formation is easily suppressed.

The total content of the K atom and the Li atom in the resin composition according to the embodiment of the present invention is preferably 10 mass ppm or less, more preferably 7 mass ppm or less, and even more preferably 4 mass ppm or less with respect to the total solid content of the resin composition. In a case where the total content of the K atom and the Li atom in the resin composition is 10 mass ppm or less, the number of defects after the film formation is easily suppressed.

Examples of the method of decreasing the content of the K atom and the Li atom in the resin composition include a method of decreasing the content of the K atom and the Li atom by using a raw material with less content of the K atom or the Li atom or by performing the purification treatment after the preparation of the resin composition.

According to the present invention, the content of the Na atom, the K atom, or the Li atom in the resin composition is a value quantified and measured by an absolute calibration curve method in inductively coupled plasma optical emission spectrometry (ICP-OES).

Hereinafter, each component included in the resin composition according to the embodiment of the present invention is described.

<<Organic Pigment>>

The resin composition according to the embodiment of the present invention contains an organic pigment. The kind of the organic pigment is not particularly limited. The organic pigment may be an organic pigment (hereinafter, also referred to as a chromatic organic pigment) having absorption in the visible range, and an organic pigment (hereinafter, also referred to as a near infrared absorbing organic pigment) having absorption in the near infrared range. The solubility of the organic pigment with respect to the solvent (25° C.) included in the resin composition is preferably 0 to 0.1 g/L and more preferably 0 to 0.01 g/L.

The chromatic organic pigment is not particularly limited, and examples thereof include a coloring agent compound having absorption in a visible range (preferably, the range of wavelength 400 nm or more and less than 600 nm). Examples thereof include a diketopyrrolopyrrole compound, a phthalocyanine compound, a naphthalocyanine compound, an azo compound, an isoindoline compound, a quinophthalone compound, a benzimidazolone compound, and a perinone compound. Specific examples of the chromatic organic pigment include the following. Compounds disclosed in paragraphs 0035 to 0038 of JP2011-038061A can also be used.

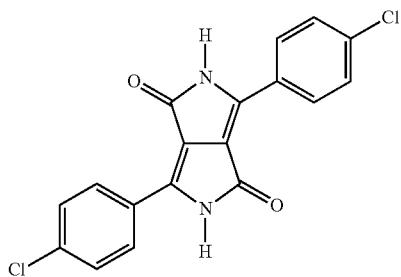 [SMILES: O=C1NC(c2ccc(Cl)cc2)=C2C(=O)NC(c3ccc(Cl)cc3)=C12]

As the chromatic organic pigment, compounds of the following color index (CI) numbers can also be used.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of the above are yellow pigment), C. I. Pigment Orange 2, 5, 13, 16, 17:1, 31, 34, 36, 38, 43, 46, 48, 49, 51, 52, 55, 59, 60, 61, 62, 64, 71, 73, and the like (all of the above are orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all of the above are red pigments), C. I. Pigment Green 7, 10, 36, 37, 58, 59, and the like (all of the above are green pigments), C. I. Pigment Violet 1, 19, 23, 27, 32, 37, 42, and the like (all of the above are violet pigments), and C. I. Pigment Blue 1, 2, 15, 15:1, 15:2, 15:3, 15:4, 15:6, 16, 22, 60, 64, 66, 79, 80, and the like (all of the above are blue pigments).

The near infrared absorbing organic pigment is preferably a coloring agent compound having a maximum absorption wavelength in the wavelength range of 600 to 1,200 nm and more preferably a coloring agent compound having a maximum absorption wavelength in the wavelength range of 700 to 1,000 nm. In the present invention, the organic pigment is preferably a near infrared absorbing organic pigment. In the resin film using the near infrared absorbing organic pigment, there is a tendency in that the foreign matter is formed, but in the present invention, even in a case where the near infrared absorbing organic pigment is used, a resin film having few foreign matters can be formed, and the effect of the present invention is particularly easily obtained.

The near infrared absorbing organic pigment is preferably a coloring agent compound having a π-conjugated plane including a monocyclic or fused aromatic ring. The number of atoms other than hydrogen having a π-conjugated plane included in the coloring agent compound is preferably 14 or more, more preferably 20 or more, even more preferably 25 or more, and particularly preferably 30 or more. The upper limit is preferably 80 or less and more preferably 50 or less. The π-conjugated plane of the above coloring agent compound preferably includes two or more monocyclic or fused aromatic rings, more preferably includes three or more of the aromatic rings, even more preferably includes four or more of the aromatic rings, and particularly preferably includes five or more of the aromatic rings. The upper limit is preferably 100 or less, more preferably 50 or less, and even more preferably 30 or less. Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring having these rings.

Examples of the near infrared absorbing organic pigment include a pyrrolopyrrole compound, a phthalocyanine compound, a naphthalocyanine compound, a perylene compound, a cyanine compound, a dithiol metal complex compound, a naphthoquinone compound, an iminium compound, an azo compound, and a squarylium compound, a pyrrolopyrrole compound, a phthalocyanine compound, a naphthalocyanine compound, a cyanine compound, and a squarylium compound are preferable, and a pyrrolopyrrole compound is more preferable. The pyrrolopyrrole compound is preferably a pyrrolopyrrole boron compound. Since the pyrrolopyrrole compound is excellent in near infrared absorptivity and invisibility, a near infrared cut filter having excellent near infrared shielding properties and excellent visible transparency or the like can be easily obtained. As a phthalocyanine compound, a naphthalocyanine compound, an iminium compound, a cyanine compound, a squarylium compound, and a croconium compound, compounds disclosed in paragraphs 0010 to 0081 of JP2010-111750A may be used, and the contents thereof are incorporated in the present specification.

According to the present invention, it is also preferable to use two or more kinds of near infrared absorbing organic pigments as the near infrared absorbing organic pigment. In this case, the maximum absorption wavelengths of the respective near infrared absorbing organic pigments may be identical to or different from each other. In a case where two or more kinds of the near infrared absorbing organic pigments having different maximum absorption wavelengths are used, the waveform of the absorption spectrum of the film is expanded compared with the case where one kind of the near infrared absorbing organic pigment was used, and thus near infrared rays in a wider wavelength range can be shielded.

In a case where two or more kinds of the near infrared absorbing organic pigments having different maximum absorption wavelengths are used, it is preferable to use a first pigment having a maximum absorption wavelength in the wavelength range of 600 to 1,200 nm and a second pigment that is on a shorter wavelength side of the maximum absorption wavelength of the first pigment and that has a maximum absorption wavelength in the wavelength range of 600 to 1,200 nm. A difference of the maximum absorption wavelength of the first pigment and the maximum absorption wavelength of the second pigment is preferably 1 to 150 nm.

(Pyrrolopyrrole Compound)

In the present invention, as a pyrrolopyrrole compound serving as a near infrared absorbing organic pigment, a compound represented by Formula (PP) is preferable. The maximum absorption wavelength of the compound represented by Formula (PP) is preferably included in the range of 600 to 1,200 nm, more preferably included in the range of 700 to 1,000 nm, even more preferably included in the range of 730 to 980 nm, and still even more preferably included in the range of 750 to 950 nm.

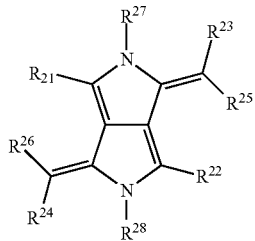

(PP)

In Formula (PP), $R^{21}$ and $R^{22}$ each independently represent an alkyl group, an aryl group or a heteroaryl group, $R^{23}$, $R^{24}$, $R^{25}$, and $R^{26}$ each independently represent a cyano group, an acyl group, an alkoxycarbonyl group, an alkyl sulfinyl group, an arylsulfinyl group or a heteroaryl group, $R^{27}$ and $R^{28}$ each independently represent a hydrogen atom, an alkyl group, an aryl group, a heteroaryl group, —$BR^{29}R^{30}$, or a metal atom, $R^{27}$ may form a covalent bond or a coordinate bond with $R^{21}$, $R^{23}$, or $R^{25}$, $R^{28}$ may form a covalent bond or a coordinate bond with $R^{22}$, $R^{24}$, or $R^{26}$, and $R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ may be bonded to each other to form a ring.

In Formula (PP), $R^{21}$ and $R^{22}$ each independently represent an alkyl group, an aryl group or a heteroaryl group, is preferably an aryl group or a heteroaryl group, and is more preferably an aryl group.

The number of carbon atoms of the alkyl group represented by $R^{21}$ and $R^{22}$ is preferably 1 to 30, more preferably 1 to 20, and even more preferably 1 to 10.

The number of carbon atoms of the aryl group represented by $R^{21}$ and $R^{22}$ is preferably 6 to 30, more preferably 6 to 20, and is particularly preferably 6 to 12.

The number of carbon atoms constituting the heteroaryl group represented by $R^{21}$ and $R^{22}$ is preferably 1 to 30 and more preferably 1 to 12. Examples of the kinds of the heteroatom constituting a heteroaryl group include a nitrogen atom, an oxygen atom, and a sulfur atom. The number of the heteroatoms constituting a heteroaryl group is preferably 1 to 3 and more preferably 1 to 2. The heteroaryl group is preferably a monocyclic ring or a fused ring, more preferably a monocyclic ring or a fused ring having a fused number of 2 to 8, and even more preferably a monocyclic ring or a fused ring having a fused number of 2 to 4.

The alkyl group, the aryl group, and the heteroaryl group may have a substituent and may be unsubstituted. It is preferable to have a substituent. Examples of the substituent include a hydrocarbon group which may contain an oxygen atom, an amino group, an acylamino group, an alkoxycarbonylamino group, an aryloxycarbonylamino group, a heterocyclic oxy group, a heterocyclic carbonyloxy group, a heterocyclic oxycarbonyl group, a heterocyclic oxycarbonylamino group, a sulfonylamino group, a sulfamoyl group, a carbamoyl group, an alkylthio group, an arylthio group, a heterocyclic thio group, an alkylsulfonyl group, an arylsulfonyl group, a heterocyclic sulfonyl group, an alkylsulfinyl group, arylsulfinyl group, a heterocyclic sulfinyl group, an ureido group, a phosphoric acid amide group, a mercapto group, an alkylsulfino group, an arylsulfino group, a hydrazino group, an imino group, a silyl group, a hydroxy group, a halogen atom, and a cyano group, and a hydrocarbon group which may contain an oxygen atom or a halogen atom is preferable.

Examples of the halogen atom as the substituent include a fluorine atom, a chlorine atom, a bromine atom, and an iodine atom.

Examples of the hydrocarbon group as the substituent include an alkyl group, an alkenyl group, and an aryl group.

The number of carbon atoms of the alkyl group is preferably 1 to 40. The lower limit is more preferably 3 or more, even more preferably 5 or more, still even more preferably 8 or more, and particularly preferably 10 or more. The upper limit is more preferably 35 or less and even more preferably 30 or less. The alkyl group may be linear, branched, or cyclic, but is preferably linear or branched, and particularly preferably branched. The number of carbon atoms of the branched alkyl group is preferably 3 to 40. For example, the lower limit is more preferably 5 or more, even more preferably 8 or more, and still even more preferably 10 or more. The upper limit is more preferably 35 or less and even more preferably 30 or less. The number of branches of the branched alkyl group is preferably 2 to 10 and more preferably 2 to 8.

The number of carbon atoms of the alkenyl group is preferably 2 to 40. For example, the lower limit is more preferably 3 or more, even more preferably 5 or more, still even more preferably 8 or more, and particularly preferably 10 or more. The upper limit is more preferably 35 or less and even more preferably 30 or less. The alkenyl group may be linear, branched, or cyclic, but is preferably linear or branched, and particularly preferably branched. The number of carbon atoms of the branched alkenyl group is preferably 3 to 40. For example, the lower limit is more preferably 5 or more, even more preferably 8 or more, and still even more preferably 10 or more. The upper limit is more preferably 35 or less and even more preferably 30 or less. The number of branches of the branched alkenyl group is preferably 2 to 10 and more preferably 2 to 8.

The number of carbon atoms of the aryl group is preferably 6 to 30, more preferably 6 to 20, and even more preferably 6 to 12.

The number of hetero atoms constituting the heterocyclic ring included in a heterocyclic oxy group, a heterocyclic carbonyloxy group, a heterocyclic oxycarbonyl group, a heterocyclic oxycarbonylamino group, a heterocyclic thio group, a heterocyclic sulfonyl group, and a heterocyclesulfinyl group is preferably 1 to 3 and more preferably 1 or 2. The heterocyclic ring is preferably a monocyclic ring or a fused ring, more preferably a monocyclic ring or a fused ring having a fused number of 2 to 8, and even more preferably a monocyclic ring or a fused ring having a fused number of 2 to 4.

Examples of the hydrocarbon group including an oxygen atom include a group represented by -L-$R^{x1}$.

L represents —O—, —CO—, —COO—, —OCO—, —(O$R^{x2}$)$_m$—, or —($R^{x2}$O)$_m$—. $R^{x1}$ represents an alkyl group, an alkenyl group, or an aryl group. $R^{x2}$ represents an alkylene group or an arylene group, m represents an integer of 2 or more, and m items of $R^{x2}$'s may be identical to or different from each other.

L is preferably —O—, —(O$R^{x2}$)$_m$—, or —($R^{x2}$O)$_m$— and more preferably —O—. L is preferably —OCO—.

The alkyl group, the alkenyl group, and the aryl group represented by $R^{x1}$ are the same as described above, and the preferable ranges are also the same. $R^{x1}$ is preferably an alkyl group or an alkenyl group and more preferably an alkyl group. In a case where L is —OCO—, $R^{x1}$ is preferably an aryl group.

The number of carbon atoms of the alkylene group represented by $R^{x2}$ is preferably 1 to 20, more preferably 1 to 10, and even more preferably 1 to 5. The alkylene group may be linear, branched, or cyclic, but is preferably linear or branched. The number of carbon atoms of the arylene group represented by $R^{x2}$ is preferably 6 to 20 and more preferably 6 to 12. $R^{x2}$ is preferably an alkylene group.

m represents an integer of 2 or more, preferably 2 to 20, and more preferably 2 to 10.

The substituent that may be included in the alkyl group, the aryl group, and the heteroaryl group is preferably a group having a branched alkyl structure. The substituent is preferably a hydrocarbon group which may include an oxygen atom and is more preferably a hydrocarbon group including an oxygen atom. The hydrocarbon group including an oxygen atom is preferably a group represented by —O—$R^{x1}$. $R^{x1}$ is preferably an alkyl group or an alkenyl group, more preferably an alkyl group, and particularly preferably a branched alkyl group. That is, the substituent is more preferably an alkoxy group or particularly preferably a branched alkoxy group. In a case where the substituent is an alkoxy group, a film having the heat resistance and the light resistance is easily obtained. The number of carbon atoms of the alkoxy group is preferably 1 to 40. For example, the lower limit is more preferably 3 or more, even more preferably 5 or more, still even more preferably 8 or more, and particularly preferably 10 or more. The upper limit is more preferably 35 or less and even more preferably 30 or less. The alkoxy group may be linear, branched, or cyclic, but is preferably linear or branched, and particularly preferably branched. The number of carbon atoms of the branched alkoxy group is preferably 3 to 40. For example, the lower limit is more preferably 5 or more, even more preferably 8 or more, and still even more preferably 10 or more. The upper limit is more preferably 35 or less and even more preferably 30 or less. The number of branches of the branched alkoxy group is preferably 2 to 10 and more preferably 2 to 8.

In Formula (PP), $R^{23}$, $R^{24}$, $R^{25}$, and $R^{26}$ each independently represent a cyano group, an acyl group, an alkoxycarbonyl group, an alkylsulfinyl group, an arylsulfinyl group, or a heteroaryl group.

It is preferable that one of $R^{23}$ and $R^{25}$ represents a cyano group, an acyl group, an alkoxycarbonyl group, an alkylsulfinyl group, or an arylsulfinyl group and the other represents a heteroaryl group, and it is more preferable that one of $R^{23}$ and $R^{25}$ represents a cyano group and the other represents preferably a heteroaryl group.

It is preferable that one of $R^{24}$ and $R^{26}$ represents a cyano group, an acyl group, an alkoxycarbonyl group, an alkylsulfinyl group, or an arylsulfinyl group and the other preferably represents a heteroaryl group, and it is more preferable that one of $R^{24}$ and $R^{26}$ represents a cyano group and the other represents preferably a heteroaryl group.

The heteroaryl group is preferably a 5-membered ring or a 6-membered ring. The heteroaryl group is preferably a monocyclic ring or a fused ring, more preferably a monocyclic ring or a fused ring having a fused number of 2 to 8, and even more preferably a monocyclic ring or a fused ring having a fused number of 2 to 4. The number of the heteroatoms constituting the heteroaryl group is preferably 1 to 3 and more preferably 1 to 2. Examples of the heteroatom include a nitrogen atom, an oxygen atom, and a sulfur atom. The heteroaryl group preferably has one or more nitrogen atoms. The number of carbon atoms constituting the heteroaryl group is preferably 1 to 30 and more preferably 1 to 12. The heteroaryl group may be a substituent and may be unsubstituted. Examples of the substituent include groups described in a substituent T.

(Substituent T)

An alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably an acyl group having 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a phosphoric acid amide group (preferably having 1 to 30 carbon atoms), a hydroxy group, a mercapto group, a halogen atom, a cyano group, an alkylsulfino group, an arylsulfino group, a hydrazino group, an imino group, and a heteroaryl group (preferably having 1 to 30 carbon atoms). In a case where these groups are further substitutable groups, the groups may further have a substituent. Examples of the substituent include the groups described as the substituent T.

The heteroaryl group represented by $R^{23}$ to $R^{26}$ is preferably a group represented by Formula (A-1) and a group represented by (A-2).

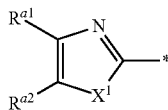
(A-1)

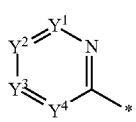
(A-2)

In Formula (A-1), $X^1$ represents O, S, $NR^{X1}$, or $CR^{X2}R^{X3}$, $R^{X1}$ to $R^{X3}$ each independently represent a hydrogen atom or a substituent, $R^{a1}$ and $R^{a2}$ each independently represent a hydrogen atom or a substituent, and $R^{a1}$ and $R^{a2}$ may be bonded to each other to form a ring. * represents a bonding position in Formula (PP).

Examples of $R^{a1}$, $R^{a2}$, and a substituent represented by $R^{X1}$ to $R^{X3}$ include the substituent T, and an alkyl group, an aryl group, and a halogen atom are preferable.

A ring formed by bonding $R^{a1}$ and $R^{a2}$ is preferably an aromatic ring. In a case where $R^{a1}$ and $R^{a2}$ forms a ring, examples of (A-1) include a group represented by (A-1-1) and a group represented by (A-1-2).

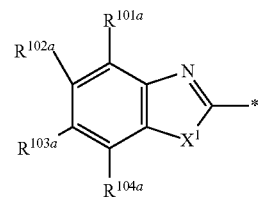
(A-1-1)

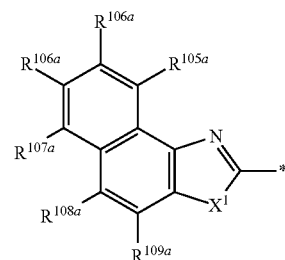
(A-1-2)

In the formulae, $X^1$ represents O, S, $NR^{X1}$, or $CR^{X2}R^{X3}$, $R^{X1}$ to $R^{X3}$ each independently represent a hydrogen atom or a substituent, and $R^{101a}$ to $R^{109a}$ each independently represent a hydrogen atom or a substituent. * represents a bonding position in Formula (PP). Examples of the substituent represented by $R^{101a}$ to $R^{109a}$ include the substituent T.

In Formula (A-2), $Y^1$ to $Y^4$ each independently represent N or $CR^{Y1}$, at least two of $Y^1$, ..., or $Y^4$ represents $CR^{Y1}$, $R^{Y1}$ represents a hydrogen atom or a substituent, and $R^{Y1}$'s adjacent to each other may be bonded to each other to form a ring. * represents a bonding position in Formula (PP). Examples of the substituent represented by $R^{Y1}$ include the substituent T, and an alkyl group, an aryl group, and a halogen atom are preferable.

At least two of $Y^1$, ..., or $Y^4$ are $CR^{Y1}$, and adjacent $R^{Y1}$'s may be bonded to each other to form a ring. A ring formed by bonding adjacent $R^{Y1}$'s to each other is preferably an aromatic ring. In a case where a ring is formed by adjacent $R^{Y1}$'s, examples of (A-2) include a group represented by (A-2-1) and a group represented by (A-2-2).

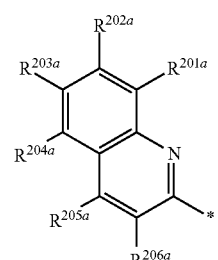
(A-2-1)

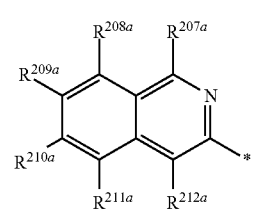
(A-2-2)

-continued

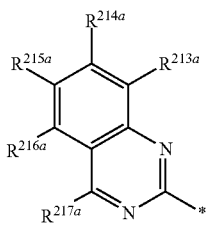
(A-2-3)

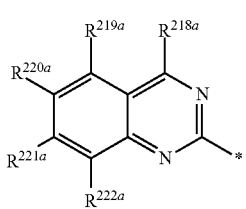
(A-2-4)

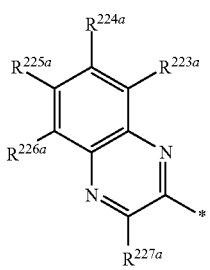
(A-2-5)

In the formulae, $R^{201a}$ to $R^{227a}$ each independently represent a hydrogen atom or a substituent, and * represents a bonding position in Formula (PP). Examples of the substituent represented by $R^{201a}$ to $R^{227a}$ include the substituent T.

In Formula (PP), $R^{27}$ and $R^{28}$ each independently represent a hydrogen atom, an alkyl group, an aryl group, a heteroaryl group, —$BR^{29}R^{30}$, or a metal atom, and —$BR^{29}R^{30}$ is preferable.

In a case where $R^{27}$ and $R^{28}$ represent an alkyl group, an aryl group, or a heteroaryl group, examples of the alkyl group, the aryl group, and the heteroaryl group include groups described in $R^{21}$ and $R^{22}$, and preferable ranges are also the same.

In a case where $R^{27}$ and $R^{28}$ represent metal atoms, examples of the metal atom include magnesium, aluminum, calcium, barium, zinc, tin, vanadium, iron, cobalt, nickel, copper, palladium, iridium and platinum, and aluminum, zinc, vanadium, iron, copper, palladium, iridium, and platinum are particularly preferable.

In a case where $R^{27}$ and $R^{28}$ represent —$BR^{29}R^{30}$, $R^{29}$ and $R^{30}$ each independently represent a hydrogen atom, a halogen atom, an alkyl group, an alkenyl group, an aryl group, a heteroaryl group, an alkoxy group, an aryloxy group, or a heteroaryloxy group, a halogen atom, an alkyl group, an aryl group, or a heteroaryl group is preferable, a halogen atom, an alkyl group, or an aryl group is more preferable, and an aryl group is even more preferable. $R^{29}$ and $R^{30}$ may be bonded to each other to form a ring.

The halogen atom represented by $R^{29}$ and $R^{30}$ is preferably a fluorine atom, a chlorine atom, a bromine atom, and an iodine atom and particularly preferably a fluorine atom.

The number of carbon atoms of the alkyl group and the alkoxy group represented by $R^{29}$ and $R^{30}$ is preferably 1 to 40. For example, the lower limit is more preferably 3 or more. For example, the upper limit is more preferably 30 or less and even more preferably 25 or less. The alkyl group and the alkoxy group may be linear, branched, or cyclic, but is preferably linear or branched.

The number of carbon atoms of the alkenyl group represented by $R^{29}$ and $R^{30}$ is preferably 2 to 40. For example, the lower limit is more preferably 3 or more. For example, the upper limit is more preferably 30 or less and even more preferably 25 or less.

The number of carbon atoms of the aryl group and the aryloxy group represented by $R^{29}$ and $R^{30}$ is preferably 6 to 20 and more preferably 6 to 12. The aryl group and the aryloxy group may have a substituent and may be unsubstituted. Examples of the substituent include an alkyl group, an alkoxy group, and a halogen atom. Specific examples of these include those described above.

The heteroaryl group and the heteroaryloxy group represented by $R^{29}$ and $R^{30}$ may be monocyclic or polycyclic. The number of heteroatoms constituting the heteroaryl ring of the heteroaryl group and the heteroaryloxy group is preferably 1 to 3. The heteroatom constituting the heteroaryl ring is preferably a nitrogen atom, an oxygen atom, or a sulfur atom. The number of carbon atoms constituting the heteroaryl ring is preferably 3 to 30, more preferably 3 to 18, even more preferably 3 to 12, and particularly preferably 3 to 5. The heteroaryl ring is preferably a 5-membered ring or a 6-membered ring. The heteroaryl group and the heteroaryloxy group may have a substituent or may be unsubstituted. Examples of the substituent include an alkyl group, an alkoxy group, and a halogen atom. Specific examples of these include those described above.

In Formula (PP), $R^{27}$ may form a covalent bond or a coordinate bond with $R^{21}$, $R^{23}$ or $R^{25}$, and $R^{28}$ may form a covalent bond or a coordinate bond with $R^{22}$, $R^{24}$ or $R^{26}$.

Specific examples of the compound represented by Formula (PP) include compounds below. Examples thereof include compounds disclosed in paragraphs 0016 to 0058 of JP2009-263614A, compounds disclosed in paragraphs 0037 to 0052 of JP2011-068731A, and compounds disclosed in paragraphs 0010 to 0033 of WO2015/166873A, and the contents thereof are incorporated in the present specification. In the following structural formula, Me represents a methyl group and Ph represents a phenyl group.

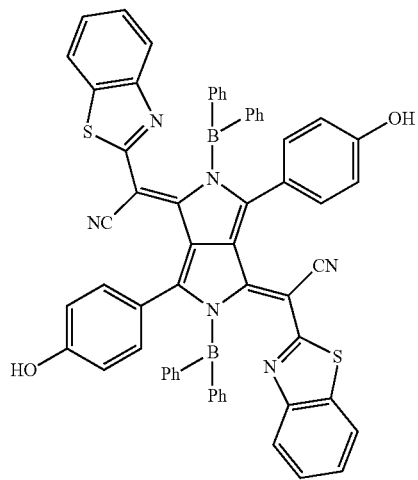
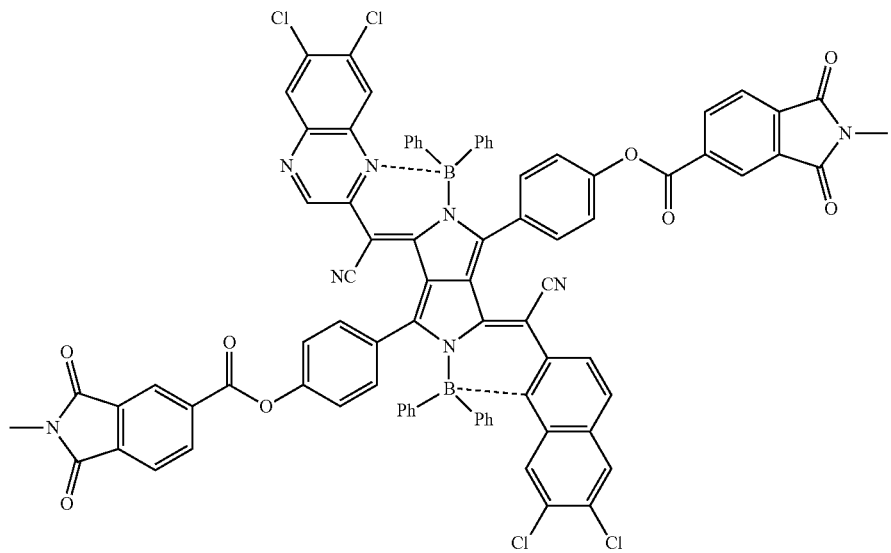
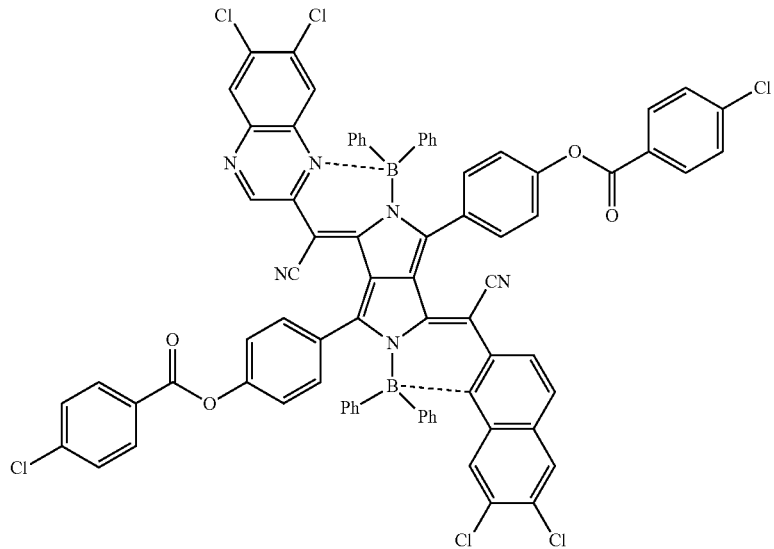

-continued

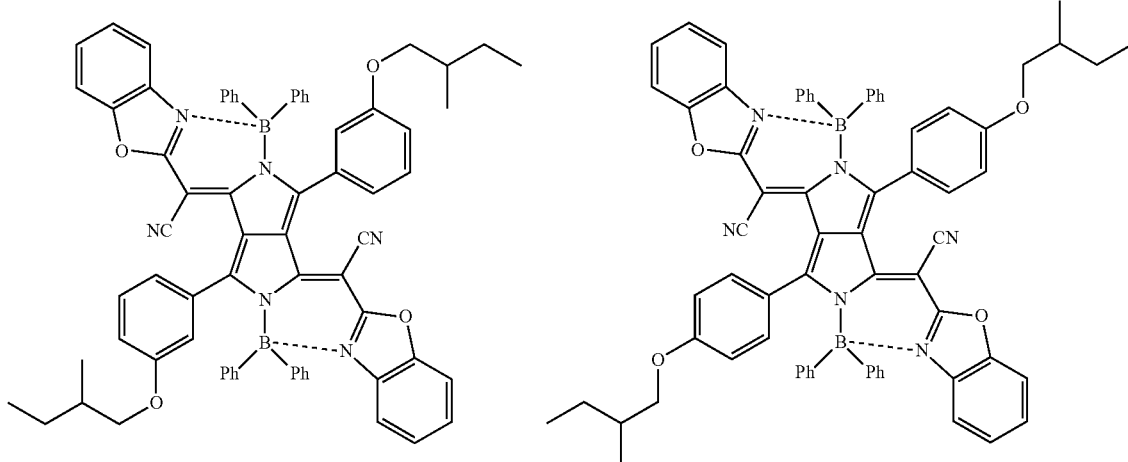

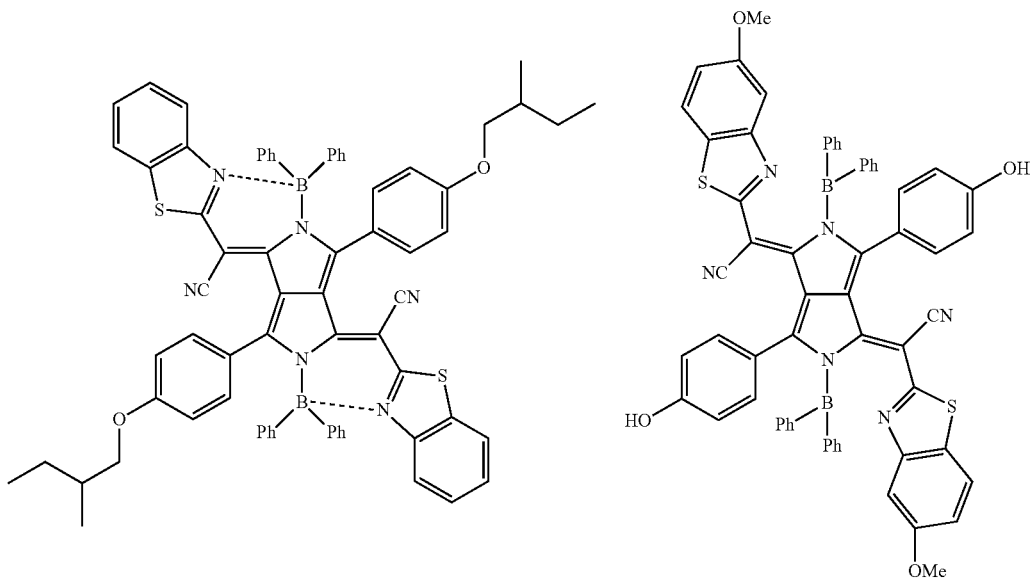

In the present invention, as the squarylium compound serving as the near infrared absorbing organic pigment, compounds represented by Formula (SQ) is preferable.

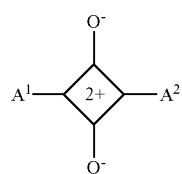

(SQ)

In Formula (SQ), $A^1$ and $A^2$ each independently represent an aryl group, a heteroaryl group, or a group represented by Formula (A-1); and

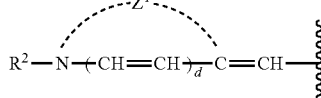

(A-1)

in Formula (A-1), $Z^1$ represents a nonmetallic atomic group forming a nitrogen-containing heterocyclic ring, $R^2$ represents an alkyl group, an alkenyl group, or an aralkyl group, d represents 0 or 1, and a wavy line represents a linking hand.

With respect to the details of Formula (SQ), the disclosure of paragraphs 0020 to 0049 of JP2011-208101A can be referred to, and the content thereof is incorporated in the present specification.

In Formula (SQ), cations are present in a delocalized manner as below.

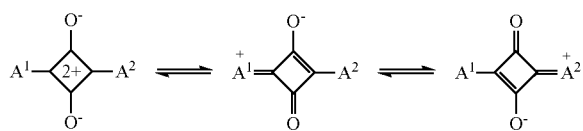

Examples of the squarylium compound include compounds disclosed in paragraphs 0044 to 0049 of JP2011-208101A, and the content thereof is incorporated in the present specification.

In the present invention, as the cyanine compound serving as the near infrared absorbing organic pigment, a compound represented by Formula (C) is preferable.

Formula (C)

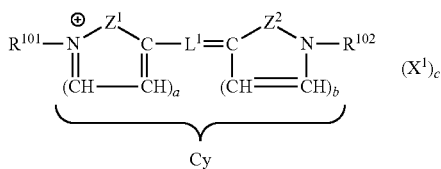

In the formula, $Z^1$ and $Z^2$ are each independently a nonmetallic atomic group forming a 5-membered or 6-membered nitrogen-containing heterocyclic ring that may be fused.

$R^{101}$ and $R^{102}$ each independently represent an alkyl group, an alkenyl group, an alkynyl group, an aralkyl group, or an aryl group, $L^1$ represents a methine chain having an odd number of methine groups, a and b are each independently 0 or 1, in a case where a is 0, a carbon atom and a nitrogen atom are bonded to each other by a double bond, and in a case where b is 0, a carbon atom and a nitrogen atom are bonded to each other by a single bond, and in a case where a moiety represented by Cy in the formula is a cation moiety, $X^1$ represents an anion, and c represents the number necessary for balancing the charge, in a case where the moiety represented by Cy in the formula is an anion moiety, $X^1$ represents a cation, c represents a number necessary for balancing the charge, and in a case where the moiety represented by Cy in the formula is neutralized in the molecule, c is 0.

Examples of the cyanine compound include compounds disclosed in paragraphs 0044 and 0045 of JP2009-108267A, compounds disclosed in paragraphs 0026 to 0030 of JP2002-194040A, compounds disclosed in JP2015-172004A, and compounds disclosed in JP2015-172102A, and the content thereof is incorporated in the present specification.

In the resin composition according to the embodiment of the present invention, a content of the organic pigment is preferably 5.0 to 60.0 mass % in the total solid content of the resin composition. The lower limit is more preferably 7.5 mass % or more and even more preferably 10.0 mass % or more. The upper limit is preferably 50.0 mass % or less and more preferably 40.0 mass % or less. In a case where the resin composition according to the embodiment of the present invention includes two or more organic pigments, the total amount thereof is preferably in the above range.

<<Resin>>

The resin composition according to the embodiment of the present invention contains a resin. For example, the resin is formulated for a use of dispersing an organic pigment or the like in a resin composition or a use of a binder. The resin used for mainly dispersing the organic pigments or the like in the resin composition is referred to as a dispersing agent. However, these applications of the resin are provided as examples, and the resin can be used for the purpose other than these applications.

The weight-average molecular weight (Mw) of the resin is preferably 2,000 to 2,000,000. The upper limit is preferably 1,000,000 or less and more preferably 500,000 or less. The lower limit is preferably 3,000 or more and more preferably 5,000 or more. In a case of an epoxy resin, the weight-average molecular weight (Mw) of the epoxy resin is preferably 100 or more and more preferably 200 to 2,000,000. The upper limit is preferably 1,000,000 or less and more preferably 500,000 or less. The lower limit is preferably 150 or more and more preferably 200 or more.

Examples of the resin include a (meth)acryl resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. These resins may be used singly or two or more kinds thereof may be used in combination. In view of improving heat resistance, a norbornene resin can be preferably used as the cyclic olefin resin. Examples of a commercially available product of the norbornene resin include ARTON series (for example, ARTON F 4520) manufactured by JSR Corporation. Examples of the epoxy resin include an epoxy resin which is glycidyl ether of phenol compound, an epoxy resin which is a glycidyl ether product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group with another silicon compound, and a copolymer of a polymerizable unsaturated compound having an epoxy group and another polymerizable unsaturated compound. MARPROOF G-0150M, G-0105SA, G-0130SP, G-0250SP, G-1005S, G-1005SA, G-1010S, G-2050M, G-01100, and G-01758 (manufactured by NOF Corporation, epoxy group-containing polymer) are can be used. As the resin, resins disclosed in the examples of WO2016/088645A can be used.

The resin used in the present invention may have an acid group. Examples of the acid group include a carboxyl group, a phosphoric acid group, a sulfo group, and a phenolic hydroxy group, and a carboxyl group is preferable. These acid groups may be used singly or two or more kinds thereof may be used. The resin having an acid group can also be used as an alkali-soluble resin.

The resin having an acid group is preferably a polymer having a carboxyl group at a side chain. Specific examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenolic resin as a novolak resin, an acidic cellulose derivative having a carboxyl group in a side chain, and a resin obtained by adding an acid anhydride to a polymer having a hydroxyl group. Particularly, a copolymer of (meth)acrylic acid and another monomer copolymerizable with this is preferable as an alkali-soluble resin. Examples of the other monomer copolymerizable with (meth)acrylic acid include alkyl (meth) acrylate, aryl (meth)acrylate, and a vinyl compound.

Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, and cyclohexyl (meth)acrylate, and examples of the vinyl compound include styrene, α-methylstyrene, vinyl toluene, glycidyl methacrylate, acrylonitrile, vinyl acetate, N-vinyl pyrrolidone, tetrahydrofurfuryl methacrylate, a polystyrene macromonomer, and a polymethyl methacrylate macromonomer. As other monomers, an N-substituted maleimide monomer disclosed in JP1998-300922A (JP-H10-300922A), for example, N-phenylmaleimide, N-cyclohexylmaleimide, and the like can also be used. These monomers copolymerizable with (meth)acrylic acid may be used singly or two or more kinds thereof may be used.

The resin having an acid group may have a polymerizable group. Examples of the polymerizable group include a (meth)allyl group and a (meth)acryloyl group. Examples of the commercially available products thereof include DIANAL NR series (Mitsubishi Rayon Co., Ltd.), Photomer 6173 (carboxyl group-containing polyurethane acrylate oligomer, manufactured by Diamond Shamrock Co., Ltd.), VISCOAT R-264, KS RESIST 106 (all are manufactured by Osaka Organic Chemical Industry Ltd.), CYCLOMER P Series (for example, ACA 230 AA), PLAXCEL CF 200 series (all are manufactured by Daicel Corporation), Ebecryl 3800 (manufactured by Daicel UBC Co., Ltd.), and ACRYCURE RD-F8 (manufactured by Nippon Shokubai Co., Ltd.).

The resin having an acid group, a benzyl (meth)acrylate/(meth)acrylic acid copolymer, a benzyl (meth)acrylate/(meth)acrylic acid/2-hydroxyethyl (meth)acrylate copolymer, and a multi-copolymer consisting of a benzyl (meth) acrylate/(meth)acrylic acid/other monomer can also be preferably used. Those obtained by copolymerizing 2-hydroxy ethyl(meth)acrylate, and a 2-hydroxypropyl (meth) acrylate/polystyrene macromonomer/benzyl methacrylate/ methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer disclosed in JP1995-140654A (JP-H07-140654A) can be preferably used.

It is also preferable that the resin having an acid group includes a polymer including a repeating unit derived from a monomer component including a compound represented by Formula (ED1) and/or a compound represented by Formula (ED2) (hereinafter, these compounds are also referred to as an "ether dimer").

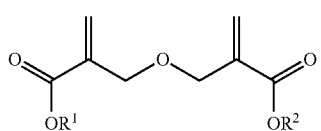
(ED1)

In Formula (ED1), $R^1$ and $R^2$ each independently represent a hydrogen atom or a hydrocarbon group having 1 to 25 carbon atoms which may have a substituent.

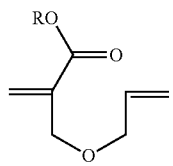
(ED2)

In Formula (ED2), R represents a hydrogen atom or an organic group having 1 to 30 carbon atoms. As a specific example of Formula (ED2), the description of JP2010-168539A can be referred to.

As a specific example of the ether dimer, for example, paragraph 0317 of JP2013-029760A can be referred to, and the content thereof is incorporated in the present specification. The ether dimer may be used singly or two or more kinds thereof may be used.

The resin having an acid group may include a repeating unit derived from a compound represented by Formula (X).

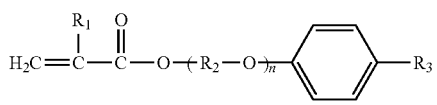
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may contain a benzene ring. n represents an integer of 1 to 15.

As the resin having an acid group, the description of paragraphs 0558 to 0571 (corresponding to paragraph 0685 to 0700 of US2012/0235099A) of JP2012-208494A and the description in paragraphs 0076 to 0099 of JP2012-198408A can be referred to, and the contents thereof are incorporated in the present specification. As the resin having an acid group, a commercially available product can also be used. Examples thereof include ACRYBASE FF-426 (manufactured by Fujikura Kasei Co., Ltd.).

The acid value of the resin having an acid group is preferably 30 to 500 mg KOH/g. The lower limit is more preferably 50 mg KOH/g or more and even more preferably 70 mg KOH/g or more. The upper limit is more preferably 400 mg KOH/g or less, even more preferably 200 mg KOH/g or less, particularly preferably 150 mg KOH/g or less, and still even more preferably 120 mg KOH/g or less.

Examples of the resin having an acid group include a resin having the following structure. In the following structural formulae, Me represents a methyl group.

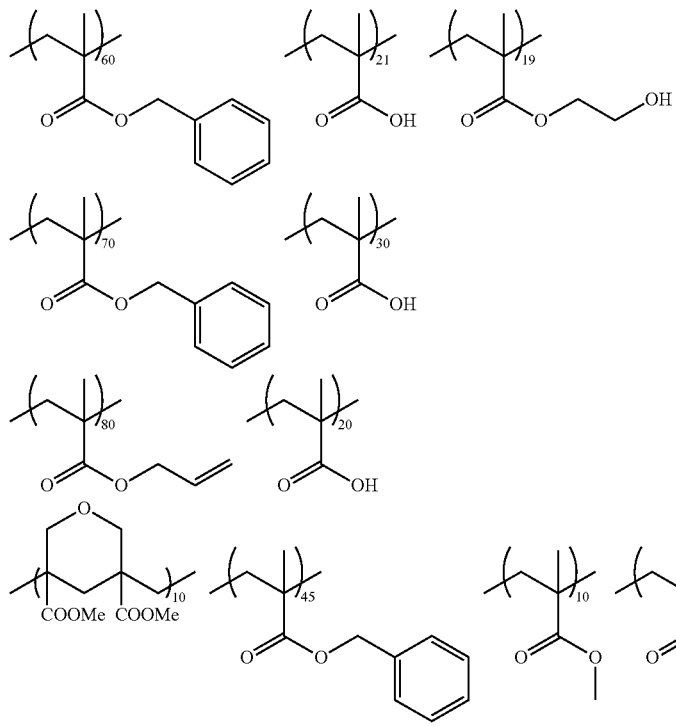

The resin composition according to the embodiment of the present invention preferably includes a resin as a dispersing agent. The resin working as a dispersing agent is preferably an acid-type resin and/or a base-type resin. Here, the acid-type resin refers to a resin in which an amount of an acid group is an amount of a basic group. The acid-type resin is preferably a resin in which an amount of the acid group occupies 70 mol % or more in a case where a total amount of the acid group and the basic group in the resin is 100 mol % and more preferably a resin substantially including an acid group only. The acid group having an acid-type resin is preferably a carboxyl group. The acid value of the acid-type resin is preferably 40 to 105 mg KOH/g, more preferably 50 to 105 mg KOH/g, and even more preferably 60 to 105 mg KOH/g. The base-type resin refers to a resin in which an amount of the basic group is more than an amount of the acid group. The base-type resin is preferably a resin in which an amount of the basic group is 50 mol % in a case where a total amount of the amount of the acid group and the amount of the basic group in the resin is 100 mol %. The basic group having a base-type resin is preferably an amino group.

As the resin used as a dispersing agent, a resin including a repeating unit having an acid group is preferable. In a case where the resin used as the dispersing agent includes a repeating unit having an acid group, in a case of forming a pattern by photolithography, a residue generated on the base of the pixel can be further reduced.

The resin used as the dispersing agent is preferably a graft copolymer. Since the graft copolymer has an affinity to the solvent by a graft chain, dispersibility of the pigment and dispersion stability after the elapse of time are excellent. As the details of the graft copolymer, the disclosure of paragraphs 0025 to 0094 of JP2012-255128A can be referred to, and the contents thereof are incorporated in the present specification. Specific examples of the graft copolymer include the following resin. The following resin is also a resin having an acid group (alkali-soluble resin). The description of paragraphs 0072 to 0094 of JP2012-255128A is referred to, and the contents thereof are incorporated in the present specification.

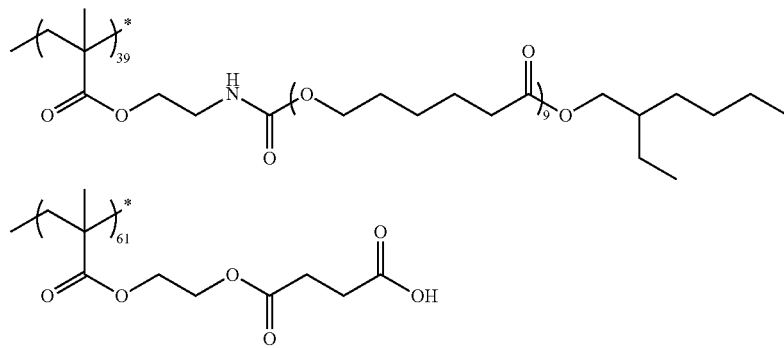

In the present invention, as the resin (dispersing agent), an oligoimine-based dispersing agent including a nitrogen atom in at least one of the main chain or the side chain is also preferably used. As the oligoimine-based dispersing agent, a resin having a structural unit having a partial structure X having a functional group having a pKa of 14 or less and a side chain including a side chain Y having the number of atoms of 40 to 10,000, and having a basic nitrogen atom in at least one of the main chain or the side chain is preferable. The basic nitrogen atom is not particularly limited as long as the basic nitrogen atom is a nitrogen atom exhibiting basicity. With respect to the oligoimine-based dispersing agent, the disclosure of paragraphs 0102 to 0166 of JP2012-255128A can be referred to, and the contents thereof are incorporated in the present specification. Specific examples of the oligoimine-based dispersing agent include the following. The following resin is also a resin having an acid group (alkali-soluble resin). As the oligoimine-based dispersing agent, resins disclosed in paragraphs 0168 to 0174 of JP2012-255128A can be used.

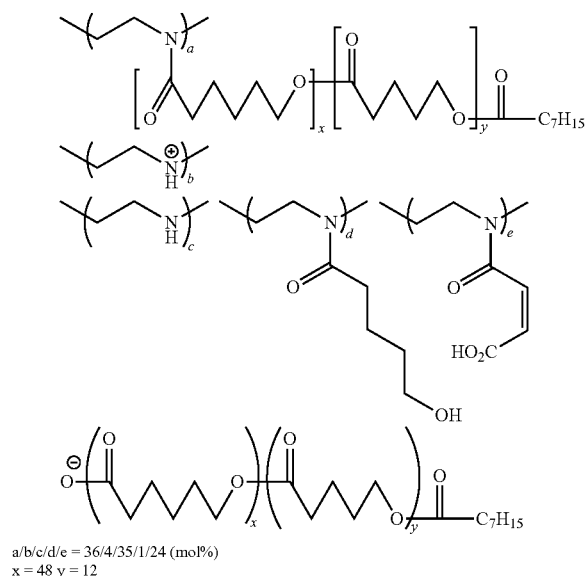

a/b/c/d/e = 36/4/35/1/24 (mol%)
x = 48 y = 12

The dispersing agent can be also obtained as a commercially available product, and specific examples thereof include Disperbyk-111 (manufactured by BYK-Chemie GmbH), SOLSPARSE 76500 (manufactured by Lubrizol Japan Limited). The pigment dispersing agent disclosed in paragraphs 0041 to 0130 of JP2014-130338A can be used, and the contents thereof are incorporated in the present specification. The aforementioned resin having an acid group and the like can be used as the dispersing agent.

According to the resin composition according to the embodiment of the present invention, the content of the resin is preferably 0.1 mass % or more, more preferably 1 mass % or more, even more preferably 10 mass % or more, and particularly preferably 20 mass % or more with respect to the total solid content of the resin composition. The upper limit is preferably 90 mass % or less, more preferably 70 mass % or less, and even more preferably 50 mass % or less.

In a case where the resin composition according to the embodiment of the present invention includes a resin having an acid group, the content of the resin having an acid group is preferably 0.1 mass % or more, more preferably 1 mass % or more, even more preferably 10 mass % or more, particularly preferably 20 mass % or more with respect to the total solid content of the resin composition. The upper limit is preferably 90 mass % or less, more preferably 70 mass % or less, and even more preferably 50 mass % or less.

In a case where the resin composition according to the embodiment of the present invention contains a dispersing agent as the resin, the content of the dispersing agent is preferably 0.1 to 40 mass % with respect to the total solid content of the resin composition. The upper limit is preferably 20 mass % or less and more preferably 10 mass % or less. The lower limit is preferably 0.5 mass % or more and more preferably 1 mass % or more. The content of the dispersing agent is preferably 1 to 100 parts by mass with respect to 100 parts by mass of the organic pigment. The upper limit is preferably 80 parts by mass or less and more preferably 60 parts by mass or less. The lower limit is preferably 2.5 parts by mass or more and more preferably 5 parts by mass or more.

<<Solvent>>

The resin composition according to the embodiment of the present invention contains a solvent. Examples of the solvent include an organic solvent. The solvent is basically not particularly limited, as long as the solubility of each component and the coatability of the resin composition are satisfied. Examples of the organic solvent include esters, ethers, ketones, and aromatic hydrocarbons. With respect to the details thereof, paragraph 0223 of WO2015/166779A can be referred to, and the contents thereof are incorporated in the present specification. An ester-based solvent in which a cyclic alkyl group is substituted and a ketone-based solvent in which a cyclic alkyl group is substituted can also be preferably used. Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate (for example, methyl alkyloxyacetate, ethyloxyalkyl acetate, butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate, and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, and propylene glycol monopropyl ether acetate. Examples of ketones include methyl ethyl ketone, cyclohexanone, cyclopentanone, 2-heptanone, and 3-heptanone. Examples of the aromatic hydrocarbons include toluene and xylene. However, it is better to reduce aromatic hydrocarbons (benzene, toluene, xylene, ethylbenzene, and the like) as an organic solvent for environmental reasons or the like in some cases (for example, may be 50 mass ppm (parts per million) or less, may be 10 mass ppm or less, and may be 1 mass ppm or less with respect to the total mass of the organic solvent).

According to the present invention, it is preferable to use a solvent having a small metal content. It is preferable that the metal content of the solvent is, for example, 10 mass ppb (parts per billion) or less. If necessary, the solvent having a mass ppt (parts per trillion) level may be used, and the high purity solvent is, for example, provided by Toyo Gosei Co., Ltd. (Japan Chemical Daily, Nov. 13, 2015).

Examples of the method for removing impurities such as metals from a solvent include distillation (molecular distillation, thin film distillation, and the like) filtered using a filter. The pore diameter of the filter used for filtration is preferably 10 μm or less, more preferably 5 μm or less, and even more preferably 3 μm or less. The material of the filter is preferably polytetrafluoroethylene, polyethylene, or nylon.

The solvent may include an isomer (a compound having the same atom number and having different structures). Only one kind of isomers may be included, or a plurality of kinds of isomers may be included.

According to the present invention, it is preferable that the content of a peroxide in the organic solvent is 0.8 mmol/L or less, and it is more preferable that the organic solvent does not substantially include a peroxide.

The content of the solvent is preferably 10 to 90 mass %, more preferably 20 to 80 mass %, and even more preferably 25 to 75 mass % with respect to the total mass of the resin composition. In a case where two or more kinds of the solvents are used, the total amount thereof is preferably in the above range.

<<Pigment Derivative>>

It is preferable that the resin composition according to the embodiment of the present invention further contains a pigment derivative. Examples of the pigment derivative include compounds having a structure in which a portion of the pigment is substituted with an acid group, a basic group, or a phthalimide group. Examples of the pigment derivative include an acidic pigment derivative, a basic pigment derivative, and a neutral pigment derivative.

In a case of using the near infrared absorbing organic pigment as the organic pigment, the pigment derivative is preferably a compound having a coloring agent structure derived from a coloring agent compound having a π-conjugated plane including a monocyclic or fused aromatic ring. Details of the coloring agent compound having a π-conjugated plane including a monocyclic or fused aromatic ring are the same as the contents described in the section of the near infrared absorbing organic pigment, and the preferable ranges are also the same.

In a case where a near infrared absorbing organic pigment is used as the organic pigment, the pigment derivative is preferably a compound having a coloring agent structure derived from a coloring agent compound having a maximum absorption wavelength in the wavelength range of 600 to 1,200 nm (preferably in the wavelength range of 700 to 1,000 nm), more preferably a compound having a coloring agent structure selected from a pyrrolopyrrole coloring agent structure, a squarylium coloring agent structure, a cyanine compound, a phthalocyanine compound, a naphthalocyanine compound, and an iminium compound, even more prefer- ably a compound having a pyrrolopyrrole coloring agent structure or a squarylium coloring agent structure, and particularly preferably a compound having a pyrrolopyrrole coloring agent structure. Since the pigment derivative having a pyrrolopyrrole coloring agent structure has excellent visible transparency, the dispersibility of the near infrared absorbing organic pigment can be improved without affecting the visible transparency of the near infrared absorbing organic pigment. The pyrrolopyrrole coloring agent structural portion in the pigment derivative interacts with the near infrared absorbing organic pigment and easily adsorbs on the surface of the near infrared absorbing organic pigment. Therefore, it is possible to improve the dispersibility of the near infrared absorbing organic pigment in the resin composition.

According to the present invention, the pigment derivative is preferably a compound having a coloring agent structure having a skeleton common to the organic pigment. According to this aspect, the pigment derivative is easily adsorbed by the organic pigment, and the dispersibility of the organic pigment in the pigment dispersion liquid can be increased. An effect of suppressing thixotropy can be expected.

According to the present invention, the pigment derivative is preferably a compound represented by Formula (1).

$$P\text{-}(\text{-}L\text{-}(X)_n)_m \qquad (1)$$

In Formula (1), P represents a coloring agent structure, L represents a single bond or a linking group, X represents an acid group, a basic group, a phthalimide group, m represents an integer of 1 or more, n represents an integer of 1 or more, in a case where m is 2 or more, a plurality of L's and X's may be different from each other, and in a case where n is 2 or more, a plurality of X's may be different from each other.

Examples of the coloring agent structure represented by P in Formula (1) include a pyrrolopyrrole coloring agent structure, a diketopyrrolopyrrole coloring agent structure, a quinacridone coloring agent structure, an anthraquinone coloring agent structure, a dianthraquinone coloring agent structure, a benzoisoindole coloring agent structure, a thiazine indigo coloring agent structure, an azo coloring agent structure, a quinophthalone coloring agent structure, a phthalocyanine coloring agent structure, a naphthalocyanine coloring agent structure, a dioxazine coloring agent structure, a perylene coloring agent structure, a perinone coloring agent structure, a benzimidazolone coloring agent structure, a benzothiazole coloring agent structure, a benzoimidazole coloring agent structure, and a benzoxazole coloring agent structure. The coloring agent structure can be appropriately selected according to the kinds of organic pigment. For example, in a case where a near infrared absorbing organic pigment is used as the organic pigment, the coloring agent structure represented by P is preferably a compound having a coloring agent structure derived from a coloring agent compound having a maximum absorption wavelength in the wavelength range of 600 to 1,200 nm (preferably in the wavelength range of 700 to 1,000 nm), more preferably a compound having a coloring agent structure selected from a pyrrolopyrrole coloring agent structure, a squarylium coloring agent structure, a cyanine compound, a phthalocyanine compound, a naphthalocyanine compound, and an iminium compound, even more preferably a compound having a pyrrolopyrrole coloring agent structure and a squarylium coloring agent structure, and particularly preferably a compound having a pyrrolopyrrole coloring agent structure.

In Formula (1), L represents a single bond or a linking group and preferably represents a linking group. Examples of the divalent linking group include an alkylene group, an arylene group, a nitrogen-containing heterocyclic group, —O—, —S—, —NR'—, —CO—, —COO—, —OCO—, —SO$_2$—, or a group obtained by combining these, and a group including an alkylene group or an alkylene group is preferable. R' represents a hydrogen atom, an alkyl group, or an aryl group. In the case where L is a trivalent or higher valent linking group, examples thereof include groups in which one or more hydrogen atoms are removed from the above divalent linking group.

The number of carbon atoms of the alkylene group is preferably 1 to 30, more preferably 1 to 15, and even more preferably 1 to 10. The alkylene group may have a substituent. The alkylene group may be linear, branched, or cyclic. The cyclic alkylene group may be monocyclic or polycyclic.

The number of carbon atoms of the arylene group is preferably 6 to 18, more preferably 6 to 14, and even more preferably 6 to 10.

The nitrogen-containing heterocyclic group is preferably a 5-membered ring or a 6-membered ring. The nitrogen-containing heterocyclic group is preferably a monocyclic ring or a fused ring, more preferably a monocyclic ring or a fused ring having a fused number of 2 to 8, and even more preferably a monocyclic ring or a fused ring having a fused number of 2 to 4. The number of nitrogen atoms included in the nitrogen-containing heterocyclic group is preferably 1 to 3 and more preferably 1 to 2. The nitrogen-containing heterocyclic group may include a heteroatom other than a nitrogen atom. Examples of the heteroatom other than a nitrogen atom include an oxygen atom or a sulfur atom. The number of heteroatoms other than a nitrogen atom is preferably 0 to 3 or more preferably 0 to 1. Examples of the nitrogen-containing heterocyclic group include a piperazine ring group, a pyrrolidine ring group, a pyrrole ring group, a piperidine ring group, a pyridine ring group, an imidazole ring group, a pyrazole ring group, an oxazole ring group, a thiazole ring group, a pyrazine ring group, a morpholine ring group, a thiazine ring group, an indole ring group, an isoindole ring group, a benzimidazole ring group, a purine ring group, a quinoline ring group, an isoquinoline ring group, a quinoxaline ring group, a cinnoline ring group, a carbazole ring group, and a group represented by Formulae (l-1) to (l-7).

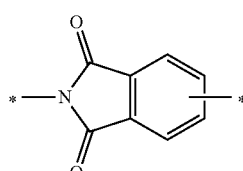
(L-1)

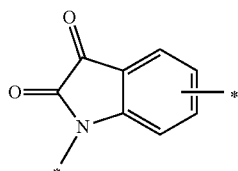
(L-2)

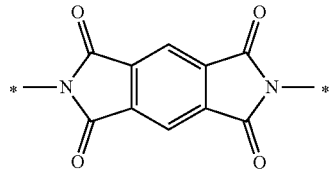
(L-3)

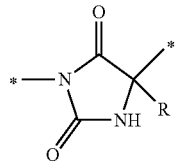
(L-4)

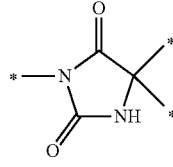
(L-5)

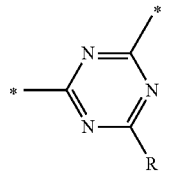
(L-6)

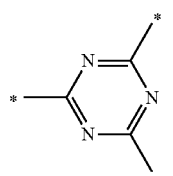
(L-7)

In the formula, * represents a linking hand. R represents a hydrogen atom or a substituent. Examples of the substituent include the above-mentioned substituent T.

In Formula (1), X represents an acid group, a basic group, or a phthalimide group. Examples of the acid group include a carboxyl group and a sulfo group. Examples of the basic group include groups represented by Formulae (X-3) to (X-9). The phthalimide group may be unsubstituted or may have a substituent. Examples of the substituent include the acid group and the basic group. The substituent may be the substituent T. The substituent T may be further substituted with another substituent.

X is preferably at least one selected from a carboxyl group, a sulfo group, a phthalimide group, or a group represented by Formulae (X-3) to (X-9), more preferably a carboxyl group, a sulfo group, and a group represented by Formula (X-3), even more preferably a sulfo group and a group represented by Formula (X-3), and particularly preferably a sulfo group. In the compound in which X is a sulfo group, the dispersibility of the organic pigment can be increased. The compound in which X is a group represented by Formula (X-3) has higher basicity than other basic groups and improved interaction with a resin and the like, and thus the dispersibility of the organic pigment can be increased.

(X-3)

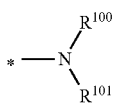

(X-4)

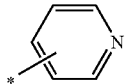

(X-5)

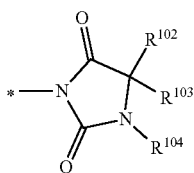

(X-6)

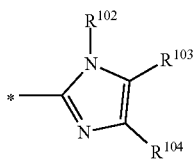

(X-7)

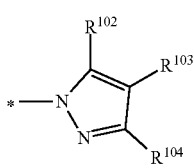

(X-8)

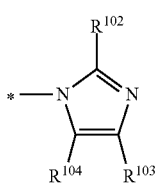

-continued (X-9)

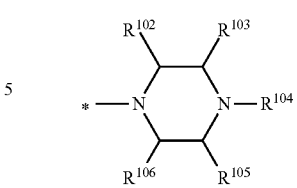

In Formulae (X-3) to (X-9), * represents a linking hand, $R^{100}$ to $R^{106}$ each independently represent a hydrogen atom, an alkyl group, an alkenyl group, or an aryl group, and $R^{100}$ and $R^{101}$ may be linked to each other to form a ring.

The alkyl group represented by $R^{100}$ to $R^{106}$ may be linear, branched, or cyclic. The number of carbon atoms of the linear alkyl group is preferably 1 to 20, more preferably 1 to 12, and even more preferably 1 to 8. The number of carbon atoms of the branched alkyl group is preferably 3 to 20, more preferably 3 to 12, and even more preferably 3 to 8. The cyclic alkyl group may be monocyclic or polycyclic. The number of carbon atoms of the cyclic alkyl group is preferably 3 to 20, more preferably 4 to 10, and even more preferably 6 to 10.

The number of carbon atoms of the alkenyl group represented by $R^{100}$ to $R^{106}$ is preferably 2 to 10, more preferably 2 to 8, and even more preferably 2 to 4.

The number of carbon atoms of the aryl group represented by $R^{100}$ to $R^{106}$ is preferably 6 to 18, more preferably 6 to 14, and even more preferably 6 to 10.

$R^{100}$ and $R^{101}$ may be linked to each other to form a ring. The ring may be an alicyclic ring or an aromatic ring. The ring may be a monocyclic ring or a fused ring. Examples of a linking group in a case where $R^{100}$ and $R^{101}$ are bonded to each other to form a ring include a divalent linking group selected from —CO—, —O—, —NH—, a divalent aliphatic group, a divalent aromatic group, and a combination thereof. It is preferable that $R^{100}$ and $R^{101}$ do not form a ring.

$R^{100}$ and $R^{101}$ each independently and preferably represent an alkyl group or an aryl group, and an alkyl group is more preferable. The alkyl group is preferably a linear or branched alkyl group, and a linear alkyl group is more preferable.

In Formula (1), m represents an integer of 1 to 10, preferably 1 to 4, more preferably 1 to 3, even more preferably 1 to 2, and particularly preferably 2.

In Formula (1), n represents an integer of 1 to 10, preferably 1 to 4, more preferably 1 to 3, even more preferably 1 to 2, and particularly preferably 1.

Specific examples of the pigment derivative include the following compounds. In the following structural formula, Me represents a methyl group, Bu represents a butyl group, and Ph represents a phenyl group. Compounds disclosed in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraphs 0086 to 0098 of WO02011/024896A, paragraphs 0063 to 0094 of WO2012/102399A, and paragraph 0053 of WO2016/035695A, compounds disclosed in paragraphs 0027 to 0031 of JP2011-038061A, compounds disclosed in paragraph 0036 of JP2010-181812A, and compounds disclosed in paragraphs 0027 to 0035 of JP2004-258134A, and the contents thereof are incorporated in the present specification.

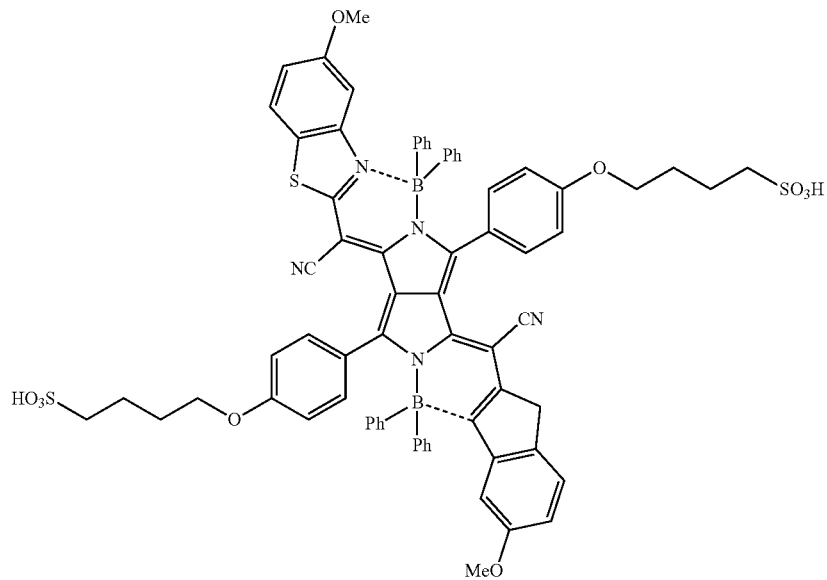
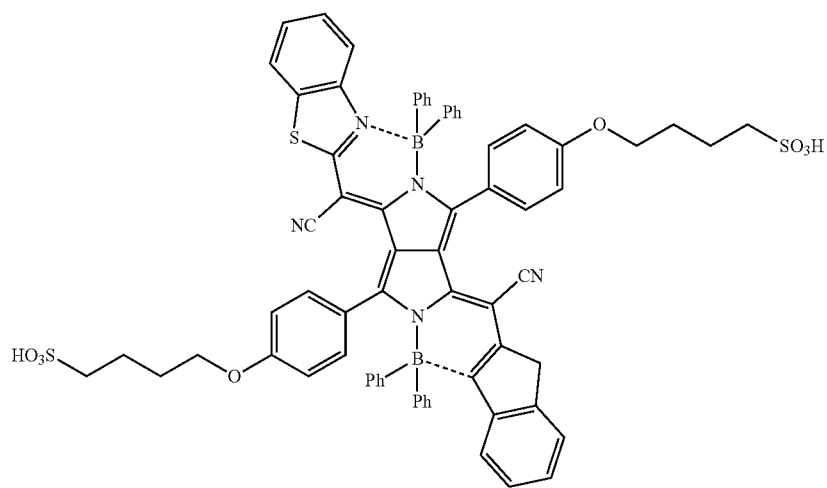
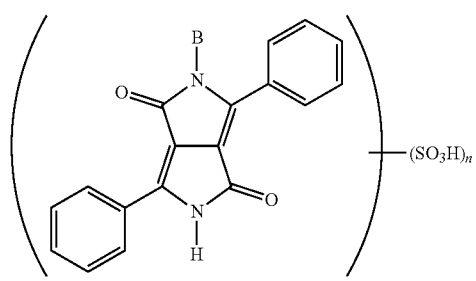

-continued
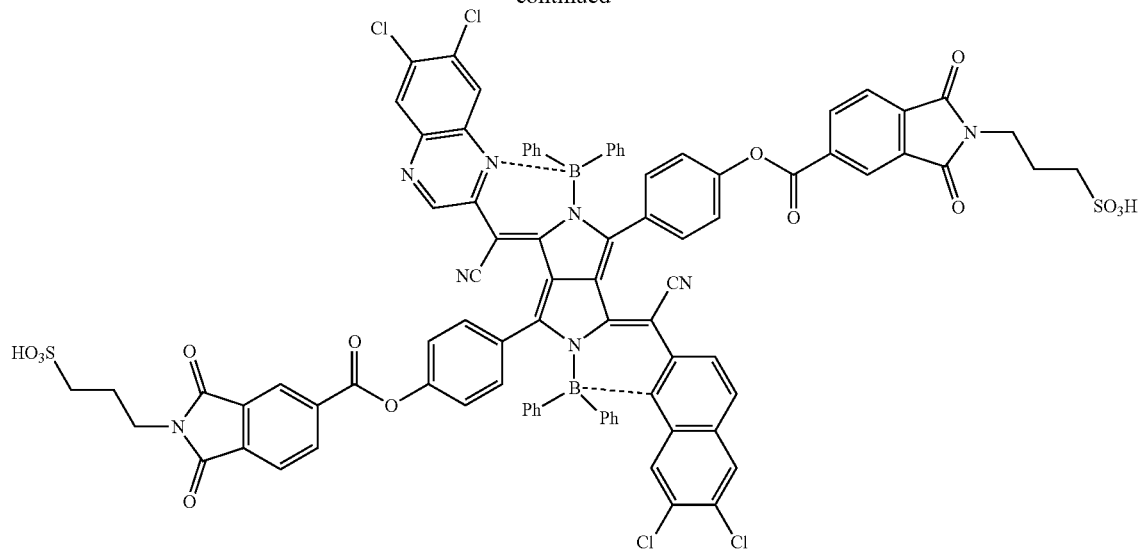
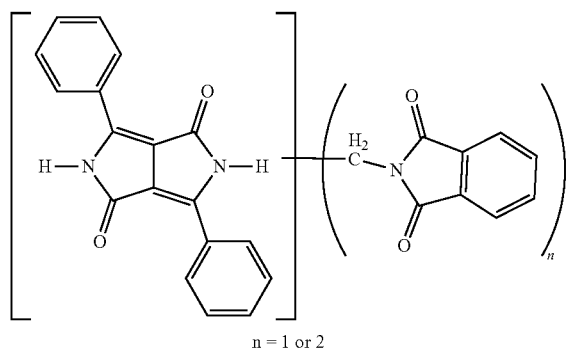
n = 1 or 2
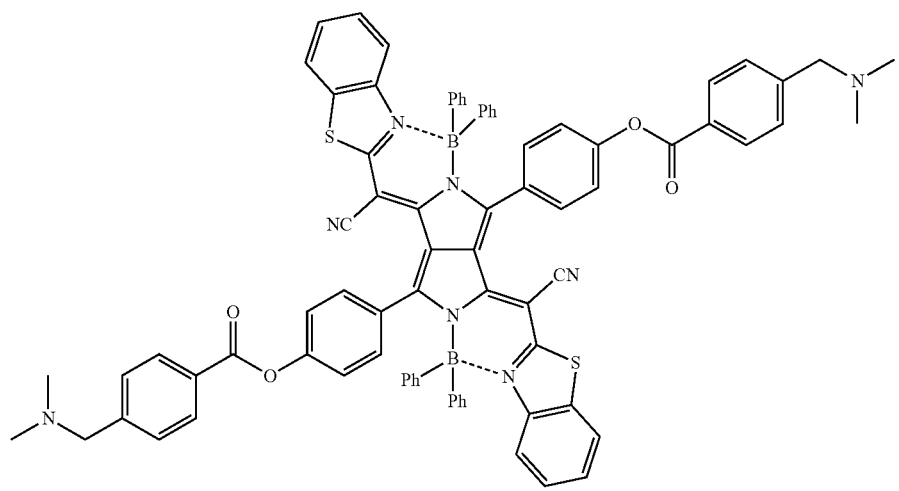

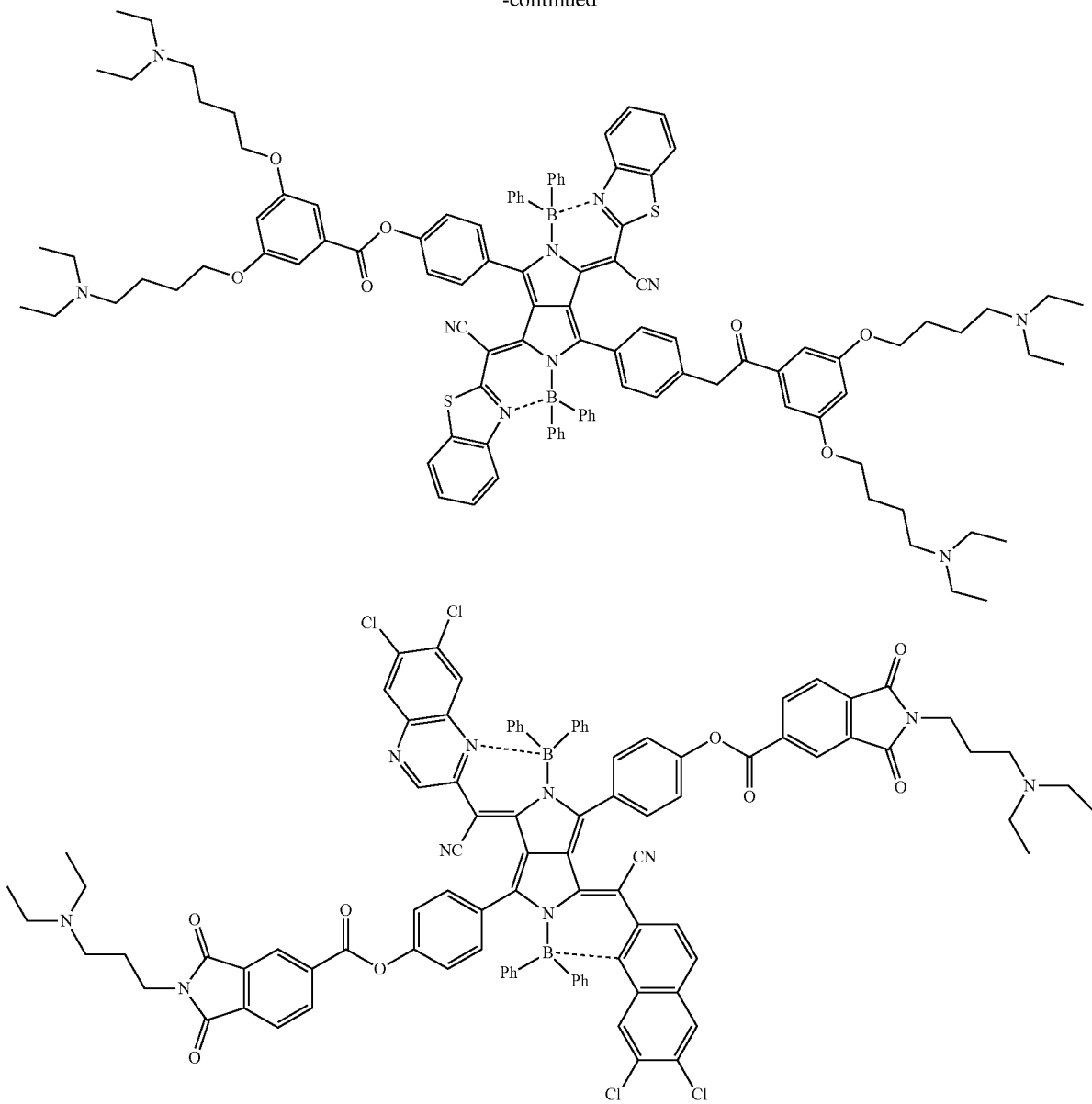

In a case where the resin composition according to the embodiment of the present invention contains a pigment derivative, the content of the pigment derivative is preferably 1 to 50 parts by mass with respect to 100 parts by mass of the organic pigment. The lower limit is more preferably 3 parts by mass or more and even more preferably 5 parts by mass or more. The upper limit is more preferably 40 parts by mass or less and even more preferably 30 parts by mass or less. The pigment derivative may be used singly or two or more kinds thereof may be used. In a case where two or more kinds of the pigment derivatives are included, the total amount is preferably in the above range.

<<Polymerizable Compound>>

The resin composition according to the embodiment of the present invention can contain the polymerizable compound. The polymerizable compound is preferably a compound that can be polymerized by the action of a radical. That is, the polymerizable compound is preferably a radically polymerizable compound. The polymerizable compound is preferably a compound having one or more groups having an ethylenically unsaturated bond, more preferably a compound having two or more groups having an ethylenically unsaturated bond, and even more preferably a compound having three or more groups having an ethylenically unsaturated bond. The upper limit of the number of groups having an ethylenically unsaturated bond is, for example, preferably 15 or less and more preferably 6 or less. A group which has an ethylenically unsaturated bond is preferably a vinyl group, a styryl group, a (meth)allyl group, and a (meth)acryloyl group, and a (meth)acryloyl group. The polymerizable compound is preferably a 3 to 15 functional (meth)acrylate compound and more preferably a 3 to 6 functional (meth)acrylate compound.

The polymerizable compound may be in the form of a monomer or a polymer, but a monomer is preferable. The polymerizable compound of monomer type preferably has a molecular weight of 100 to 3,000. The upper limit is preferably 2,000 or less and more preferably 1,500 or less. The lower limit is preferably 150 or more and more preferably 250 or more. The polymerizable compound is preferably a compound which does not substantially have molecular weight distribution. The expression "to have substantially no molecular weight distribution" means that the dispersibility (weight-average molecular weight (Mw)/number-average molecular weight (Mn)) of the compound is preferably 1.0 to 1.5 and more preferably 1.0 to 1.3.

As an example of the polymerizable compound, the description disclosed in paragraphs 0033 to 0034 of JP2013-253224A can be referred to, and the contents thereof are incorporated in the present specification. The polymerizable compound is preferably ethyleneoxy-modified pentaerythritol tetraacrylate (as a commercially available product, NK Ester ATM-35E; Shin-Nakamura Chemical Co., Ltd.), dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA; manufactured by Nippon Kayaku Co., Ltd. and A-DPH-12E manufactured by Shin-Nakamura Chemical Co., Ltd.), and a compound having a structure in which these (meth)acryloyl groups are bonded to each other via an ethylene glycol residue and/or a propylene glycol residue. Oligomer types thereof may be used. Paragraphs 0034 to 0038 of JP2013-253224A can be referred to, and the contents thereof are incorporated in the present specification. Examples of the polymerizable compound include polymerizable monomers disclosed in paragraphs 0477 (corresponding to paragraph 0585 of US2012/0235099A) of JP2012-208494A, and the contents thereof are incorporated in the present specification. Diglycerin ethylene oxide (EO)-modified (meth)acrylate (as a commercially available product, M-460; manufactured by Toagosei Co., Ltd.), pentaerythritol tetraacrylate (manufactured by Shin-Nakamura Chemical Co., Ltd., A-TMMT), and 1,6-hexanediol diacrylate (manufactured by Nippon Kayaku Co., Ltd., KAYARAD HDDA) are also preferable. Oligomer types thereof may be used. Examples thereof include RP-1040 (manufactured by Nippon Kayaku Co., Ltd.).

The polymerizable compound may have an acid group such as a carboxyl group, a sulfo group, and a phosphoric acid group. Examples of the polymerizable compound having an acid group include an ester of an aliphatic polyhydroxy compound and unsaturated carboxylic acid. A polymerizable compound obtained by causing an unreacted hydroxyl group of an aliphatic polyhydroxy compound to react with a nonaromatic carboxylic acid anhydride to have acid group is preferable, and the aliphatic polyhydroxy compound in this ester is pentaerythritol and/or dipentaerythritol is particularly preferable. Examples of the commercially available products include ALONIX M-305, M-510, and M-520 (manufactured by Toagosei Co., Ltd.). The acid value of the polymerizable compound having an acid group is preferably 0.1 to 40 mg KOH/g. The lower limit is preferably 5 mg KOH/g or more. The upper limit is preferably 30 mg KOH/g or less.

A compound having a caprolactone structure is also a preferable embodiment as the polymerizable compound. The polymerizable compound having a caprolactone structure is not particularly limited as long as the polymerizable compound has a caprolactone structure in the molecule. Examples thereof include ε-caprolactone modified polyfunctional (meth)acrylate obtained by esterifying (meth)acrylic acid and ε-caprolactone with polyhydric alcohol such as trimethylol ethane, ditrimethylol ethane, trimethylolpropane, ditrimethylolpropane, pentaerythritol, dipentaerythritol, tripentaerythritol, glycerin, diglycerol, and trimethylolmelamine. As the polymerizable compound having a caprolactone structure, the description disclosed in paragraphs 0042 to 0045 of JP2013-253224A can be referred to, and the contents thereof are incorporated in the present specification. Examples of the commercially available product of the compound having a caprolactone structure include DPCA-20, DPCA-30, DPCA-60, and DPCA-120 which are commercially available as a KAYARAD DPCA series from Nippon Kayaku Co., Ltd, and SR-494 as tetrafunctional acrylate having four ethyleneoxy chains and TPA-330 as trifunctional acrylate having three isobutyleneoxy chains which are manufactured by Sartomer.

In a case where the resin composition according to the embodiment of the present invention contains a polymerizable compound, the content of the polymerizable compound is preferably 0.1 to 40 mass % with respect to the total solid content of the resin composition. For example, the lower limit is more preferably 0.5 mass % or more and even more preferably 1 mass % or more. For example, the upper limit is more preferably 30 mass % or less and even more preferably 20 mass % or less. The polymerizable compound may be used singly, and two or more kinds thereof may be used in combination. In a case where two or more kinds of the polymerizable compounds are used in combination, it is preferable that the total amount is in the above range.

<<Photopolymerization Initiator>>

The resin composition according to the embodiment of the present invention can contain a photopolymerization initiator. Particularly, in a case where the resin composition according to the embodiment of the present invention includes a radically polymerizable compound, it is preferable to further include the photopolymerization initiator. The photopolymerization initiator is not particularly limited, and the photopolymerization initiator can be selected from well-known photopolymerization initiators. For example, the compound having the photosensitivity to light from the ultraviolet range to the visible range is preferable. The photopolymerization initiator is preferably a photo radical polymerization initiator.

Examples of the photopolymerization initiator include a halogenated hydrocarbon derivative (for example, a compound having a triazine skeleton or a compound having an oxadiazole skeleton), an acylphosphine compound, hexaarylbiimidazole, an oxime compound, organic peroxide, a thio compound, a ketone compound, aromatic onium salt, an α-hydroxy ketone compound, an α-amino ketone compound. In view of exposure sensitivity, the photopolymerization initiator is preferably a compound selected from the group consisting of a trihalomethyl triazine compound, a benzyl dimethyl ketal compound, an α-hydroxy ketone compound, an α-aminoketone compound, an acylphosphine compound, a phosphine oxide compound, a metallocene compound, an oxime compound, a triaryl imidazole dimer, an onium compound, a benzothiazole compound, a benzophenone compound, an acetophenone compound, a cyclopentadiene-benzene-iron complex, a halomethyl oxadiazole compound, and a 3-aryl substituted coumarin compound, is more preferably an compound selected from an oxime compound, an α-hydroxy ketone compound, an α-aminoketone compound, and an acylphosphine compound, is even more preferably an oxime compound. As the photopolymerization initiator, the disclosure in paragraphs 0065 to 0111 of JP2014-130173A can be referred to, and the content thereof is incorporated in the present specification.

Examples of the commercially available products of the α-hydroxyketone compound include IRGACURE-184, DAROCUR-1173, IRGACURE-500, IRGACURE-2959, and IRGACURE-127 (above are manufactured by BASF SE). Examples of the commercially available products of the α-aminoketone compound include IRGACURE-907, IRGACURE-369, IRGACURE-379, and IRGACURE-379EG (above are manufactured by BASF SE). Examples of the commercially available products of the acylphosphine compound include IRGACURE-819 and DAROCUR-TPO (above are manufactured by BASF SE).

As the oxime compound, compounds disclosed in JP2001-233842A, compounds disclosed in JP2000-080068A, compounds disclosed in JP2006-342166A, and compounds disclosed in JP2016-021012A can be used. Examples of the oxime compound that can be preferably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropane-1-one, 2-benzoyloxyimino-1-phenylpropan-1-one, 3-(4-toluenesulfonyloxy) iminobutan-2-one, and 2-ethoxycarbonyloxyimino-1-phenylpropan-1-one. Examples thereof also include compounds disclosed in J. C. S. Perkin II (1979), pp. 1653 to 1660, J. C. S. Perkin II (1979), pp. 156 to 162, Journal of Photopolymer Science and Technology (1995), pp. 202 to 232, and compounds disclosed in JP2000-066385A, JP2000-080068A, JP2004-534797A, and JP2006-342166A. As commercially available products, IRGACURE-OXE01, IRGACURE-OXE02, IRGACURE-OXE03, and IRGACURE-OXE04 (above are manufactured by BASF SE) are also suitably used. TR-PBG-304 (manufactured by Changzhou Tronly New Electronic Materials Co., Ltd.), ADEKA ARKLES NCI-831 (manufactured by ADEKA Corporation), ADEKA ARKLES NCI-930 (manufactured by ADEKA Corporation), and ADEKA OPTOMER N-1919 (manufactured by ADEKA Corporation, Photopolymerization Initiator 2 of JP2012-014052A) can be also used.

According to the present invention, as the photopolymerization initiator, an oxime compound having a fluorene ring can also be used. Specific examples of the oxime compound having a fluorene ring include compounds disclosed in JP2014-137466A. The contents thereof are incorporated in the present specification.

According to the present invention, as the photopolymerization initiator, an oxime compound having a fluorine atom can also be used. Specific examples of the oxime compound having a fluorine atom include compounds disclosed in JP2010-262028A, compounds 24 and 36 to 40 disclosed in JP2014-500852A, and Compound (C-3) of JP2013-164471A. The contents thereof are incorporated in the present specification.

According to the present invention, as the photopolymerization initiator, an oxime compound having a nitro group can be used. The oxime compound having a nitro group is also preferably a dimer. Specific examples of the oxime compound having a nitro group include compounds disclosed in paragraphs 0031 to 0047 of JP2013-114249A and paragraphs 0008 to 0012 and 0070 to 0079 of JP2014-137466A, compounds disclosed in paragraphs 0007 to 0025 of JP4223071B, and ADEKA ARKLES NCI-831 (manufactured by ADEKA Corporation).

Specific examples of the oxime compound that is preferably used in the present invention are provided below, and the present invention is not limited to the examples.

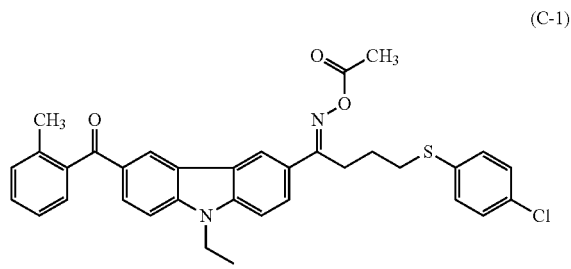

(C-1)

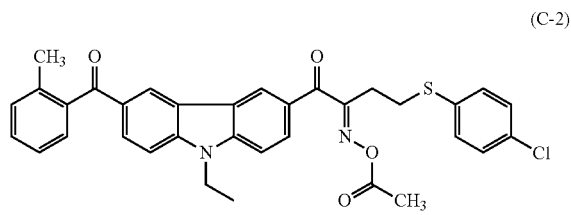

(C-2)

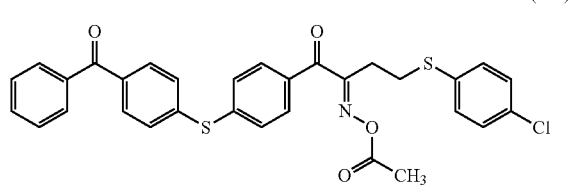

(C-3)

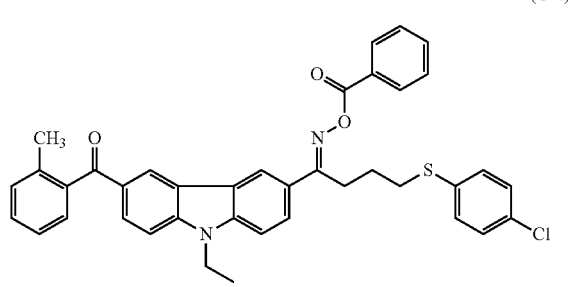

(C-4)

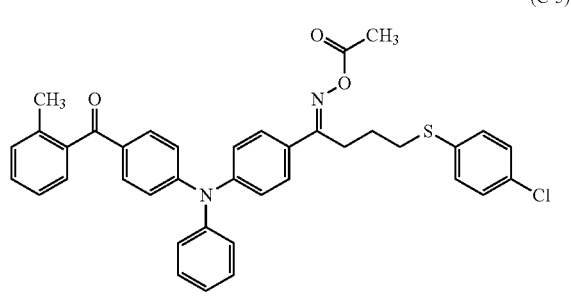

(C-5)

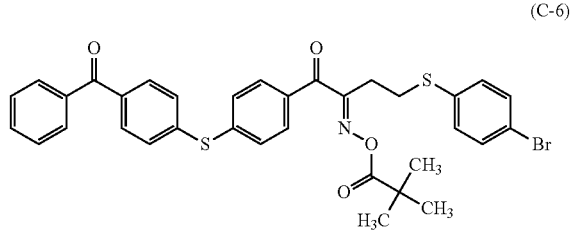

(C-6)

-continued (C-7) 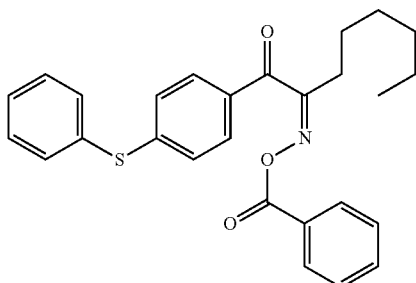

(C-8) 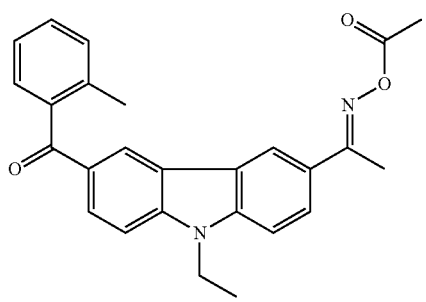

(C-9) 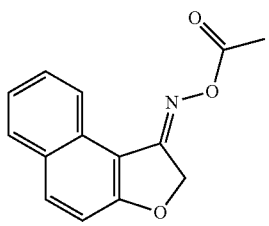

(C-10) 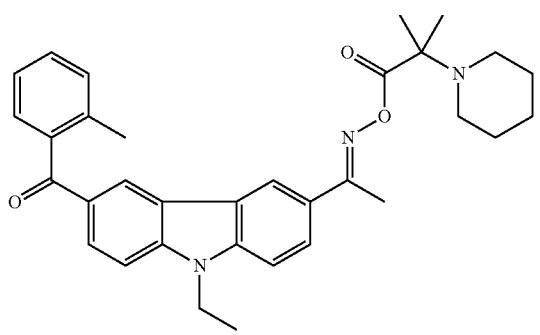

(C-11) 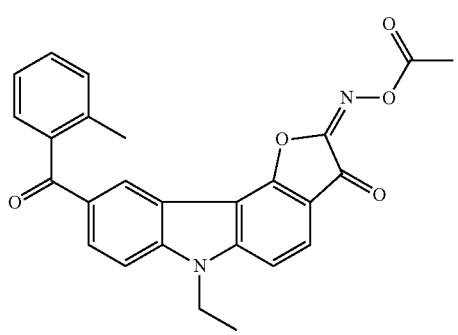

-continued (C-12) 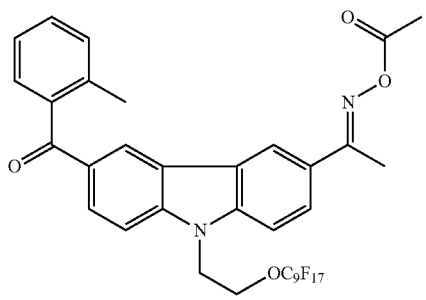

(C-13) 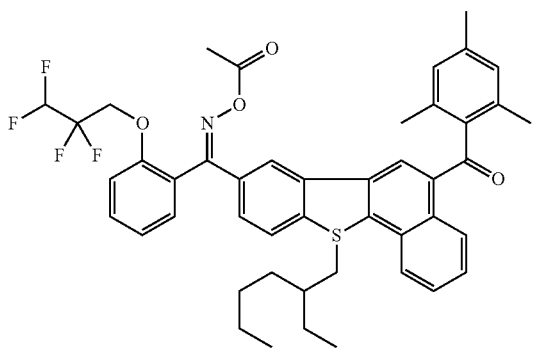

(C-14) 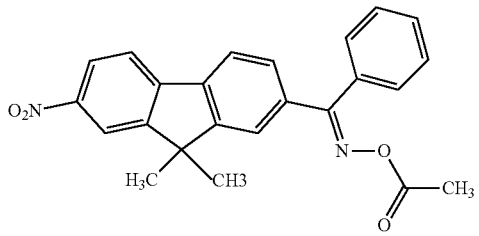

The oxime compound is preferably a compound having a maximum absorption wavelength in a wavelength range of 350 nm to 500 nm and more preferably a compound having a maximum absorption wavelength in a wavelength range of 360 nm to 480 nm. The oxime compound is preferably a compound having a high absorbance at 365 nm and 405 nm. In view of sensitivity, a molar light absorption coefficient of the oxime compound at 365 nm or 405 nm is preferably 1,000 to 300,000, more preferably 2,000 to 300,000, and particularly preferably 5,000 to 200,000. The molar light absorption coefficient of the compound can be measured using a well-known method. For example, it is preferable to measure the molar light absorption coefficient with a spectrophotometer (Cary-5 spectrophotometer manufactured by Varian Inc.) by using an ethyl acetate solvent at a concentration of 0.01 g/L.

The photopolymerization initiator preferably includes an oxime compound and an α-aminoketone compound. By using the both in combination, developability is improved and a pattern having excellent rectangularity is easily formed. In a case where the oxime compound and the α-aminoketone compound are used in combination, the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and even more preferably 1 to 20 mass % with respect to the total solid content of the resin composition. In a case where the content of the photopolymerization initiator is within the above range, the developability is satisfactory. The resin composition according to the embodiment of the present invention may include the photopolymerization initiator singly or may include two or more kinds thereof. In a case where two or more kinds of the photopolymerization initiators are contained, the total amount thereof is preferably in the above range.

<<Epoxy Curing Agent>>

In a case where the resin composition according to the embodiment of the present invention includes an epoxy resin, it is preferable to further include an epoxy curing agent. Examples of the epoxy curing agent include an acid anhydride or polyvalent carboxylic acid. Examples of the acid anhydride include phthalic anhydride, trimellitic anhydride, pyromellitic anhydride, maleic anhydride, tetrahydrophthalic anhydride, methyltetrahydrophthalic anhydride, anhydrous methyl nadic acid, nadic anhydride, hexahydrophthalic anhydride, methyl hexahydrophthalic anhydride, glutaric anhydride, 2,4-diethyl glutaric anhydride, 3,3-dimethyl glutaric anhydride, butanetetracarboxylic anhydride, bicyclo[2,2,1]heptane-2,3-dicarboxylic anhydride, methylbicyclo[2,2,1]heptane-2,3-dicarboxylic anhydride, and cyclohexane-1,3,4-tricarboxylic acid-3,4-anhydride. Methyltetrahydrophthalic anhydride, anhydrous methyl nadic acid, nadic anhydride, hexahydrophthalic anhydride, methyl hexahydrophthalic anhydride, 2,4-diethyl glutaric anhydride, butanetetracarboxylic anhydride, bicyclo[2,2,1]heptane-2,3-dicarboxylic anhydride, methylbicyclo[2,2,1]heptane-2,3-dicarboxylic anhydride, and cyclohexane-1,3,4-tricarboxylic acid-3,4-anhydride are particularly preferable, in view of light resistance, transparency, and workability. The polyvalent carboxylic acid is preferably a compound having 2 to 6 carboxyl groups. Specifically, examples thereof include alkyltricarboxylic acid such as 1,2,3,4-butanetetracarboxylic acid, 1,2,3-propanetricarboxylic acid, 1,3,5-pentanetricarboxylic acid, and citric acid; aliphatic cyclic polyvalent carboxylic acids such as phthalic acid, hexahydrophthalic acid, methyl hexahydrophthalic acid, tetrahydrophthalic acid, methyltetrahydrophthalic acid, cyclohexane tricarboxylic acid, nadic acid, and methyl nadic acid; dimer acids that are multimers of unsaturated fatty acids such as linolenic acid and oleic acid and reductants thereof; and linear alkyl diacids such as malic acid, succinic acid, hexanedioic acid, pentanedioic acid, heptanedioic acid, octanedioic acid, nonane diacid, and decanedioic acid, succinic acid, hexanedioic acid, pentanedioic acid, heptanedioic acid, octanedioic acid, nonane diacid, and decanedioic acid are preferable, and succinic acid is more preferable, in view of heat resistance and transparency of the film.

The content of the epoxy curing agent is preferably 0.01 to 20 parts by mass, more preferably 0.01 to 10 parts by mass, and even more preferably 0.1 to 6.0 parts by mass with respect to 100 parts by mass of the epoxy resin.

<<Dye>>

The resin composition according to the embodiment of the present invention can further contain a dye. The dye may be a dye (hereinafter, also referred to as a chromatic dye) having an absorption in the visible range or a dye (hereinafter, also referred to as a near infrared absorbing dye) having an absorption in the near infrared range. As the dye, a coloring agent multimer may also be used. Dyes disclosed in JP2015-028144A and JP2015-034966A can also be used.

In a case where the resin composition according to the embodiment of the present invention contains a dye, the content of the dye is preferably 30 mass % or less, more preferably 20 mass % or less, and even more preferably 15 mass % or less with respect to the total solid content of the resin composition. For example, the lower limit can be 0.01 mass % or more and can be 0.5 mass % or more.

<<Inorganic Particle>>

The resin composition according to the embodiment of the present invention can further have an inorganic particle. As the inorganic particle, a metal oxide particle or a metal particle is preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, niobium-doped titanium dioxide (Nb-doped $TiO_2$) particles. Examples of the metal particles include silver (Ag) particles, gold (Au) particles, copper (Cu) particles, and nickel (Ni) particles. As the inorganic particles, a tungsten oxide-based compound can also be used. As the tungsten oxide-based compound, cesium tungsten oxide is preferable. With respect to the details of the tungsten oxide-based compound, paragraph 0080 of JP2016-006476A can be referred to, and the contents thereof are incorporated in the present specification. The shape of the inorganic particle is not particularly limited, and may be a sheet shape, a wire shape, or a tube shape regardless of a spherical shape or a non-spherical shape.

In a case where the resin composition according to the embodiment of the present invention contains an inorganic particle, the content of the inorganic particle is preferably 30 mass % or less, more preferably 20 mass % or less, and even more preferably 15 mass % or less with respect to the total solid content of the resin composition. For example, the lower limit can be 0.01 mass % or more and can be 0.5 mass % or more.

<<Coloring Material that Transmits at Least Part of Light in Near Infrared Range and Shields Light in Visible Range (Coloring Material that Shields Visible Light)>>

As the organic pigment, the resin composition according to the embodiment of the present invention can contain a coloring material (hereinafter, also referred to as a coloring material that shields visible light) that transmits at least a part of the light in a near infrared range and shields light in a visible range. The coloring material that shields visible light preferably exhibits black, gray, or a color similar to these, by a combination of a plurality of coloring materials. The coloring material that shields the visible light is preferably a material that absorbs light in the violet to red wavelength ranges. The coloring material that shields visible light is preferably a coloring material that shields light in the wavelength range of 400 to 700 nm.

The coloring material that shields the visible light preferably satisfies at least one requirement of (1) or (2) as below and more preferably satisfies the requirement of (1).

(1): Form of including two or more kinds of chromatic colorants (2): Form of including organic black colorant Examples of the chromatic colorant include the above chromatic organic pigments and chromatic dyes. Examples of the organic black colorant include a bisbenzofuranone compound, an azomethine compound, a perylene compound, and an azo compound, and a bisbenzofuranone compound and a perylene compound are preferable. Examples of the bisbenzofuranone compound include compounds disclosed in JP2010-534726A, JP2012-515233A, and JP2012-515234A, and for example, the bisbenzofuranone compound can be obtained as "Irgaphor Black" manufactured by BASF SE. Examples of the perylene compound include C. I. Pigment Black 31 and 32. Examples of the azomethine compound include compounds disclosed in JP1989-170601A (JP-H01-170601A) and JP1990-034664A (JP-H02-034664A), and the azomethine compound can be obtained as "CHROMOFINE BLACK A1103" manufactured by Dainichiseika Color & Chemicals Mfg. Co., Ltd.

In a case where black color is formed by a combination of two or more chromatic colorants, examples of the combinations of chromatic colorants include the following.

(1) An aspect of containing a yellow colorant, a blue colorant, a violet colorant, and a red colorant.

(2) An aspect of containing a yellow colorant, a blue colorant, and a red colorant.

(3) An aspect of containing a yellow colorant, a violet colorant, and a red colorant.

(4) An aspect of containing a yellow colorant and a violet colorant.

(5) An aspect of containing a green colorant, a blue colorant, a violet colorant, and a red colorant.

(6) An aspect of containing a violet colorant and an orange colorant.

(7) An aspect of containing a green colorant, a violet colorant, and a red colorant.

(8) An aspect of containing a green colorant and a red colorant.

In a case where the resin composition according to the embodiment of the present invention contains a coloring material that shields visible light, the content of the coloring material that shields visible light is preferably 60 mass % or less, more preferably 50 mass % or less, even more preferably 30 mass % or less, still even more preferably 20 mass % or less, and particularly preferably 15 mass % or less with respect to the total solid content of the resin composition. For example, the lower limit can be 0.01 mass % or more and can be 0.5 mass % or more.

<<Silane Coupling Agent>>

The resin composition according to the embodiment of the present invention can contain a silane coupling agent. According to the present invention, the silane coupling agent means a silane compound having a hydrolyzable group and other functional groups. The hydrolyzable group refers to a substituent which is directly connected to a silicon atom and can generate a siloxane bond by at least any one of hydrolysis reaction or condensation reaction. Examples of the hydrolyzable group include a halogen atom, an alkoxy group, and an acyloxy group, and an alkoxy group is preferable. That is, the silane coupling agent is preferably a compound having an alkoxysilyl group. The functional group other than the hydrolyzable group is preferably a group exhibiting affinity by using interaction between resins or forming a bond with the resin and the like. Examples thereof include a vinyl group, a styryl group, a (meth)acryloyl group, a mercapto group, an epoxy group, an oxetanyl group, an amino group, a ureido group, a sulfide group, and an isocyanate group, and a (meth)acryloyl group and an epoxy group are preferable. Examples of the silane coupling agent include compounds disclosed in paragraphs 0018 to 0036 of JP2009-288703A, compounds disclosed in paragraphs 0056 to 0066 of JP2009-242604A, and compounds disclosed in paragraphs 0229 to 0236 of WO2015/166779A, and the contents thereof are incorporated in the present specification.

The content of the silane coupling agent is preferably 0.01 to 15.0 mass % and more preferably 0.05 to 10.0 mass % with respect to the total solid content of the resin composition. The silane coupling agent may be used singly or two or more kinds thereof may be used. In a case where two or more kinds thereof are used, it is preferable that the total amount is in the above range.

<<Surfactant>>

In view of further improving coatability, the resin composition according to the embodiment of the present invention may contain various surfactants. As the surfactant, various kinds of surfactants such as a fluorine-based surfactant, a nonionic surfactant, a cationic surfactant, an anionic surfactant, and a silicone-based surfactant may be used. With respect to the surfactants, paragraphs 0238 to 0245 of WO2015/166779A can be referred to, and the contents thereof are incorporated in the present specification.

By causing the resin composition according to the embodiment of the present invention to contain a fluorine-based surfactant, the liquid properties (particularly, fluidity) in a case of being prepared as a coating liquid are further improved and uniformity after coating or liquid saving properties can be further improved. It is possible to more suitably form a film having an even thickness with a small thickness unevenness.

The fluorine content of the fluorine-based surfactant is preferably 3 to 40 mass %, more preferably 5 to 30 mass %, and particularly preferably 7 to 25 mass %. The fluorine-based surfactant in a case where the fluorine content is in this range is effective in view of the uniformity of the thickness of the coating film and liquid saving properties.

Examples of the fluorine-based surfactant include surfactants disclosed in paragraphs 0060 to 0064 (paragraphs 0060 to 0064 of WO2014/017669A) of JP2014-041318A and surfactants disclosed in paragraphs 0117 to 0132 of JP2011-132503A, and the contents thereof are incorporated in the present specification. Examples of the commercially available product of the fluorine-based surfactant include MEGAFACE F171, F172, F173, F176, F177, F141, F142, F143, F144, R30, F437, F475, F479, F482, F554, and F780 (above are manufactured by DIC Corporation), FLORARD FC430, FC431, and FC171 (above are manufactured by Sumitomo 3M Limited), SURFRON S-382, SC-101, SC-103, SC-104, SC-105, SC-1068, SC-381, SC-383, S-393, and KH-40 (above are manufactured by Asahi Glass Co., Ltd.), and PolyFox PF636, PF656, PF6320, PF6520, and PF7002 (above are manufactured by or OMNOVA Solutions Inc.).

The fluorine-based surfactant has a molecular structure having a functional group containing a fluorine atom, and an acrylic compound in which a part of a functional group containing a fluorine atom is broken in a case where heat is applied and the fluorine atom volatilizes can also be suitably used. Examples of the fluorine-based surfactant include MEGAFACE DS series (The Chemical Daily Co., Ltd., Feb. 22, 2016) (Nikkei Inc., Feb. 23, 2016), manufactured by DIC Corporation, and MEGAFACE DS-21.

As the fluorine-based surfactant, a block polymer can also be used. Examples thereof include compounds disclosed in JP2011-089090A. As the fluorine-based surfactant, a fluorine-containing polymer compound including a repeating unit derived from a (meth)acrylate compound having a fluorine atom and a repeating unit derived from a (meth)acrylate compound having two or more (preferably five or more) alkyleneoxy groups (preferably an ethyleneoxy group and a propyleneoxy group) can also be preferably used. The following compounds are also exemplified as the fluorine-based surfactant used in the present invention.

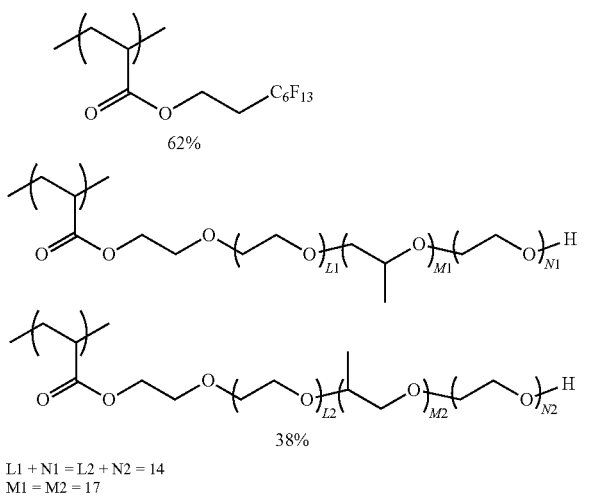

L1 + N1 = L2 + N2 = 14
M1 = M2 = 17

The weight-average molecular weight of the compound is preferably 3,000 to 50,000, and for example, 14,000. In the compound, % that indicates a proportion of the repeating unit is mol %.

As the fluorine-based surfactant, a fluorine-containing polymer having an ethylenically unsaturated group on a side chain can be used. Examples of the specific examples include compounds disclosed in paragraphs 0050 to 0090 and paragraphs 0289 to 0295 of JP2010-164965A, for example, MEGAFACE RS-101, RS-102, RS-718K, and RS-72-K manufactured by DIC Corporation. As the fluorine-based surfactant, compounds disclosed in paragraphs 0015 to 0158 of JP2015-117327A can be used.

Examples of the nonionic surfactant include glycerol, trimethylolpropane, trimethylol ethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate, and sorbitan fatty acid ester, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrizol Japan Limited), NCW-101, NCW-1001, and NCW-1002 (manufactured by FUJIFILM Wako Pure Chemical Corporation), PIONIN D-6112, D-6112-W, and D-6315 (manufactured by Takemoto Oil & Fat Co., Ltd.), and OLFINE E1010 and SURFYNOL 104, 400, and 440 (manufactured by Nissin Chemical Industry Co., Ltd.).

The content of the surfactant is preferably 0.001 mass % to 5.0 mass % and more preferably 0.005 to 3.0 mass % with respect to the total solid content of the resin composition. The surfactant may be used singly or two or more kinds thereof may be used. In a case where two or more kinds of the surfactants are included, the total amount is preferably in the above range.

<<Ultraviolet Absorbing Agent>>

The resin composition according to the embodiment of the present invention can contain an ultraviolet absorbing agent. As the ultraviolet absorbing agent, a conjugated diene compound, an amino butadiene compound, a methyl dibenzoyl compound, a coumarin compound, a salicylate compound, a benzophenone compound, a benzotriazole compound, an acrylonitrile compound, a hydroxyphenyl triazine compound, or the like can be used. With respect to the details thereof, the description of paragraphs 0052 to 0072 of JP2012-208374A and paragraphs 0317 to 0334 of JP2013-068814A can be referred to, and the contents thereof are incorporated in the present specification. Examples of the commercially available products of the conjugated diene compound include UV-503 (manufactured by Daito Chemical Co., Ltd.). As the benzotriazole compound, MYUA series (Japan Chemical Daily, Feb. 1, 2016) manufactured by Miyoshi Oils and Fats Co., Ltd. may be used. As an ultraviolet absorbing agent, the following compounds can also be used.

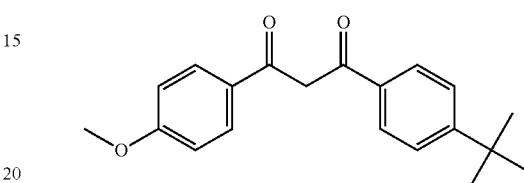

The content of the ultraviolet absorbing agent is preferably 0.01 to 10 mass % and more preferably 0.01 to 5 mass % with respect to the total solid content of the resin composition according to the embodiment of the present invention. The ultraviolet absorbing agent may be used singly and two or more kinds thereof may be used. In a case where two or more kinds thereof are used, it is preferable that the total amount is in the above range.

<<Antioxidant>>

The resin composition according to the embodiment of the present invention can contain an antioxidant. Examples of the antioxidant include a phenol compound, a phosphite compound, and a thioether compound. As the phenol compound, any phenol compound known as a phenol-based antioxidant can be used. Preferable examples of the phenol compound include a hindered phenol compound. A compound having a substituent at a site (ortho position) adjacent to the phenolic hydroxyl group is preferable. The substituent is preferably a substituted or unsubstituted alkyl group having 1 to 22 carbon atoms. A compound having a phenol group and a phosphite group in the same molecule is also preferable as the antioxidant. As the antioxidant, a phosphorus-based antioxidant can also be suitably used. Examples of the phosphorus-based antioxidant include tris[2-[[2,4,8,10-tetrakis(1,1-dimethylethyl) dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl) oxy]ethyl] amine, and ethylbis(2,4-di-tert-butyl-6-methylphenyl) phosphite. Examples of the commercially available products of the antioxidant include ADEKASTAB AO-20, ADEKASTAB AO-30, ADEKASTAB AO-40, ADEKASTAB AO-50, ADEKASTAB AO-50F, ADEKASTAB AO-60, ADEKASTAB AO-60G, ADEKASTAB AO-80, and ADEKASTAB AO-330 (above are ADEKA Corporation).

The content of the antioxidant is preferably 0.01 to 20 mass % and more preferably 0.3 to 15 mass % with respect to the total solid content of the resin composition according to the embodiment of the present invention. The antioxidant may be used singly and two or more kinds thereof may be used. In a case where two or more kinds thereof are used, it is preferable that the total amount is in the above range.

<<Polymerization Inhibitor>>

The resin composition according to the embodiment of the present invention may contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol), and N-nitrosophenylhydroxyamine salt (ammonium salt, primary cerium salt, and the like). Among these, p-methoxyphenol is preferable. The polymerization inhibitor may function as an antioxidant. The content of the polymerization inhibitor is preferably 0.01 to 5 mass % with respect to the total solid content of the resin composition.

<<Other Components>>

If necessary, the resin composition according to the embodiment of the present invention may contain a sensitizing agent, a curing accelerator, a filler, a thermal curing accelerator, a thermal polymerization inhibitor, a plasticizer, and other auxiliaries (for example, conductive particles, an antifoaming agent, a flame retardant, a leveling agent, a release promoter, a perfume, a surface tension adjuster, and a chain transfer agent). By causing these components to be contained by an appropriate amount, stability and film properties of a desired optical filter such as a near infrared cut filter can be adjusted. For example, as these components, disclosures disclosed in paragraph 0183 and the subsequent paragraphs (0237 of the corresponding US2013/0034812A) of JP2012-003225A and paragraphs 0101 to 0104 and 0107 to 0109 of JP2008-250074A, and the content thereof is incorporated in the present specification.

For example, the viscosity (25° C.) of the resin composition according to the embodiment of the present invention is preferably 1 to 100 mPa·s in a case of forming a film by coating. The lower limit is more preferably 2 mPa·s or more and even more preferably 3 mPa·s or more. The upper limit is more preferably 50 mPa·s or less, even more preferably 30 mPa·s or less, and particularly preferably 15 mPa·s or less.

The storage container of the resin composition according to the embodiment of the present invention is not particularly limited, and a well-known storage container can be used. As the storage container, for the purpose of suppressing the contamination of impurities in raw materials or compositions, and a multi-layered bottle in which six layers of the inner walls of the container are made of a resin of six types, and a bottle with seven layers are made of a resin of six types is preferably used. Examples of the container include containers disclosed in JP2015-123351A.

The use of the resin composition according to the embodiment of the present invention is not particularly limited. For example, the resin composition can be preferably used for forming a color filter, a near infrared cut filter, an infrared transmitting filter.

<Method of Preparing Resin Composition>

The resin composition according to the embodiment of the present invention can be prepared by mixing the above components and adjusting the content of a Na atom. Examples of the method of adjusting the content of Na atom in the resin composition include a method of decreasing the content of the Na atom by using a raw material with less content of the Na atom or by performing the purification treatment after the preparation of the resin composition. In the preparation of the resin composition, all components may be simultaneously dissolved or dispersed in a solvent to prepare a resin composition, and, if necessary, two or more solutions or dispersion liquids in which respective components are appropriately formulated are prepared in advance and these are mixed in a case of usage (at a case of application) to be prepared as a resin composition.

In the preparation of the resin composition, it is preferable to include a process of dispersing an organic pigment. In the process of dispersing the organic pigment, examples of the mechanical force used for dispersing the organic pigment include compression, squeezing, impact, shearing, and cavitation. Specific examples of the process include a beads mill, a sand mill, a roll mill, a ball mill, a paint shaker, a micro fluidizer, a high speed impeller, a sand grinder, a flow jet mixer, high pressure wet atomization, and ultrasonic dispersion. In pulverizing the organic pigment in the sand mill (beads mill), it is preferable to perform a treatment under the condition of increasing the pulverization efficiency of the organic pigment by using beads with a small diameter, increasing a filling rate of the beads, or the like. It is preferable to remove the coarse particles by filtration, centrifugation or the like after the pulverization treatment of the organic pigment. With respect to the processes and the dispersing machines for dispersing an organic pigment, processes and dispersing machines disclosed in "Complete work on dispersion technology, Johokiko Co., Ltd., Jul. 15, 2005" or "Actual comprehensive data collection on dispersion technology and industrial application centered on suspension (solid/liquid dispersion system), Publishing department of Management Development Center, Oct. 10, 1978", and paragraph 0022 of JP2015-157893A can be appropriately used. In the process of dispersing the organic pigment, fine processing of the particles may be performed in the salt milling step. With respect to materials, equipment, processing conditions, and the like used salt milling step, the description disclosed in, for example, JP2015-194521A and JP2012-046629A can be referred to.

In the preparation of the resin composition, it is preferable to filtrate the resin composition with a filter for the purpose of removing foreign matters and reducing defects. The filter can be used without any particular limitation as long as the filter is used in the related art for filtration purposes or the like. Examples thereof include a filter using a material such as a fluororesin such as polytetrafluoroethylene (PTFE), a polyamide-based resin such as nylon (for example, nylon-6 and nylon-6,6), and a polyolefin resin such as polyethylene and polypropylene (PP) (including a polyolefin resin with high density and ultra high molecular weight). Among these materials, polypropylene (including high density polypropylene) and nylon are preferable.

The pore diameter of the filter is appropriately about 0.01 to 7.0 μm, preferably about 0.01 to 3.0 μm, and more preferably about 0.05 to 0.5 μm. In a case where the pore diameter of the filter is in the above range, fine foreign matters can be securely removed. It is also preferable to use a fibrous filter material. Examples of the fibrous filter material include a polypropylene fiber, a nylon fiber, and a glass fiber. Specific examples thereof include filter cartridges of SBP type series (SBP008 and the like), TPR type series (TPR002, TPR005, and the like), and SHPX type series (SHPX003 and the like) manufactured by Rok Techno Co., Ltd.

In a case of using the filter, different filters (for example, the first filter and the second filter) may be combined. At that time, filtration with each filter may be performed only once or may be performed twice or more times.

It is also possible to combine filters having different pore diameters within the above range. Here, as the pore diameters, nominal values of the filter manufacturer can be referred to. As commercially available filters, for example, a filter can be selected from various filters provided by Nihon Pall Ltd. (DFA 4201 NXEY, and the like), Advantec Toyo Kaisha, Ltd., Entegris Japan Co., Ltd. (formerly Japan Mykrolis Corporation), or Kitz Micro Filter Corporation.

As the second filter, a filter formed of the same material as the first filter described above can be used.

The filtration with the first filter may be performed only with the dispersion liquid, and the filtration with the second filter may be performed after mixing other components.

<Resin Film>

The resin film according to the embodiment of the present invention is described. A first aspect of the resin film according to the embodiment of the present invention is a resin film obtained from the resin composition according to the embodiment of the present invention. Since the resin composition according to the embodiment of the present invention contains 0.01 to 50 mass ppm of a Na atom in the resin composition, a polar group included in the resin or the like is appropriately protected by a Na atom, such that the phase separation of the organic pigment and the resin in the resin film is suppressed, and the dispersibility of the organic pigment in the resin film can be increased. Therefore, in a case of film formation, the generation of the foreign matters derived from the compound included in the coloring agent structure of the organic pigment or the like can be effectively suppressed, and thus such a resin film having few foreign matters can be obtained. In the first aspect of the resin film according to the embodiment of the present invention, the content of the Na atom in the resin film is preferably 0.01 to 50 mass ppm, more preferably 0.03 to 30 mass ppm, and even more preferably 0.1 to 10 mass ppm with respect to the total solid content of the resin film.

A second aspect of the resin film according to the embodiment of the present invention is a resin film including an organic pigment and a resin and includes 0.01 to 50 mass ppm of a Na atom with respect to the total solid content of the resin film. In a case where the content of the Na atom in the resin film is in the above range, it is possible to obtain a resin film in which the formation of the foreign matters derived from the compound having a coloring agent structure such as an organic pigment is suppressed. Examples of the method of adjusting the content of the Na atom in the resin film to the above range include a method of manufacturing a resin film by using the resin composition according to the embodiment of the present invention and a method of transferring a Na atom from a layer or a member adjacent to the resin film to the resin film in a case of film formation of the resin film to adjust the content of the Na atom in the resin film to the above range. According to the second aspect of the resin film according to the embodiment of the present invention, the content of the Na atom in the resin film is preferably 0.03 to 30 mass ppm and more preferably 0.1 to 10 mass ppm with respect to the total solid content of the resin film.

In the first and second aspects of the resin film according to the embodiment of the present invention, the content of the K atom in the resin film is preferably 10 mass ppm or less, more preferably 7 mass ppm or less, and even more preferably 4 mass ppm or less with respect to the total solid content of the resin film. In a case where the content of the K atom in the resin film is 10 mass ppm or less, the number of defects after the film formation is easily suppressed.

In the first and second aspects of the resin film according to the embodiment of the present invention, the content of the Li atom in the resin film is preferably 10 mass ppm or less, more preferably 7 mass ppm or less, and even more preferably 4 mass ppm or less with respect to the total solid content of the resin film. In a case where the content of the Li atom in the resin film is 10 mass ppm or less, the number of defects after the film formation is easily suppressed.

According to the first and second aspects of the resin film according to the embodiment of the present invention, the total content of the K atom and the Li atom in the resin film is preferably 10 mass ppm or less, more preferably 7 mass ppm or less, and even more preferably 4 mass ppm or less with respect to the total solid content of the resin film. In a case where the total content of the K atom and the Li atom in the resin film is 10 mass ppm or less, the number of defects after the film formation is easily suppressed.

According to the present invention, the content of the Na atom, the K atom, or the Li atom in the resin film is a value quantified and measured by an absolute calibration curve method in inductively coupled plasma optical emission spectrometry (ICP-OES).

The resin film according to the embodiment of the present invention can be preferably used for a color filter, a near infrared cut filter, and an infrared transmitting filter. In a case where a resin film is used as a color filter, it is preferable that the resin film includes a chromatic organic pigment. In a case where the resin film is used as a near infrared cut filter, it is preferable that the resin film includes a near infrared absorbing organic pigment. In a case where a resin film is used as an infrared transmitting filter, it is preferable that the resin film includes a coloring material which shields visible light. According to the present invention, the near infrared cut filter refers to a filter that transmits light (visible light) in a wavelength of the visible range and shields at least a part of light in a wavelength of the near infrared range (near infrared ray). The near infrared cut filter may transmit all light having a wavelength of the visible range, and may transmit light in a specific wavelength range out of light in the wavelength of the visible range and shield light in a specific wavelength range. According to the present invention, the color filter means a filter that transmits light of a specific wavelength range and shields light in a specific wavelength range, out of light of wavelengths in the visible range. The infrared transmitting filter refers to a filter that shields light in a wavelength of the visible range and transmits at least a part of light (near infrared rays) in a wavelength of the near infrared range.

The resin film according to the embodiment of the present invention may have a pattern or may be a film (flat film) not having a pattern. The resin film according to the embodiment of the present invention may be laminated on a support or the resin film according to the embodiment of the present invention may be peeled from a support to be used.

The film thickness of the resin film according to the embodiment of the present invention can be appropriately adjusted according to the purpose. The film thickness is preferably 20 µm or less, more preferably 10 µm or less, and even more preferably 5 µm or less. The lower limit of the film thickness is preferably 0.1 µm or more, more preferably 0.2 µm or more, and even more preferably 0.3 µm or more.

The resin film according to the embodiment of the present invention can be used for various devices such as a solid-state imaging element such as a charge coupled device (CCD) and a complementary metal oxide semiconductor (CMOS), an infrared sensor, and an image display device.

<Method of Manufacturing Resin Film>

Subsequently, a method of manufacturing a resin film according to the embodiment of the present invention is described. The method of manufacturing the resin film according to the embodiment of the present invention is a method of manufacturing a resin film manufacturing a resin film including 0.01 to 50 mass ppm of a Na atom with respect to the total solid content of the resin film by applying a resin composition including an organic pigment, a resin, and a solvent on a support, the content of the Na atom in the resin film is adjusted to 0.01 to 50 mass ppm with respect to the total solid content of the resin film, by using, as the resin composition, a resin composition in which the content of the Na atom is 0.01 to 50 mass ppm with respect to the total solid content of the resin composition, or transferring a Na atom to the resin film from a layer or a member adjacent to the resin film in a case of manufacturing the resin film. That is, in a first aspect of the method of manufacturing the resin film according to the embodiment of the present invention, a resin composition in which the content of the Na atom is 0.01 to 50 mass ppm with respect to the total solid content of the resin composition is used as the resin composition. That is, the resin composition according to the embodiment of the present invention described above is used. In a second aspect of the method of manufacturing the resin film according to the embodiment of the present invention, the content of the Na atom in the resin film is adjusted to 0.01 to 50 mass ppm with respect to the total solid content of the resin film, by transferring a Na atom to the resin film from a layer or a member adjacent to the resin film in a case of manufacturing the resin film. In the second aspect, the resin composition according to the embodiment of the present invention is used as the resin composition. As the resin composition, a resin composition in which the content of the Na atom is less than 0.01 mass ppm with respect to the total solid content of the resin composition may be used.

In the second aspect of the method of manufacturing the resin film according to the embodiment of the present invention, examples of the layer or the member adjacent to the resin film include a layer or a member that is in contact with the resin film in the thickness direction or a layer or a member that is in contact with the resin film in the width direction. Examples thereof include a support or another resin film. The layer or the member adjacent to the resin film is described by using FIGS. 2 to 7.

Figure 2:
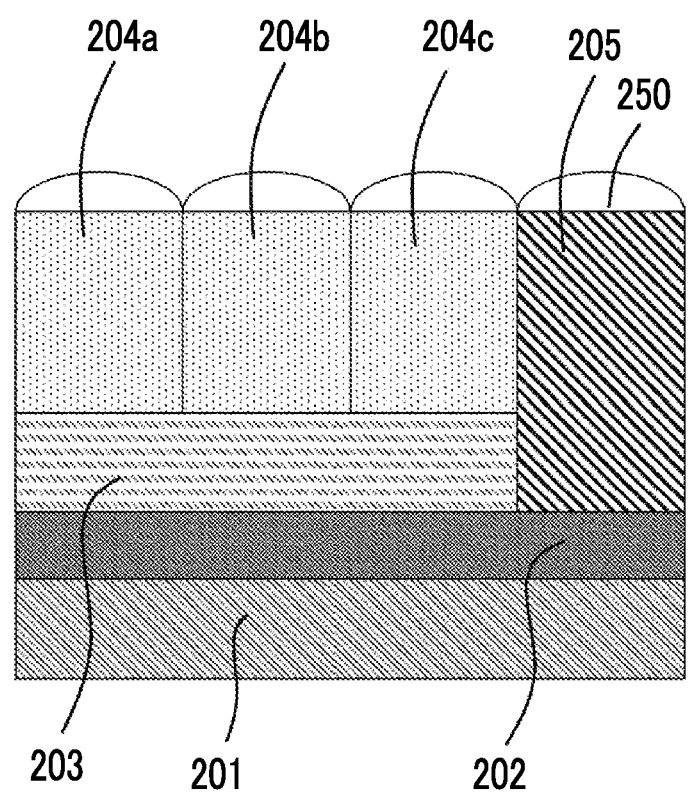
FIG. 2 illustrates an embodiment of a structure including a resin film according to the present invention.

In the structure illustrated in FIG. 2, a base film 202 is formed on a substrate 201. In FIG. 2, the substrate 201 and the base film 202 correspond to the support. A near infrared cut filter 203 and an infrared transmitting filter 205 are laminated on the base film 202. Color filters 204a, 204b, and 204c are laminated on the near infrared cut filters 203. Microlenses 250 are arranged on the color filters 204a, 204b, and 204c and the infrared transmitting filters 205. In the structure illustrated in FIG. 2, for example, in a case where the near infrared cut filter 203 is manufactured by using the manufacturing method according to the embodiment of the present invention, the layers or the members adjacent to the near infrared cut filter 203 are the base film 202, the infrared transmitting filter 205, color filters 204a, 204b, and 204c. In a case where the infrared transmitting filter 205 is manufactured by using the manufacturing method according to the embodiment of the present invention, the layers or the members adjacent to the infrared transmitting filter 205 are the base film 202, the near infrared cut filter 203, the color filter 204c, and the microlens 250. In a case where the color filter 204b is manufactured by using the manufacturing method according to the embodiment of the present invention, the layers or the members adjacent to the color filter 204b are the near infrared cut filter 203, the color filters 204a and 204c, and the microlens 250.

In the structure illustrated in FIG. 2, the base film 202 is formed on the substrate 201, the near infrared cut filter 203 and the infrared transmitting filter 205 are laminated on the base film 202, but the base film 202 may be omitted such that the near infrared cut filter 203 and the infrared transmitting filter 205 are directly laminated on the substrate 201. In this case, the layers or the members adjacent to the near infrared cut filter 203 are the substrate 201, the infrared transmitting filter 205, and the color filters 204a, 204b, and 204c.

Figure 3:
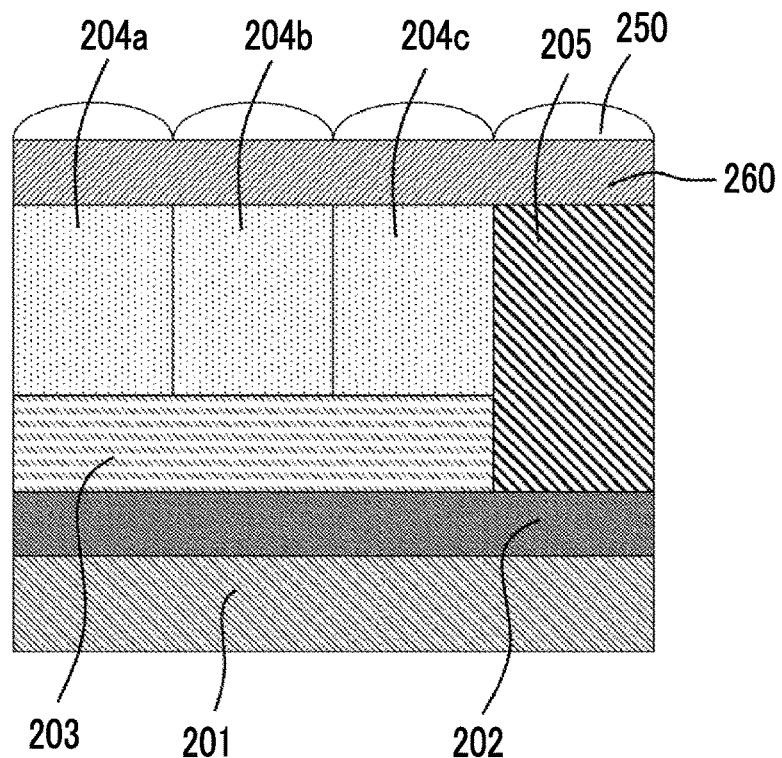
FIG. 3 illustrates another embodiment of the structure including the resin film according to the present invention.

The structure illustrated in FIG. 3 is different from the structure illustrated in FIG. 2 in that an oxygen shielding layer 260 is formed on the color filters 204a, 204b, and 204c and the infrared transmitting filter 205, and the microlens 250 is arranged on the oxygen shielding layer 260. In the structure illustrated in FIG. 3, for example, in a case where the near infrared cut filter 203 is manufactured by using the manufacturing method according to the embodiment of the present invention, the layers or the members adjacent to the near infrared cut filter 203 are the base film 202, the infrared transmitting filter 205, and the color filters 204a, 204b, and 204c. In a case where the infrared transmitting filter 205 is manufactured by using the manufacturing method according to the embodiment of the present invention, the layers or the members adjacent to the infrared transmitting filter 205 are the base film 202, the near infrared cut filter 203, the color filter 204c, and the oxygen shielding layer 260. In a case where the color filter 204b is manufactured by using the manufacturing method according to the embodiment of the present invention, the layers or the members adjacent to the color filter 204b are the near infrared cut filter 203, the color filters 204a and 204c, and the oxygen shielding layer 260. In the aspect illustrated in FIG. 3, the base film 202 may be omitted such that the near infrared cut filter 203 and the infrared transmitting filter 205 are directly laminated on the substrate 201.

Figure 4:
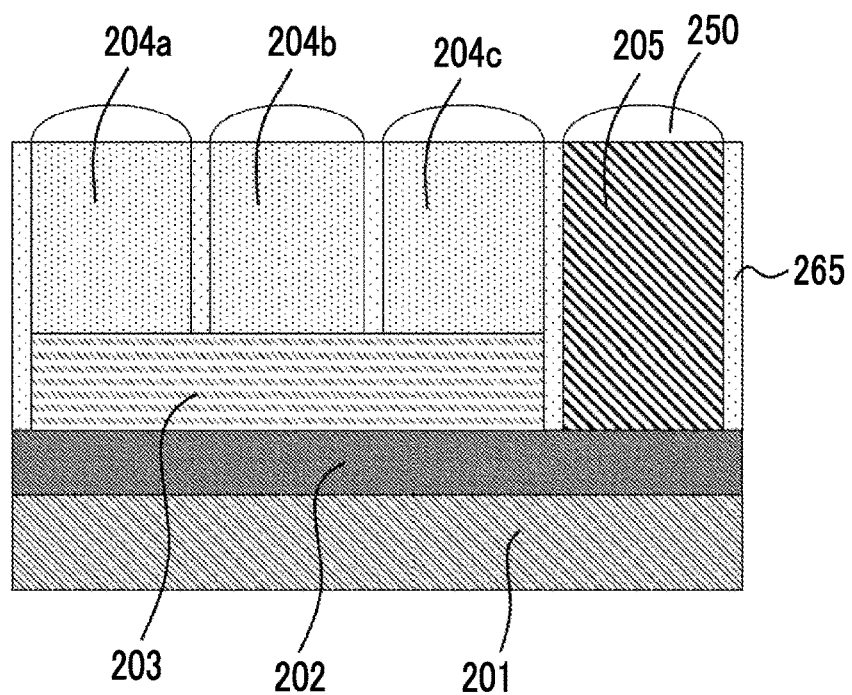
FIG. 4 illustrates still another embodiment of the structure including the resin film according to the present invention.

The structure illustrated in FIG. 4 is different from the structure illustrated in FIG. 2 in that the color filters 204a, 204b, and 204c and the infrared transmitting filter 205 are formed in areas divided by partition walls 265. In the structure illustrated in FIG. 4, for example, in a case where the near infrared cut filter 203 is manufactured by using the manufacturing method according to the embodiment of the present invention, the layers or the members adjacent to the near infrared cut filter 203 are the base film 202, the infrared transmitting filter 205, the color filters 204a, 204b, and 204c, and the partition walls 265. In a case where the infrared transmitting filter 205 is manufactured by using the manufacturing method according to the embodiment of the present invention, the layers or the members adjacent to the infrared transmitting filter 205 are the base film 202, the partition walls 265, and the microlens 250. In a case where the color filter 204b is manufactured by using the manufacturing method according to the embodiment of the present invention, the layers or the members adjacent to the color filter 204b are the near infrared cut filter 203, the partition walls 265, and the microlens 250. Also in the aspect illustrated in FIG. 4, the base film 202 may be omitted such that the near infrared cut filter 203 and the infrared transmitting filter 205 are directly laminated on the substrate 201. Also in the aspect illustrated in FIG. 4, as illustrated in FIG. 3, the oxygen shielding layer 260 is formed on the color filters 204a, 204b, and 204c, and the infrared transmitting filter 205, and the microlens 250 is arranged on the oxygen shielding layer 260.

In the structures illustrated in FIGS. 2 to 4, the lamination order of the near infrared cut filter 203 and the color filters 204a, 204b, and 204c may be changed. In the structures illustrated in FIGS. 2 to 4, a planarizing layer may be formed on the color filters 204a, 204b, and 204c, and the infrared transmitting filters 205. In the structures illustrated in FIGS. 2 to 4, an organic layer or a planarizing layer are formed on the near infrared cut filter 203. In the structures illustrated in FIGS. 2 to 4, another layer other than the above may be further provided between the respective layers.

Figure 5:
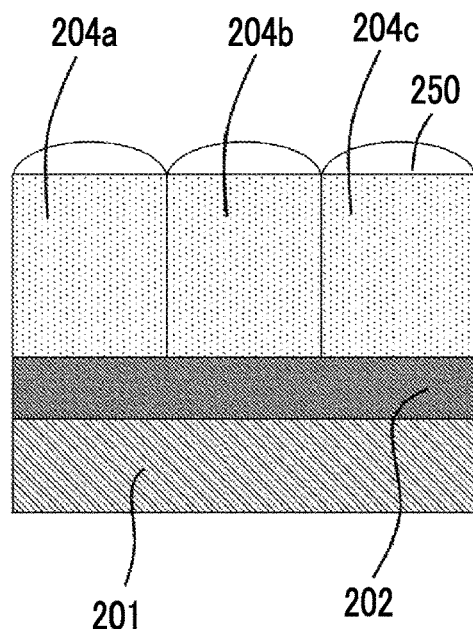
FIG. 5 illustrates still another embodiment of the structure including the resin film according to the present invention.

In the structure illustrated in FIG. 5, the base film 202 is formed on the substrate 201. The color filters 204a, 204b, and 204c are laminated on the base film 202. The microlens 250 is arranged on the color filters 204a, 204b, and 204c. In the structure illustrated in FIG. 5, in a case where the color filter 204b is manufactured by using the manufacturing method according to the embodiment of the present invention, the layers or the members adjacent to the color filter 204b are the base film 202, the color filters 204a and 204c, and the microlens 250.

In the structure illustrated in FIG. 5, the base film 202 is formed on the substrate 201, and the color filter 204a, 204b, and 204c are laminated on the base film 202, but the base film 202 may be omitted such that the color filter 204a, 204b, and 204c are directly laminated on the substrate 201. In addition, the near infrared cut filter 203 may be further formed on the base film 202, such that the color filter 204a, 204b, and 204c are respectively laminated on the near infrared cut filter 203. In this case, the layers or the members adjacent to the color filter 204b are the near infrared cut filter 203, the color filter 204a and 204c, and the microlens 250. The layers or the members adjacent to the near infrared cut filter 203 are the base film 202, the color filter 204a, 204b, and 204c.

In the aspect illustrated in FIG. 5, as illustrated in FIG. 3, the oxygen shielding layer 260 is formed on the color filters 204a, 204b, and 204c, such that the microlens 250 is arranged on the oxygen shielding layer 260. In the aspect illustrated in FIG. 5, as illustrated in FIG. 4, the respective color filters 204a, 204b, and 204c may be formed in areas divided by the partition walls 265. In this case, the layers or the members adjacent to the color filter 204b are the base film 202, the partition walls 265, and the microlens 250.

Figure 6:
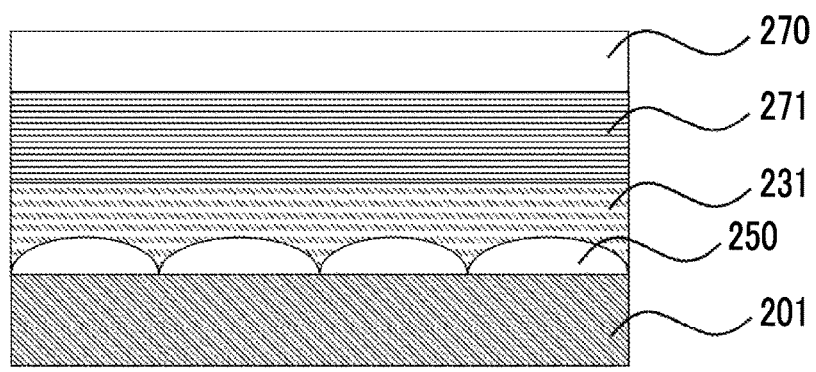
FIG. 6 illustrates still another embodiment of the structure including the resin film according to the present invention.

In the structure illustrated in FIG. 6, the microlenses 250 are formed on the substrate 201. The near infrared cut filter 231 is formed on the microlenses 250. A dielectric multilayer film 271 is laminated on the near infrared cut filter 231. A layer 270 of low refractive index is laminated on the dielectric multilayer film 271. In the structure illustrated in FIG. 6, in a case where the near infrared cut filter 231 is manufactured by using the manufacturing method according to the embodiment of the present invention, the layers or the members adjacent to the near infrared cut filter 231 are the substrate 201, the microlenses 250, and the dielectric multilayer film 271.

Figure 7:
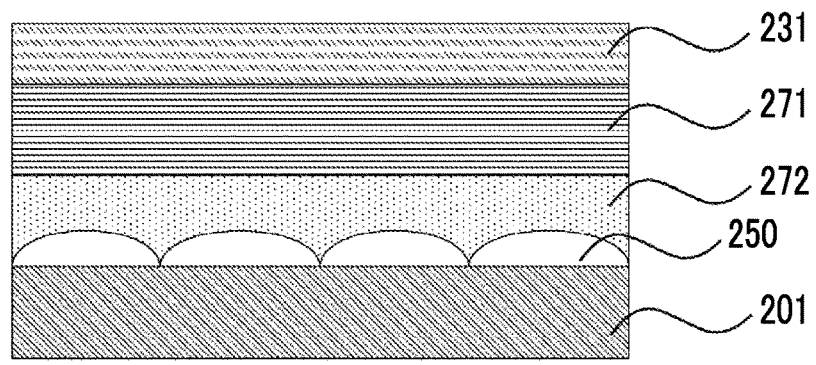
FIG. 7 illustrates still another embodiment of the structure including the resin film according to the present invention.

In the structure illustrated in FIG. 7, the microlenses 250 are formed on the substrate 201. A planarizing layer 272 is formed on the microlenses 250. The dielectric multilayer film 271 is laminated on the planarizing layer 272. The near infrared cut filter 231 is laminated on the dielectric multilayer film 271. In the structure illustrated in FIG. 7, in a case where the near infrared cut filter 231 is manufactured by using the manufacturing method according to the embodiment of the present invention, the layer or the member adjacent to the near infrared cut filter 231 is the dielectric multilayer film 271.

In the second aspect of the method of manufacturing the resin film according to the embodiment of the present invention, examples of the method of transferring a Na atom from the layer or the member adjacent to the resin film to the resin film in a case of manufacturing the resin film include a method of heating a resin composition layer formed by applying the resin composition on the support to transfer a Na atom included in the layer or the member to the resin composition layer side from the layer or the member adjacent to the resin film. In the second aspect, examples of the method of adjusting the content of the Na atom in the resin film include a method of adjusting the content of the Na atom included in the layer or the member.

In the method of manufacturing the resin film according to the embodiment of the present invention, examples of the support to which the resin composition is applied include a substrate formed of a material such as silicon, alkali-free glass, soda glass, PYREX (registered trademark) glass, and quartz glass. Base films such as an organic film and an inorganic film, may be formed on these substrates. As the support, a substrate formed of the above resin can be used. A charge coupled device (CCD), a complementary metal oxide semiconductor (CMOS), a transparent conductive film, or the like may be formed on the support. A black matrix for isolating each pixel may be formed on the support. In the case where a glass substrate is used as the support, it is preferable to form an inorganic film on the glass substrate or use the glass substrate after a dealkalization treatment.

In the method of manufacturing the resin film according to the embodiment of the present invention, the method of applying the resin composition is not particularly limited, and well-known methods can be used. Examples thereof include a dropwise adding method (drop cast); a slit coating method; a spray method; a roll coating method; a spin coating method (spin coating); a casting coating method; a slit and spin method; a pre-wet method (for example, a method disclosed in JP2009-145395A); various printing methods such as inkjet (for example, an on-demand method, a piezo method, and a thermal method), ejection system printing such as nozzle jet, flexo printing, screen printing, gravure printing, inverse offset printing, and a metal mask printing method; a transfer method using a die or the like; and a nanoimprint method. The application method by inkjet is not particularly limited, and examples thereof include methods disclosed in "Spreading and usable inkjet—infinite possibilities in patent, issued in February 2005, S. B. Research Co., Ltd." (particularly, pages 115 to 133), JP2003-262716A, JP2003-185831A, JP2003-261827A, JP2012-126830A, and JP2006-169325A.

The composition layer formed by applying the resin composition may be dried (pre-baked). The pre-baking temperature in a case of performing pre-baking is preferably 150° C. or lower, more preferably 120° C. or lower, and even more preferably 110° C. or lower. For example, the lower limit can be 50° C. or higher and can be 80° C. or higher. The pre-baking time is preferably 10 seconds to 3,000 seconds, more preferably 40 to 2,500 seconds, and even more preferably 80 to 2200 seconds. Drying can be performed with a hot plate, an oven, or the like.

In the method for manufacturing a resin film according to the embodiment of the present invention, a step of further forming a pattern may be included. Examples of the pattern forming method include a pattern forming method using photolithography and a pattern forming method using a dry etching method. In the case where the resin film according to the embodiment of the present invention is used as a flat film, a step of forming a pattern may not be performed. Hereinafter, the step of forming a pattern will be described in detail.

(Case of Forming Pattern by Photolithography)

It is preferable that The method of forming a pattern by the photolithography method includes a step (exposure step) of exposing a composition layer formed by applying the resin composition in a pattern form and a step of developing and removing the composition layer in an unexposed portion to form a pattern (development step). If necessary, a step of baking the developed pattern (post-baking step) may be provided. Hereinafter, respective steps are described.

<<Exposure Step>>

In the exposure step, the composition layer is exposed in a pattern form. For example, the composition layer can be pattern-exposed by exposing the composition layer through a mask having a predetermined mask pattern by using an exposure device such as a stepper. Accordingly, the exposed portion can be cured. As the radiation (light) that can be used for the exposure, ultraviolet rays such as g rays and i rays are preferably used and more preferably i rays. For example, the irradiation amount (exposure amount) is preferably 0.03 to 2.5 J/cm$^2$, more preferably 0.05 to 1.0 J/cm$^2$, and most preferably 0.08 to 0.5 J/cm$^2$. The oxygen concentration in the atmospheric air in a case of exposure can be appropriately selected. In addition to performing the exposure in the atmosphere, exposure is performed under a low oxygen atmosphere (for example, 15 vol %, 5 vol %, and substantially oxygen free) having an oxygen concentration of 19 vol % or less, or exposure may be performed under a high oxygen atmosphere (for example, 22 vol %, 30 vol %, and 50 vol %) in which the oxygen concentration exceeds 21 vol %. The exposure illuminance can be appropriately set, and can be selected generally in the range of 1,000 W/m$^2$ to 100,000 W/m$^2$ (for example, 5,000 W/m$^2$, 15,000 W/m$^2$, and 35,000 W/m$^2$). The conditions of the oxygen concentration and the expose illuminance can be appropriately combined, and for example, at the oxygen concentration can be set as 10 vol %, the illuminance can be set as 10,000 W/m$^2$, or the oxygen concentration can be set as 35 vol %, the illuminance can be set as 20,000 W/m$^2$.

<<Development Step>>

Subsequently, the unexposed part of the composition layer in the exposed composition layer removed by development to form a pattern. The step of removing the composition layer of the unexposed portion by development can be performed by using a developer. As a result, the composition layer in the unexposed portion in the exposure step elutes into the developer, and only the photocured portion remains on the support. As a developer, an alkaline developer which does not damage an underlying solid-state imaging element, a circuit, and the like is desirable. For example, the temperature of the developer is preferably 20° C. to 30° C. The developing time is preferably 20 to 180 seconds. In order to improve the residue removability, a step of shaking off the developer every a predetermined period of time (for example, 60 seconds) and newly supplying the developer may be repeated several times.

Examples of the alkaline agent used in the developer include an organic alkaline compound such as ammonia water, ethylamine, diethylamine, dimethylethanolamine, diglycol amine, diethanolamine, hydroxylamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis (2-hydroxyethyl) ammonium hydroxide, colin, pyrrole, piperidine, and 1,8-diazabicyclo [5.4.0]-7-undecene, and an inorganic alkaline compound such as sodium hydroxide, potassium hydroxide, sodium carbonate, sodium hydrogen carbonate, sodium silicate, and sodium metasilicate. As the developer, these alkaline aqueous solutions obtained by diluting an alkaline agent with pure water are preferably used. The concentration of the alkaline agent in the alkaline aqueous solution is preferably 0.001 to 10 mass % and more preferably 0.01 to 1 mass %. The surfactant may be used in the developer. Examples of the surfactant include surfactants described in those included in the composition, and a nonionic surfactant is preferable. In view of convenience of transfer and storage, the developer may be once manufactured as a concentrated solution and diluted to a concentration required in a case of using. The dilution ratio is not particularly limited, but it can be set to, for example, 1.5 to 100 times. In a case where a developer including the alkaline aqueous solution is used, it is preferable to perform rinsing with pure water after development.

After development, a heat treatment (post-baking) can be performed after drying. Post-baking is a post-development heat treatment for completely curing of the film. In a case where post-baking is performed, for example, the post-baking temperature is preferably 100° C. to 240° C. In view of curing a film, the post-baking temperature is more preferably 200° C. to 230° C. In a case where a resin film is formed on a support including an organic electroluminescent (organic EL) element or a photoelectric conversion film formed of an organic material, the post-baking temperature is preferably 150° C. or lower, more preferably 120° C. or lower, even more preferably 100° C. or lower, and particularly preferably 90° C. or lower. The lower limit may be, for example, 50° C. or higher. The post-baking may be performed in a continuous or batch manner on the developed film by using heating means such as a hot plate, a convection oven (hot air circulation type dryer), and a high frequency heating machine, so as to satisfy the above conditions. In a case where a pattern is formed by a low temperature process, post-baking may not be performed.

(Case of Forming Pattern by Dry Etching Method)

Pattern formation by a dry etching method is performed by a method of curing a composition layer formed by coating a support or the like with a resin composition to form a cured material layer, forming a patterned photoresist layer on the cured material layer, and dry etching the cured material layer with etching gas by using the patterned photoresist layer as a mask. In the formation of the photoresist layer, it is preferable that a pre-baking treatment is further performed. Particularly, as a process for forming a photoresist, a form of performing a heat treatment after exposure and a heat treatment (post-bake treatment) after development is desirable. With respect to the pattern formation in a dry etching method, the description of paragraphs 0010 to 0067 of JP2013-064993A can be referred to, and the contents thereof are incorporated in the present specification.

<Optical Filter>

Subsequently, the optical filter according to the embodiment of the present invention is described. The optical filter according to the embodiment of the present invention has the resin film according to the embodiment of the present invention. As the optical filter according to the embodiment of the present invention, at least one selected from a color filter, a near infrared cut filter, or an infrared transmitting filter can be preferably used. Further, an aspect having a pixel in which the resin film according to the embodiment of the present invention is used and a pixel selected from red, green, blue, magenta, yellow, cyan, black, and colorless is also a preferable aspect of the optical filter according to the embodiment of the present invention.

In addition to the resin film according to the embodiment of the present invention, in a case where the resin film according to the embodiment of the present invention is used as the near infrared cut filter, the near infrared cut filter may have a layer containing copper, a dielectric multilayer film, an ultraviolet absorbing layer, and the like. In a case where the near infrared cut filter has a layer containing copper and/or a dielectric multilayer film, it is possible to obtain a near infrared cut filter having a wide angle of view and excellent infrared shielding properties. The near infrared cut filter further has an ultraviolet absorbing layer, so as to obtain a near infrared cut filter having excellent ultraviolet shielding properties. As the ultraviolet absorbing layer, for example, absorbing layers disclosed in paragraphs 0040 to 0070, and 0119 to 0145 of WO2015/099060A can be referred to, and the content thereof is incorporated in the present specification. As the dielectric multilayer film, disclosure of paragraph 0255 to 0259 of JP2014-041318A can be referred to, and the content thereof is incorporated in the present specification. As the layer containing copper, a glass substrate formed of glass containing copper (copper-containing glass substrate) or a layer including a copper complex (copper complex-containing layer) can be used. Examples of the copper-containing glass substrate include phosphate glass containing copper and fluorophosphate glass containing copper. Examples of commercially available products of the copper-containing glass include NF-50 (manufactured by AGC Techno Glass Co., Ltd.), BG-60 and BG-61 (manufactured by Schott AG), and CD5000 (manufactured by HOYA Corporation). With respect to the copper complex, the compounds disclosed in paragraphs 0009 to 0049 of WO2016/068037A can be referred to, and the contents thereof are incorporated in the present specification.

<Solid-State Imaging Element>

The solid-state imaging element according to the embodiment of the present invention includes the resin film according to the embodiment of the present invention. The configuration of the solid-state imaging element has the configuration of the resin film according to the embodiment of the present invention, and the configuration is not particularly limited, as long as the configuration functions as a solid-state imaging element. Examples thereof include the following configuration.

A plurality of photodiodes that form a light receiving area of a solid-state imaging element and a transfer electrode made of polysilicon or the like are provided on a support, a photodiode and a light shielding film which is made of tungsten or the like and in which only a light receiving section of the photodiode on the transfer electrode is open are provided, a device protective film which is formed to cover the entire surface of the light shielding film and the photodiode light receiving section are provided on the light shielding film and which is made of silicon nitride or the like, and the resin film according to the embodiment of the present invention is provided on the device protective film. Further, light condensing means (for example, a microlens; the same is applied in the following) may be provided below the resin film (on the side close to the support) according to the embodiment of the present invention on the device protective film and light condensing means on the resin film according to the embodiment of the present invention may be provided. The resin film may have a structure in which a film forming each pixel is embedded, for example, in a space partitioned in a lattice shape by a partition wall. In this case, it is preferable that the partition wall has a low refractive index with respect to each pixel. Examples of the imaging device having such a structure include devices disclosed in JP2012-227478A and JP2014-179577A.

<Image Display Device>

The image display device according to the embodiment of the present invention includes the resin film according to the embodiment of the present invention. Examples of the image display device include a liquid crystal display device and an organic electroluminescence (organic EL) display device. The definition and details of the image display device are disclosed, for example, in "Electronic Display Device (written by Akio Sasaki, published by Kogyo Chosakai Publishing Co., Ltd., 1990)", "Display Device (written by Ibuki Hosaki, published by Sangyo Tosho Publishing Co., Ltd., 1989)" For example, the liquid crystal display device is disclosed in "Next Generation Liquid Crystal Display Technique (edited by Tatsuo Uchida, published by Kogyo Chosakai Publishing Co., Ltd., 1994)". The liquid crystal display device to which the present invention can be applied is not particularly limited and can be applied to various types of liquid crystal display devices disclosed in "Next Generation Liquid Crystal Display Technology". The image display device may have a white organic EL element. As a white organic EL element, a tandem structure is preferable. A tandem structure of the organic EL element is disclosed in JP2003-045676A and "Frontiers of Organic EL Technology Development—High Brightness, High Accuracy, Longer Life, Know-How Collection" supervised by Akiyoshi Mikami, Technical Information Institute Co., Ltd., pages 326 to 328, 2008, and the like. The spectrum of the white light emitted from the organic EL element preferably has strong maximum emission peaks in the blue range (430 nm to 485 nm), the green range (530 nm to 580 nm), and the yellow range (580 nm to 620 nm). In addition to these emission peaks, the spectrum more preferably has a maximum emission peak in the red range (650 nm to 700 nm).

<Infrared Sensor>

The infrared sensor according to the embodiment of the present invention includes the resin film according to the embodiment of the present invention. The configuration of the infrared sensor is not particularly limited as long as the configuration functions as an infrared sensor. Hereinafter, the infrared sensor according to an embodiment of the present invention is described with reference to the drawings.

In FIG. 1, a reference numeral 110 refers to a solid-state imaging element. An imaging area installed on the solid-state imaging element 110 includes near infrared cut filters 111 and infrared transmitting filters 114. Color filters 112 are laminated on the near infrared cut filters 111. Microlenses 115 are arranged on incidence ray hv side of the color filters 112 and the infrared transmitting filters 114. A planarizing layer 116 is formed so as to cover the microlens 115.

The near infrared cut filter 111 can be formed by using the resin composition according to the embodiment of the present invention. The spectral characteristics of the near infrared cut filter 111 are selected according to the emission wavelength of the infrared light emitting diode (infrared LED) to be used.

The color filter 112 is a color filter in which pixels that transmit and absorb light having a specific wavelength in the visible range are formed, the color filter is not particularly limited, and color filters for forming pixels well-known in the related art can be used. For example, color filters formed with pixels of red (R), green (G), and blue (B) or the like are used. For example, paragraphs 0214 to 0263 of JP2014-043556A can be referred to, and the contents thereof are incorporated in the present specification. The color filter 112 can be formed by using the resin composition according to the embodiment of the present invention.

The characteristics of the infrared transmitting filter 114 are selected according to the emission wavelength of the infrared LED to be used. In a case where the emission wavelength of the infrared LED is 850 nm, with respect to the infrared transmitting filter 114, a maximum value of the light transmittance in the film thickness direction in the wavelength range of 400 to 650 nm is preferably 30% or less, more preferably 20% or less, more preferably 10% or less, and particularly preferably 0.1% or less. It is preferable that this transmittance satisfies the above condition in the entire range of the wavelength 400 to 650 nm. The infrared transmitting filter 114 can be formed by using the resin composition according to the embodiment of the present invention.

In the infrared transmitting filter 114, the minimum value of the light transmittance of the film in the thickness direction in the wavelength range of 800 nm or more (preferably 800 to 1,300 nm) is preferably 70% or more, more preferably 80% or more, and even more preferably 90% or more. The above transmittance preferably satisfies the above condition in a portion of the wavelength range of 800 nm or more, and it is preferable that the above conditions are satisfied at a wavelength corresponding to the emission wavelength of the infrared LED.

The film thickness of the infrared transmitting filter 114 is preferably 100 μm or less, more preferably 15 μm or less, even more preferably 5 μm or less, and particularly preferably 1 μm or less. The lower limit is preferably 0.1 μm. In a case where the film thickness is in the above range, the film satisfying the spectral characteristics described above can be obtained.

Methods of measuring spectral characteristics, film thickness, and the like of the infrared transmitting filter 114 are described below.

The thickness of the film was measured with a probe type surface profile measuring device (DEKTAK150 manufactured by ULVAC Inc.) for the dried substrate having the film.

The spectral characteristics of the film are a value obtained by measuring transmittance in a wavelength range of 300 to 1,300 nm with an ultraviolet-visible near infrared spectrophotometer (U-4100 manufactured by Hitachi High-Technologies Corporation).

For example, in a case where the emission wavelength of the infrared LED is 940 nm, with respect to the infrared transmitting filter 114, it is preferable that, a maximum value of the transmittance of the light in the thickness direction of the film at the wavelength of 450 to 650 nm is 20% or less, the transmittance of the light in the thickness direction of the film in the wavelength range of 835 nm is 20% or less, and a minimum value of the transmittance of the light in the thickness direction of the film in the wavelength range of 1,000 to 1,300 nm is 70% or more.

In the infrared sensor illustrated in FIG. 1, a near infrared cut filter (another near infrared cut filter) other than the near infrared cut filter 111 may be further arranged on the planarizing layer 116. Examples of the other near infrared cut filter include a filter having a layer containing copper and/or a dielectric multilayer film. Examples of the details thereof include those described above. As the other near infrared cut filter, a dual band pass filter may be used.

In the infrared sensor illustrated in FIG. 1, positions of near infrared cut filters 111 and color filters 112 may be substituted with each other. Another layer may be arranged between a solid-state imaging element 110 and the near infrared cut filters 111 and/or between the solid-state imaging element 110 and infrared transmitting filters 114. Examples of the other layer include an organic substance layer formed by using a composition including a polymerizable compound, a resin, and a photopolymerization initiator. A planarizing layer is formed on the color filters 112.

EXAMPLES

Hereinafter, the present invention is specifically described with reference to the examples. A material, an amount used, a proportion, a treatment detail, a treatment order, and the like provided in the following examples can be suitably changed without departing from the gist of the present invention. The scope of the present invention should not be limited by the following specific examples. Unless described otherwise, "%" and "parts" are based on mass.

<Measurement of Contents of Na Atom, Li Atom, and K Atom>

The content of the Na atom, the K atom, or the Li atom in the sample was a value quantified and measured by an absolute calibration curve method in inductively coupled plasma optical emission spectrometry (ICP-OES). Specifically, 0.05 g of a sample was weighed, and the weighed sample was put into a TEFLON (registered trademark) container. 5 ml of nitric acid and 0.5 ml of sulfuric acid were added to the container, and mixed to prepare a solution. The solution was incinerated by microwave. Water was added to the obtained ash to adjust to 40 ml of a solution. Quantification was performed by using this solution by an absolute calibration curve method with ICP-OES, and the contents of a Na atom, a Li atom, and a K atom in the sample were measured.

Test Example 1

<Preparation of Pigment Dispersion Liquid>

Raw materials presented in the following table and 66 parts by mass of zirconia beads having a diameter of 0.5 mm were mixed, a dispersion treatment was performed for 120 minutes with a paint shaker, and the zirconia beads were separated by decantation so as to prepare a dispersion liquid.

TABLE 1

| | Organic pigment | | Pigment derivative | | Dispersing agent | | Solvent | |
|---|---|---|---|---|---|---|---|---|
| | Kind | Content | Kind | Content | Kind | Content | Kind | Content |
| Dispersion liquid 1 | Pigment 1 | 3.42 | Derivative 1 | 0.34 | Dispersing agent 1 | 2.25 | PGMEA | 44 |
| Dispersion liquid 2 | Pigment 8 | 3.42 | Derivative 2 | 0.34 | Dispersing agent 1 | 2.25 | PGMEA | 44 |
| Dispersion liquid 3 | Pigment 1 | 3.42 | Derivative 6 | 0.34 | Dispersing agent 2 | 2.25 | PGMEA | 44 |
| Dispersion liquid 4 | Pigment 1 | 3.42 | Derivative 7 | 0.34 | Dispersing agent 2 | 2.25 | PGMEA | 44 |
| Dispersion liquid 5 | Pigment 3 | 3.42 | Derivative 4 | 0.34 | Dispersing agent 1 | 2.25 | PGMEA | 44 |
| Dispersion liquid 6 | Pigment 3 | 3.42 | Derivative 8 | 0.34 | Dispersing agent 2 | 2.25 | PGMEA | 44 |
| Dispersion liquid 7 | Pigment 1 | 3.42 | Derivative 2 | 0.34 | Dispersing agent 1 | 2.25 | PGMEA | 44 |
| Dispersion liquid 8 | Pigment 1 | 3.42 | Derivative 2 | 0.34 | Dispersing agent 1 | 2.25 | PGMEA | 44 |
| Dispersion liquid 9 | Pigment 2 | 5.95 | Derivative 3 | 1.19 | Dispersing agent 1 | 5.21 | PGMEA | 48 |
| Dispersion liquid 10 | Pigment 2 | 5.95 | Derivative 5 | 1.19 | Dispersing agent 2 | 5.21 | PGMEA | 48 |

TABLE 1-continued

| | Organic pigment | | Pigment derivative | | Dispersing agent | | Solvent | |
|---|---|---|---|---|---|---|---|---|
| | Kind | Content | Kind | Content | Kind | Content | Kind | Content |
| Dispersion liquid 11 | Pigment 4 | 1.71 | Derivative 2 | 0.34 | Dispersing agent 1 | 2.25 | PGMEA | 44 |
| | Pigment 5 | 1.71 | | | | | | |
| Dispersion liquid 12 | Pigment 6 | 1.71 | Derivative 2 | 0.17 | Dispersing agent 1 | 2.25 | PGMEA | 44 |
| | Pigment 7 | 1.71 | Derivative 4 | 0.17 | | | | |
| Dispersion liquid 13 | Pigment 1 | 3.42 | Derivative 1 | 0.34 | Dispersing agent 1 | 5.51 | PGMEA | 37 |
| | Pigment 2 | 3.42 | Derivative 3 | 0.68 | | | | |
| Dispersion liquid 14 | Pigment 1 | 3.42 | Derivative 1 | 0.34 | Dispersing agent 1 | 2.25 | PGMEA | 44 |
| Dispersion liquid 15 | Pigment 1 | 3.42 | Derivative 1 | 0.34 | Dispersing agent 1 | 2.25 | PGMEA | 44 |
| Dispersion liquid 16 | Pigment 1 | 3.42 | Derivative 1 | 0.34 | Dispersing agent 1 | 2.25 | PGMEA | 44 |
| Dispersion liquid 17 | Pigment 1 | 3.42 | Derivative 1 | 0.34 | Dispersing agent 1 | 2.25 | PGMEA | 44 |
| Dispersion liquid 18 | Pigment 1 | 3.42 | Derivative 1 | 0.34 | Dispersing agent 1 | 2.25 | PGMEA | 44 |

The raw materials presented in Table 1 are as follows.
(Organic Pigment)
Pigments 1 to 8: Compounds 1 to 8 having the following structures (in the following structural formula, Me represents a methyl group, and Ph represents a phenyl group)

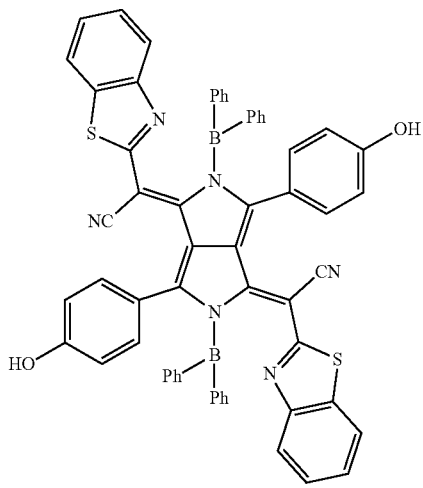

1

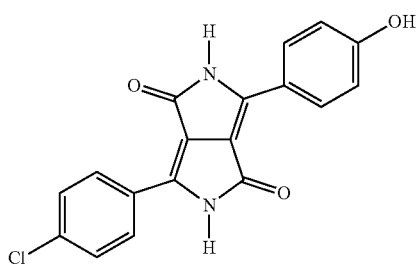

2

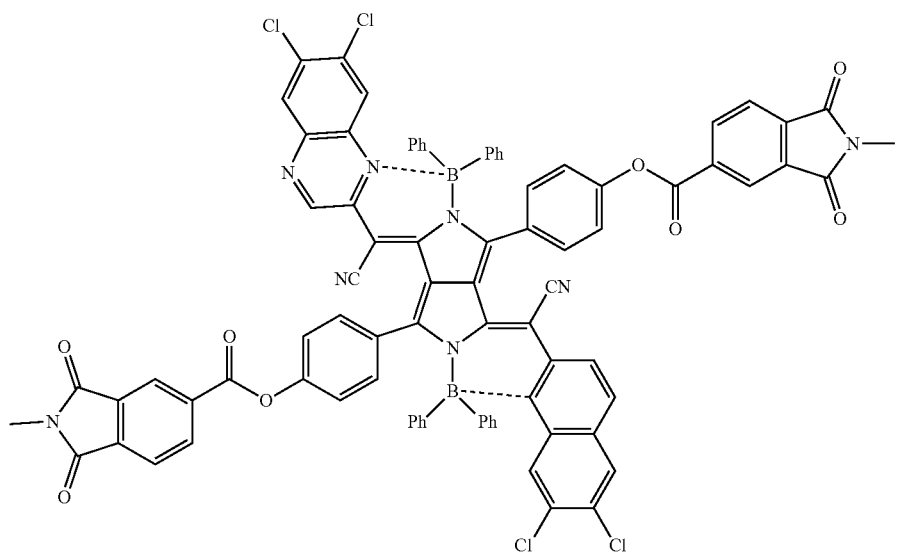
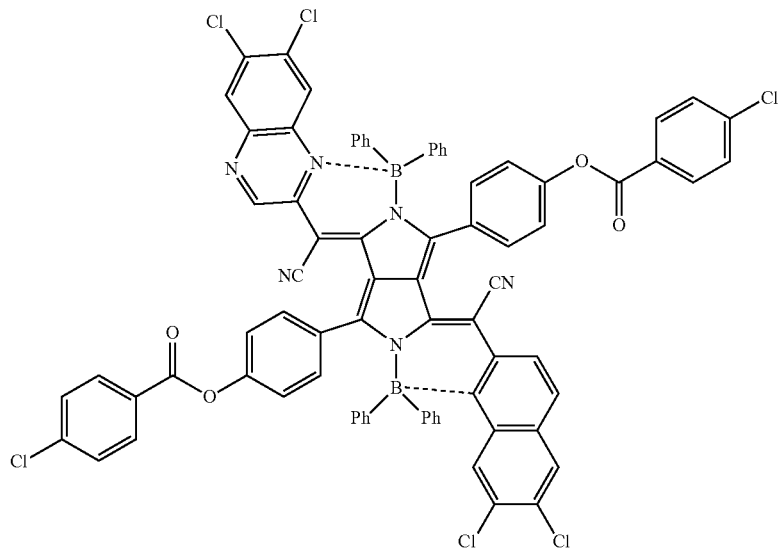
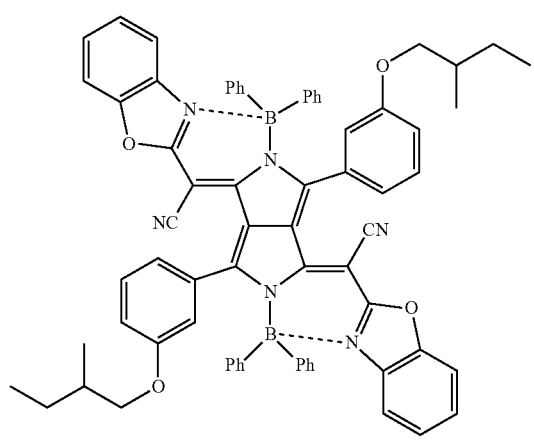

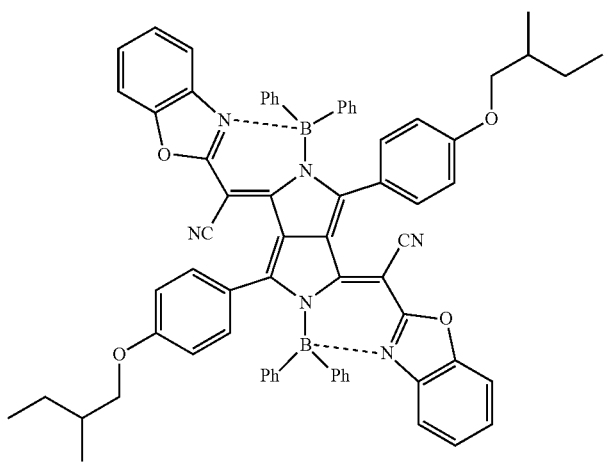
6
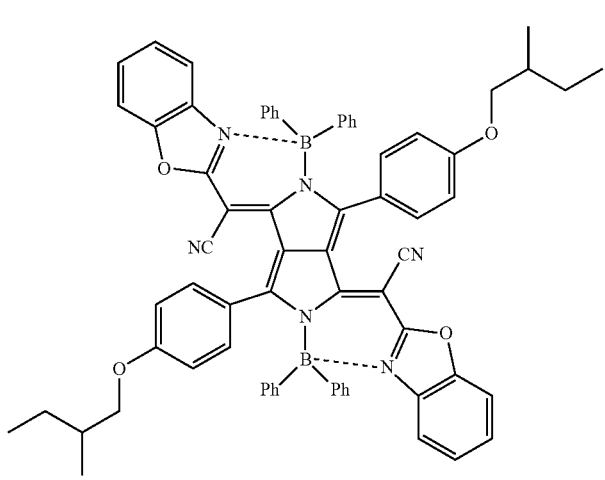
7
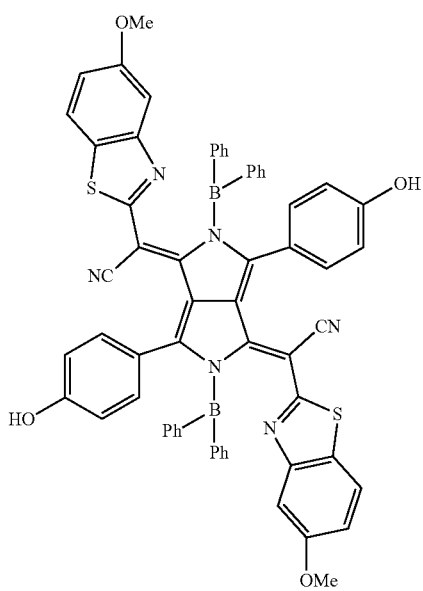
8

(Pigment Derivative)
Derivatives 1 to 8: Compounds 1 to 8 having the following structures (in the following structural formula, Me represents a methyl group, Ph represents a phenyl group)
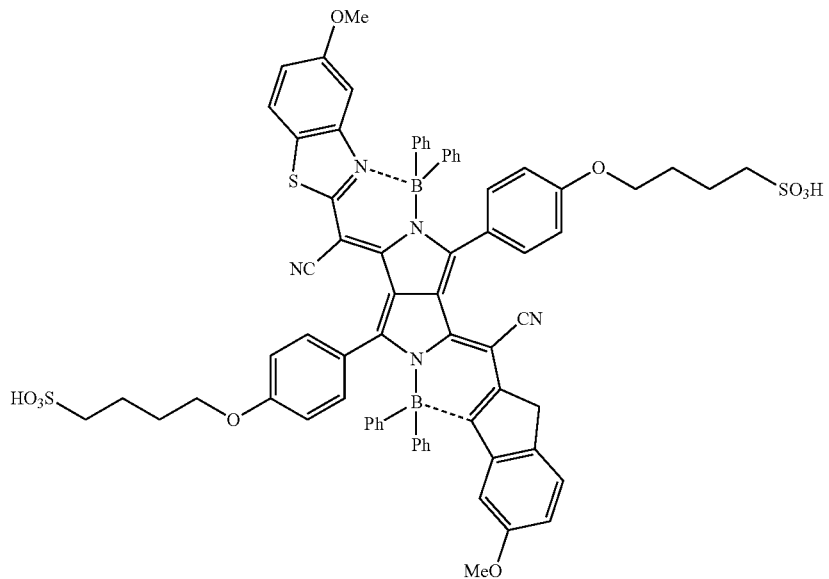
1
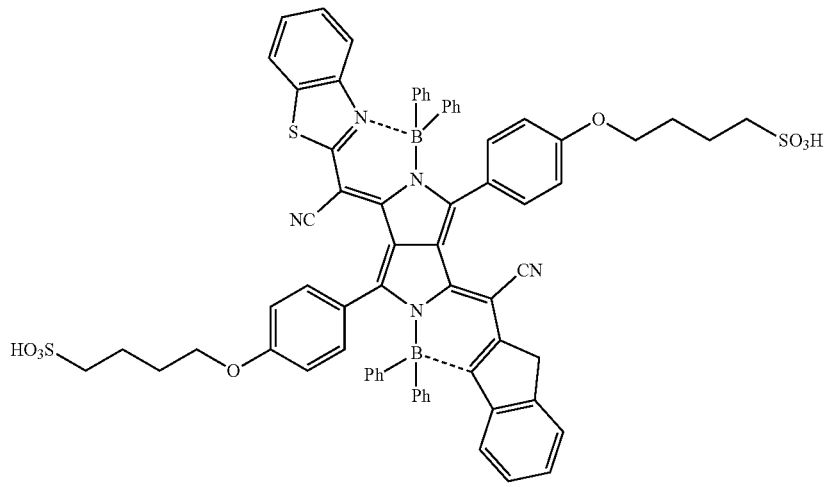
2
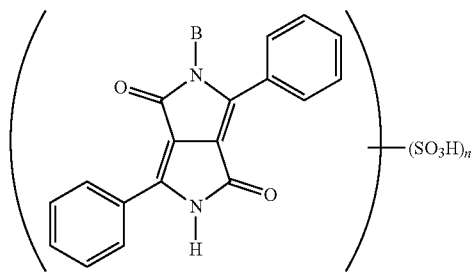
3
n = 1 or 2

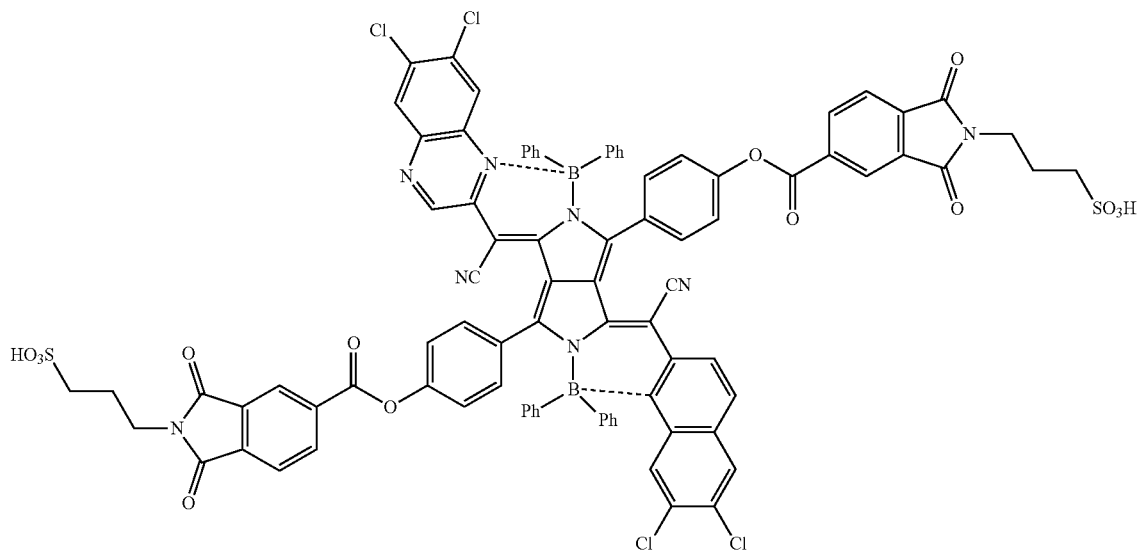
4
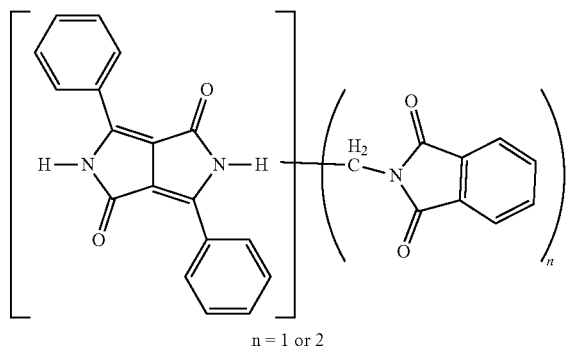
n = 1 or 2
5
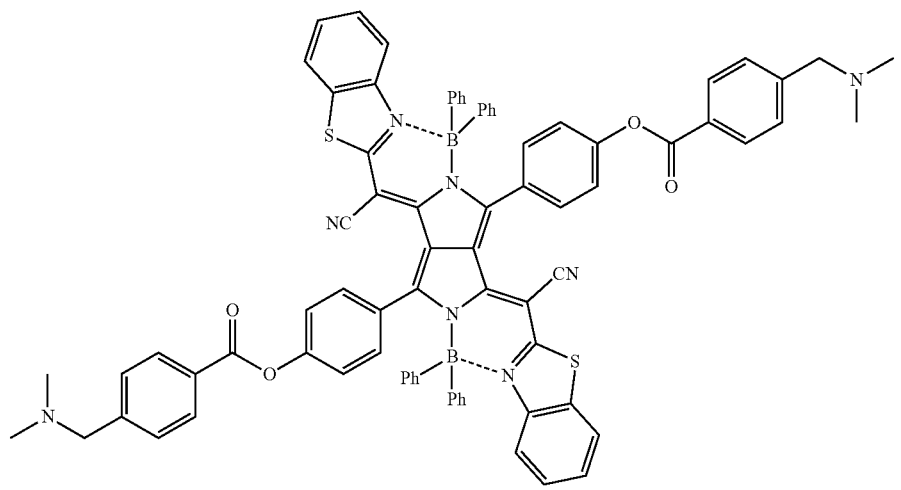
6

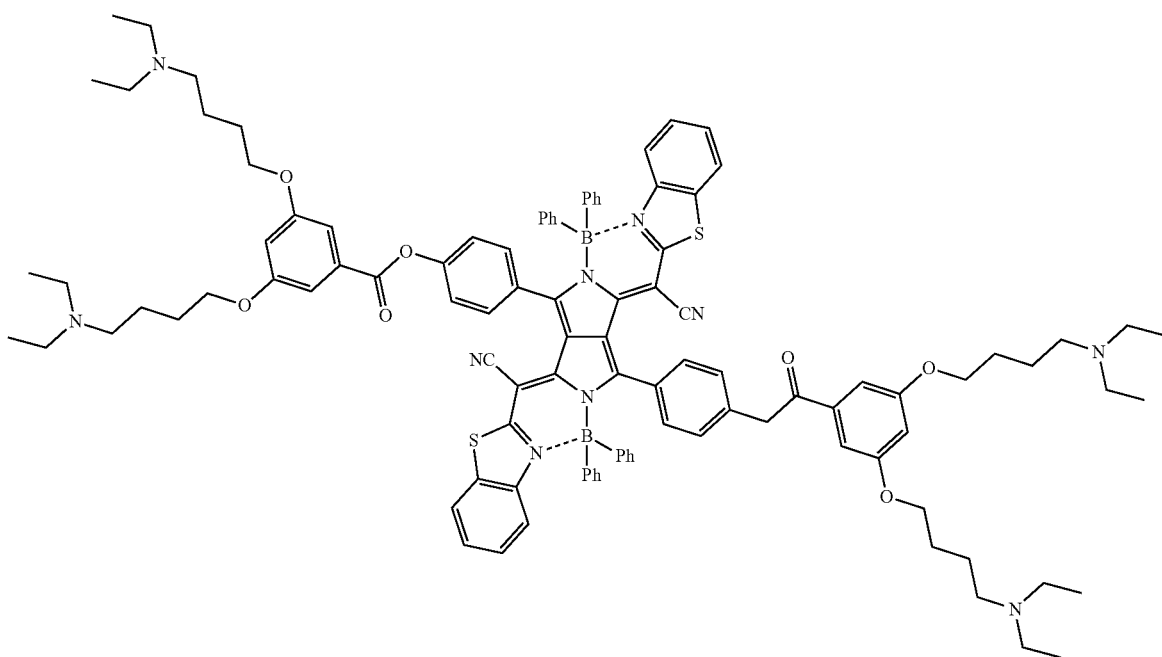
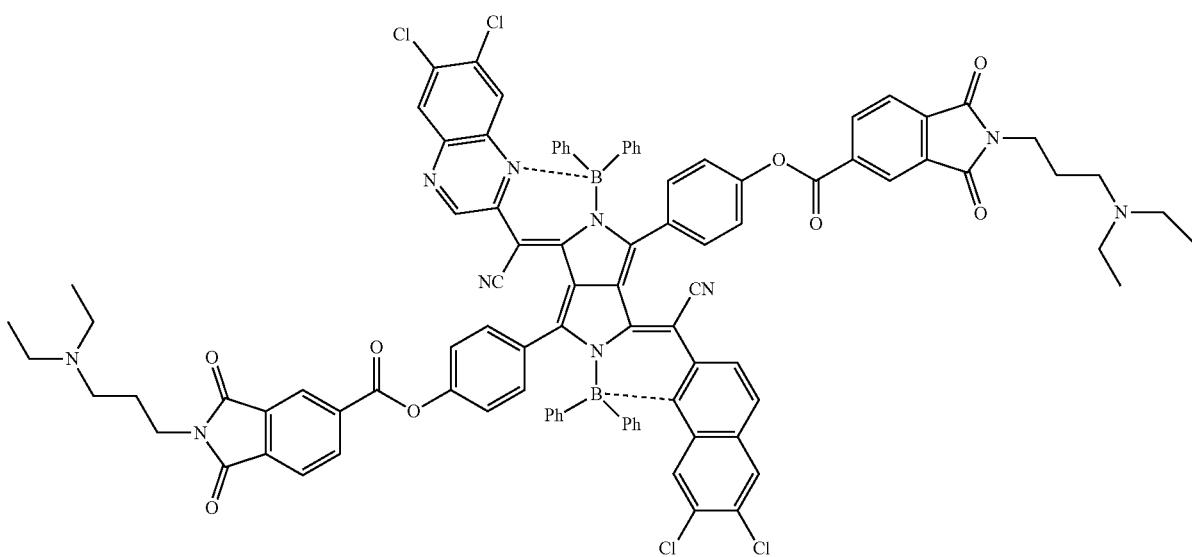
(Dispersing Agent)
Dispersing agent 1: Resin having the following structure (weight-average molecular weight=21,000). Numerical values of a to e appended to the main chain represents a molar ratio of the repeating unit, and numerical values of X and Y appended to a side chain represents the number of repeating units.
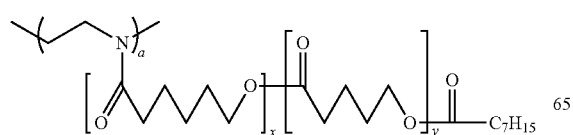
-continued
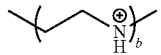
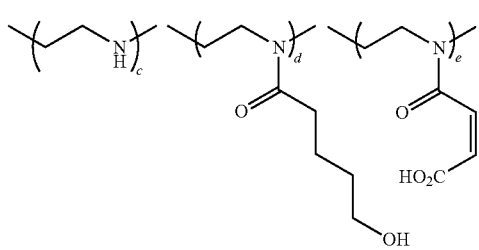

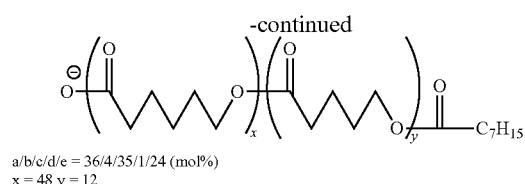

a/b/c/d/e = 36/4/35/1/24 (mol%)
x = 48 y = 12

Dispersing agent 2: Resin having the following structure (weight-average molecular weight=38,900). A numerical value appended to the main chain represents a molar ratio of the repeating unit, and a numerical value appended to a side chain represents the number of repeating units.

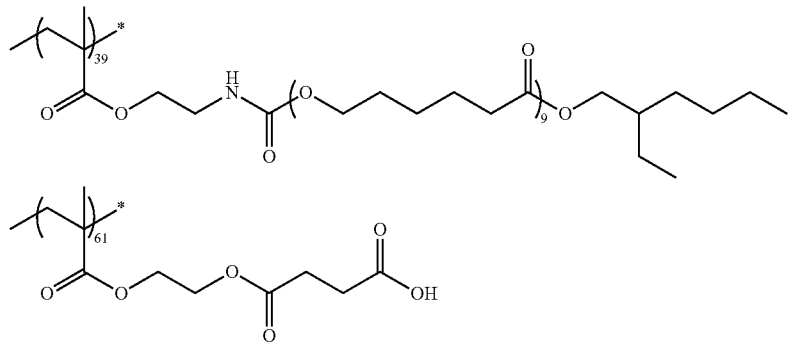

(Solvent)
PGMEA: Propylene glycol monomethyl ether acetate
<Resin Composition>
Respective materials were mixed and stirred at a proportion presented in the following Formulation, were filtrated through a nylon filter with a pore diameter of 0.45 μm (manufactured by Nippon Pall Ltd.), and then purified by the cation exchange filter filtration, to adjust the content of the Na atom and prepare each resin composition.
(Formulation 1)
Dispersion liquid presented in Table 2 below . . . 38.8 parts by mass
Alkali-soluble resin 2 . . . 4.2 parts by mass
Polymerizable compound 1 . . . 4.2 parts by mass
Polymerizable compound 2 . . . 4.2 parts by mass
Photopolymerization initiator 1 . . . 0.9 parts by mass
Surfactant 1 . . . 0.03 parts by mass
Ultraviolet absorbing agent 1 . . . 1.6 parts by mass
Antioxidant 1 . . . 0.2 parts by mass
Antioxidant 2 . . . 0.005 parts by mass
Solvent 1 . . . 45.9 parts by mass
(Formulation 2)
Dispersion liquid presented in Table 2 below . . . 50.4 parts by mass
Alkali-soluble resin 1 . . . 0.60 parts by mass
Polymerizable compound 3 . . . 0.60 parts by mass
Photopolymerization initiator 1 . . . 0.34 parts by mass
Surfactant 1 . . . 0.04 parts by mass
Antioxidant 2 . . . 0.0005 parts by mass
Solvent 1 . . . 48.0 parts by mass
(Formulation 3)
Dispersion liquid presented in Table 2 below . . . 38.8 parts by mass
Alkali-soluble resin 2 . . . 0.9 parts by mass
Alkali-soluble resin 3 . . . 3.3 parts by mass
Polymerizable compound 1 . . . 4.2 parts by mass
Polymerizable compound 2 . . . 4.2 parts by mass
Photopolymerization initiator 1 . . . 0.9 parts by mass
Surfactant 1 . . . 0.03 parts by mass
Ultraviolet absorbing agent 1 . . . 1.6 parts by mass
Antioxidant 1 . . . 0.2 parts by mass
Antioxidant 2 . . . 0.005 parts by mass
Solvent 1 . . . 45.9 parts by mass
(Formulation 4)
Dispersion liquid presented in Table 2 below . . . 10 parts by mass
Epoxy resin 1 . . . 50 parts by mass
Epoxy curing agent 1 . . . 0.5 parts by mass
Surfactant 1 . . . 0.03 parts by mass
Solvent 2 . . . 100 parts by mass Alkali-soluble resin 1: Resin of the following structure (the numerical value in the repeating unit is a molar ratio, Mw=11,000, content of Na atom=0.2 mass ppm, content of Li atom=0.01 mass ppm, content of K atom=0.01 mass ppm)

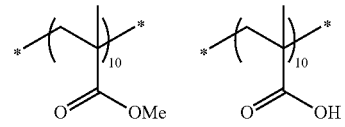

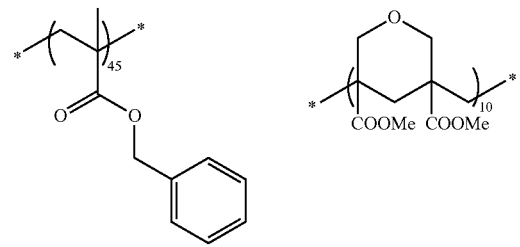

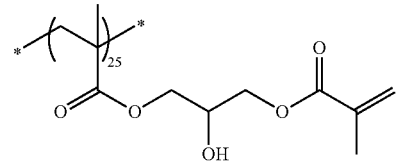

Alkali-soluble resin 2: Resin of the following structure (the numerical value in the repeating unit is a molar ratio, Mw=41,300, content of Na atom=0.7 mass ppm, content of Li atom=0.1 mass ppm, content of K atom=0.1 mass ppm)

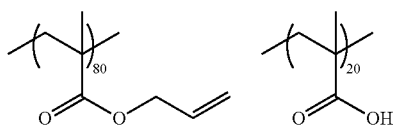

Alkali-soluble resin 3: Resin of the following structure (the numerical value in the repeating unit is a molar ratio, Mw=7,300, content of Na atom=130 mass ppm, content of Li atom=0.1 mass ppm, content of K atom=2.5 mass ppm)

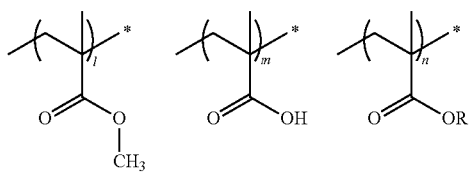

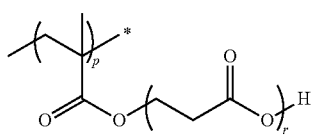

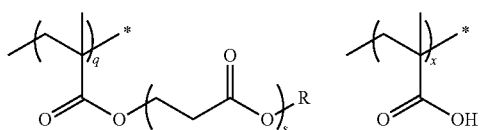

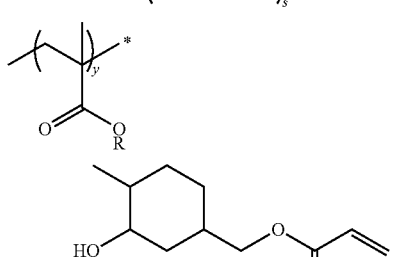

R =

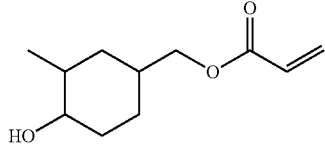

l: (m + n + p + q): (x + y) = (43 ± 14): (11 ± 6): (46 ± 14) [Molar ratio]
r, s:1 ~ 6

Epoxy resin 1: MERPROOF G-0150M (Mw=10,000, content of Na atom=0.1 mass ppm, content of Li atom=0.1 mass ppm, content of K atom=0.1 mass ppm) manufactured by NOF Corporation Epoxy curing agent 1: Succinic acid Polymerizable compound 1: Compound having the following structure

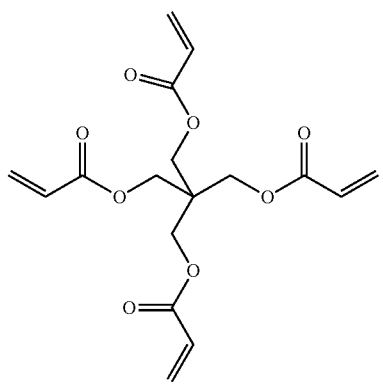 [SMILES: C=CC(=O)OCC(COC(=O)C=C)(COC(=O)C=C)COC(=O)C=C]

Polymerizable compound 2: Mixture of compounds of the following structure (height ratio in high performance liquid chromatography Compound on the left:compound in the center: compound on the right=46.15:49.39:4.46)

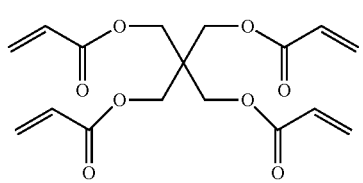

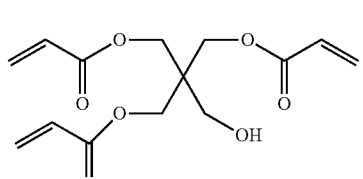

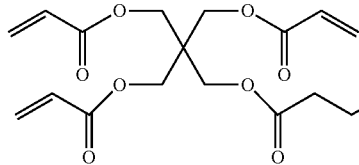

Polymerizable compound 3: Compound having the following structure

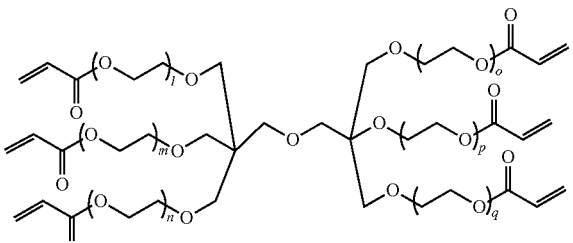

l + m + n + o + p + q = 12

Photopolymerization initiator 1: Compound having the following structure

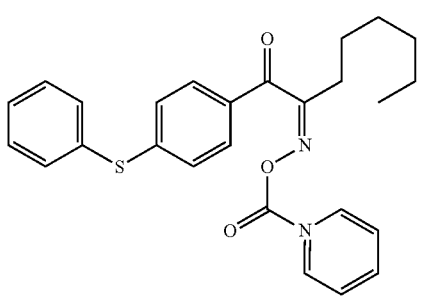

Ultraviolet absorbing agent 1: Compound having the following structure

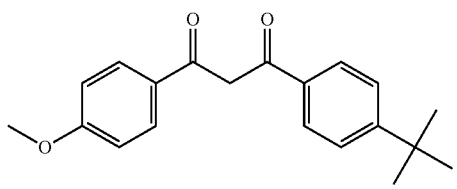 [SMILES: COc1ccc(C(=O)CC(=O)c2ccc(C(C)(C)C)cc2)cc1]

Antioxidant 1: Compound having the following structure

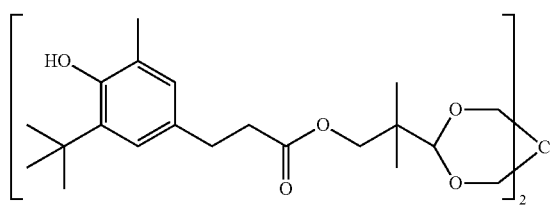

Antioxidant 2: Compound having the following structure

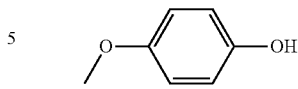

Surfactant 1: The following mixture (Mw=14,000). In the following formula, % that indicates a proportion of the repeating unit is mol %.

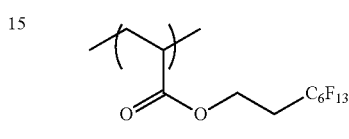

62%

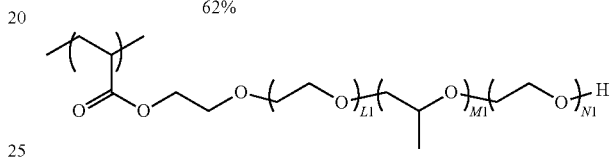

38%

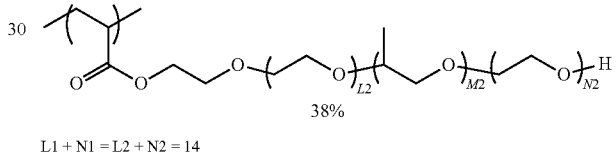

$L1 + N1 = L2 + N2 = 14$
$M1 = M2 = 17$

Solvent 1: Propylene glycol monomethyl ether acetate (PGMEA)
Solvent 2: Methyl ethyl ketone

TABLE 2

| | Formulation of resin composition | Kind of dispersion liquid | Content of each atom with respect to total solid content of resin composition | | |
| --- | --- | --- | --- | --- | --- |
| | | | Content of Li atom | Content of Na atom | Content of K atom |
| Resin composition 1 | Formulation 1 | Dispersion liquid 1 | <1 mass ppm | 2.2 mass ppm | <2 mass ppm |
| Resin composition 2 | Formulation 1 | Dispersion liquid 2 | <1 mass ppm | 1.9 mass ppm | <2 mass ppm |
| Resin composition 3 | Formulation 1 | Dispersion liquid 3 | <1 mass ppm | 2.5 mass ppm | <2 mass ppm |
| Resin composition 4 | Formulation 1 | Dispersion liquid 4 | <1 mass ppm | 2.5 mass ppm | <2 mass ppm |
| Resin composition 5 | Formulation 1 | Dispersion liquid 5 | <1 mass ppm | 2.9 mass ppm | <2 mass ppm |
| Resin composition 6 | Formulation 1 | Dispersion liquid 6 | <1 mass ppm | 2.9 mass ppm | <2 mass ppm |
| Resin composition 7 | Formulation 1 | Dispersion liquid 7 | <1 mass ppm | 2.2 mass ppm | <2 mass ppm |
| Resin composition 8 | Formulation 1 | Dispersion liquid 8 | <1 mass ppm | 2.2 mass ppm | <2 mass ppm |
| Resin composition 9 | Formulation 2 | Dispersion liquid 9 | <1 mass ppm | 1.4 mass ppm | <2 mass ppm |
| Resin composition 10 | Formulation 2 | Dispersion liquid 10 | <1 mass ppm | 1.9 mass ppm | <2 mass ppm |
| Resin composition 11 | Formulation 1 | Dispersion liquid 11 | <1 mass ppm | 2.6 mass ppm | <2 mass ppm |
| Resin composition 12 | Formulation 1 | Dispersion liquid 12 | <1 mass ppm | 2.3 mass ppm | <2 mass ppm |
| Resin composition 13 | Formulation 1 | Dispersion liquid 13 | <1 mass ppm | 3.2 mass ppm | <2 mass ppm |
| Resin composition 14 | Formulation 4 | Dispersion liquid 14 | <1 mass ppm | 1.4 mass ppm | <2 mass ppm |
| Resin composition 15 | Formulation 1 | Dispersion liquid 15 | <1 mass ppm | 2.2 mass ppm | <2 mass ppm |
| Resin composition 16 | Formulation 3 | Dispersion liquid 16 | <1 mass ppm | 22 mass ppm | <2 mass ppm |
| Resin composition 17 | Formulation 1 | Dispersion liquid 17 | <1 mass ppm | 55 mass ppm | <2 mass ppm |
| Resin composition 18 | Formulation 1 | Dispersion liquid 18 | <1 mass ppm | 55 mass ppm | <2 mass ppm |

<Evaluation of Generation of Foreign Matters>

As a support, a support in which a base film 1 or a base film 2 was formed on the substrate presented in the following table was used. The base film 1 was formed by coating a substrate with a composition for forming a base film (CT-5000S, manufactured by Fujifilm Electronics Materials Co., Ltd.) by a spin coating method and performing thermal curing at 220° C. The film thickness of the base film 1 after thermal curing was 0.5 μm, the content of the Na atoms in the base film 1 was 3 mass ppm, the content of Li atoms was 1 mass ppm or less, and the content of the K atoms was 1 mass ppm or less. The base film 2 was formed by coating a substrate with a composition for forming a base film (CT-4000L, manufactured by Fujifilm Electronics Materials Co., Ltd.) by a spin coating method and performing thermal curing at 220° C. The film thickness of the base film 2 after thermal curing was 0.1 μm, the content of the Na atoms in the base film 2 was 50 mass ppm, the content of Li atoms was 1 mass ppm or less, and the content of the K atoms was 1 mass ppm or less.

The support presented in the following table was coated with the resin composition by a spin coating method such that the film thickness after coating was 0.85 μm, and then was heated at 100° C. for two minutes by using a hot plate. Subsequently, after the exposure was performed with an exposure amount of 2,000 mJ/cm$^2$ by using an exposure machine, heating was performed by using a hot plate at 220° C. for five minutes, to form a resin film. With respect to the obtained resin film, the surface of the resin film was imaged at a magnification of 10,000 with a scanning electron microscope to observe the presence or absence of foreign matters, and evaluation was made according to the following standards. Needle-like crystals were counted as foreign matters.

1: There were zero foreign matters.
2: The number of foreign matters was 1 to 3.
3: The number of foreign matters was 4 to 30.
4: The number of foreign matters was 31 or more.

As presented in the above table, resin films having few foreign matters were able to be formed in the examples.

Even in a case where the content of the Na atom in the resin film was adjusted to 0.01 to 50 mass ppm with respect to the total solid content of the resin film by adjusting the Na atom content in the base film and transferring a Na atom from the base film to the resin film in a case of the film formation of the resin film, the same effect as in the examples was able to be obtained.

Test Example 2

The resin composition of Example 2 was applied onto a silicon wafer by a spin coating method so that the film thickness after film formation became 1.0 μm. Subsequently, heating was performed at 100° C. for two minutes by using a hot plate. Subsequently, exposure was by using a mask having a Bayer pattern of 2 μm square in an exposure amount of 1,000 mJ/cm$^2$ with an i-line stepper exposure device FPA-3000i5+ (manufactured by Canon Inc.).

Subsequently, the puddle development was performed at 23° C. for 60 seconds by using an aqueous solution of 0.3 mass % tetramethylammonium hydroxide (TMAH). Thereafter, the substrate was rinsed with a spin shower, and further washed with pure water. Subsequently, a resin film (near infrared cut filter) having a Bayer pattern with a 2 μm square was formed by performing heating at 200° C. for five minutes by using a hot plate.

A red composition was applied onto the Bayer pattern of the near infrared cut filter by a spin coating method so that the film thickness after film formation became 1.0 μm. Subsequently, heating was performed at 100° C. for two minutes using a hot plate. Subsequently, exposure was by using a mask having a Bayer pattern of 2 μm square in an exposure amount of 1,000 mJ/cm$^2$ with an i-line stepper exposure device FPA-3000i5+ (manufactured by Canon Inc.). Subsequently, the puddle development was performed at 23° C. for 60 seconds by using an aqueous solution of 0.3 mass % tetramethylammonium hydroxide (TMAH). Thereafter, the substrate was rinsed with a spin shower, and further

TABLE 3

| | | | Support | | | |
|---|---|---|---|---|---|---|
| | | | | Substrate | | Generation |
| | Resin composition used | Kind of base film | Kind | Content of Na atom | Na Content of resin film | of foreign matters |
| Example 1 | Resin composition 1 | Base film 1 | Si substrate | <1 mass ppm | 3 mass ppm | 1 |
| Example 2 | Resin composition 2 | Base film 1 | Si substrate | <1 mass ppm | 2 mass ppm | 1 |
| Example 3 | Resin composition 3 | Base film 1 | Si substrate | <1 mass ppm | 3 mass ppm | 1 |
| Example 4 | Resin composition 4 | Base film 1 | Si substrate | <1 mass ppm | 3 mass ppm | 1 |
| Example 5 | Resin composition 5 | Base film 1 | Si substrate | <1 mass ppm | 3 mass ppm | 1 |
| Example 6 | Resin composition 6 | Base film 1 | Si substrate | <1 mass ppm | 3 mass ppm | 1 |
| Example 7 | Resin composition 7 | Base film 1 | Si substrate | <1 mass ppm | 3 mass ppm | 1 |
| Example 8 | Resin composition 8 | Base film 1 | Alkali-free glass | <1 mass ppm | 3 mass ppm | 1 |
| Example 9 | Resin composition 9 | Base film 1 | Si substrate | <1 mass ppm | 2 mass ppm | 1 |
| Example 10 | Resin composition 10 | Base film 1 | Si substrate | <1 mass ppm | 2 mass ppm | 1 |
| Example 11 | Resin composition 11 | Base film 1 | Si substrate | <1 mass ppm | 3 mass ppm | 1 |
| Example 12 | Resin composition 12 | Base film 1 | Si substrate | <1 mass ppm | 3 mass ppm | 1 |
| Example 13 | Resin composition 13 | Base film 1 | Si substrate | <1 mass ppm | 3 mass ppm | 1 |
| Example 14 | Resin composition 14 | Base film 1 | Si substrate | <1 mass ppm | 2 mass ppm | 1 |
| Example 15 | Resin composition 15 | Base film 2 | Si substrate | <1 mass ppm | 30 mass ppm | 2 |
| Example 16 | Resin composition 16 | Base film 1 | Si substrate | <1 mass ppm | 20 mass ppm | 2 |
| Comparative example 1 | Resin composition 17 | Base film 1 | Si substrate | <1 mass ppm | 55 mass ppm | 3 |
| Comparative example 2 | Resin composition 18 | Base film 1 | Soda glass | 15 mass % | 90 mass ppm | 4 | washed with pure water. Subsequently, the red composition was patterned on the Bayer pattern of the near infrared cut filter by performing heating at 200° C. for five minutes with a hot plate. A green composition and a blue composition were sequentially patterned in the same manner, so as to form resin films having red, green, and blue coloration patterns.

Subsequently, a composition for forming an infrared transmitting filter was applied onto a resin film on which the pattern was formed by a spin coating method such that the film thickness after film formation became 2.0 µm. Subsequently, heating was performed at 100° C. for two minutes by using a hot plate. Subsequently, exposure was by using a mask having a Bayer pattern of 2 µm square in an exposure amount of 1,000 mJ/cm$^2$ with an i-line stepper exposure device FPA-3000i5+ (manufactured by Canon Inc.). Subsequently, the puddle development was performed at 23° C. for 60 seconds by using an aqueous solution of 0.3 mass % tetramethylammonium hydroxide (TMAH). Thereafter, the substrate was rinsed with a spin shower, and further washed with pure water. Subsequently, by performing heating at 200° C. for five minutes with a hot plate, patterning of the infrared transmitting filter was performed on a portion of the near infrared cut filter in which the Bayer pattern was not provided, so as to manufacture an optical filter. This optical filter was incorporated in a solid-state imaging element by a well-known method.

The obtained solid-state imaging element was irradiated with a light source of an infrared light emitting diode (infrared LED) under a low illuminance environment (0.001 Lux), images were captured, and image performance was evaluated. A subject was able to be clearly recognized on the image. The incidence angle dependence was satisfactory.

The red composition, the green composition, the blue composition, and the composition for forming an infrared transmitting filter used in Test Example 2 were as below.

(Red Composition)

The following components were mixed and stirred, and then filtrated through a nylon filter (manufactured by Nippon Pall Ltd.) having a pore diameter of 0.45 µm to prepare the red composition.

Red pigment dispersion liquid . . . 51.7 parts by mass
Resin 14 . . . 0.6 parts by mass
Polymerizable compound 14 . . . 0.6 parts by mass
Photopolymerization initiator 11 . . . 0.4 parts by mass
Surfactant 11 . . . 4.2 parts by mass
Ultraviolet absorbing agent (UV-503, manufactured by Daito Chemical Co., Ltd.) . . . 0.3 parts by mass
PGMEA . . . 42.6 parts by mass (Green Composition)

The following components were mixed and stirred, and then filtrated through a nylon filter (manufactured by Nippon Pall Ltd.) having a pore diameter of 0.45 µm to prepare the green composition.

Green pigment dispersion liquid . . . 73.7 parts by mass
Resin 14 . . . 0.3 parts by mass
Polymerizable compound 11 . . . 1.2 parts by mass
Photopolymerization initiator 11 . . . 0.6 parts by mass
Surfactant 11 . . . 4.2 parts by mass
Ultraviolet absorbing agent (UV-503, manufactured by Daito Chemical Co., Ltd.) . . . 0.5 parts by mass
PGMEA . . . 19.5 parts by mass (Blue Composition)

The following components were mixed and stirred, and then filtrated through a nylon filter (manufactured by Nippon Pall Ltd.) having a pore diameter of 0.45 µm to prepare the blue composition.

Blue pigment dispersion liquid . . . 44.9 parts by mass
Resin 14 . . . 2.1 parts by mass
Polymerizable compound 11 . . . 1.5 parts by mass
Polymerizable compound 14 . . . 0.7 parts by mass
Photopolymerization initiator 11 . . . 0.8 parts by mass
Surfactant 11 . . . 4.2 parts by mass
Ultraviolet absorbing agent (UV-503, manufactured by Daito Chemical Co., Ltd.) . . . 0.3 parts by mass
PGMEA . . . 45.8 parts by mass (Composition for Forming Infrared Transmitting Filter)

Components having the following composition were mixed and stirred, and then filtrated through a nylon filter (manufactured by Nippon Pall Ltd.) having a pore diameter of 0.45 µm to prepare the composition for forming an infrared transmitting filter.

Pigment Dispersion Liquid 1-1 . . . 46.5 parts by mass
Pigment Dispersion Liquid 1-2 . . . 37.1 parts by mass
Polymerizable compound 15 . . . 1.8 parts by mass
Resin 14 . . . 1.1 parts by mass
Photopolymerization initiator 12 . . . 0.9 parts by mass
Surfactant 11 . . . 4.2 parts by mass
Polymerization inhibitor (p-methoxy phenol) . . . 0.001 parts by mass
Silane coupling agent . . . 0.6 parts by mass
PGMEA . . . 7.8 parts by mass Raw materials used in the red composition, the green composition, the blue composition, and the composition for forming an infrared transmitting filter were as below.

Red Pigment Dispersion Liquid

A mixed liquid including 9.6 parts by mass of C. I. Pigment Red 254, 4.3 parts by mass of C. I. Pigment Yellow 139, 6.8 parts by mass of a dispersing agent (Disperbyk-161, manufactured by BYK-Chemie GmbH), and 79.3 parts by mass of PGMEA was mixed and dispersed with a beads mill (zirconia beads 0.3 mm in diameter) for three hours so as to prepare a pigment dispersion liquid. A dispersion treatment was performed with a high pressure dispersing machine with a pressure reducing mechanism NANO-3000-10 (manufactured by Beryu corp.), under the pressure of 2,000 kg/cm$^3$ at a flow rate of 500 g/min. This dispersion treatment was repeated ten times to obtain a red pigment dispersion liquid.

Green Pigment Dispersion Liquid

A mixed liquid including 6.4 parts by mass of C. I. Pigment Green 36, 5.3 parts by mass of C. I. Pigment Yellow 150, 5.2 parts by mass of a dispersing agent (Disperbyk-161, manufactured by BYK-Chemie GmbH), and 83.1 parts by mass of PGMEA was dispersed with a beads mill (zirconia beads 0.3 mm in diameter) for three hours so as to prepare a pigment dispersion liquid. A dispersion treatment was performed with a high pressure dispersing machine with a pressure reducing mechanism NANO-3000-10 (manufactured by Beryu corp.), under the pressure of 2,000 kg/cm$^3$ at a flow rate of 500 g/min. This dispersion treatment was repeated ten times to obtain a green pigment dispersion liquid.

Blue Pigment Dispersion Liquid

A mixed liquid including 9.7 parts by mass of C. I. Pigment Blue 15:6, 2.4 parts by mass of C. I. Pigment Violet 23, 5.5 parts by mass of a dispersing agent (Disperbyk-161, manufactured by BYK-Chemie GmbH), and 82.4 parts by mass of PGMEA was mixed and dispersed with a beads mill (zirconia beads 0.3 mm in diameter) for three hours so as to prepare a pigment dispersion liquid. A dispersion treatment was performed with a high pressure dispersing machine with a pressure reducing mechanism NANO-3000-10 (manufactured by Beryu corp.), under the pressure of 2,000 kg/cm$^3$ at a flow rate of 500 g/min. This dispersion treatment was repeated ten times to obtain a blue pigment dispersion liquid.

Pigment Dispersion Liquid 1-1

The mixed liquid having the following composition was mixed and dispersed for three hours with a beads mill (high-pressure dispersing machine NANO-3000-10 (manufactured by Beryu corp.) with a pressure reducing mechanism) by using zirconia beads having a diameter of 0.3 mm to prepare a pigment dispersion liquid 1-1.

Mixed pigment including a red pigment (C. I. Pigment Red 254) and a yellow pigment (C. I. Pigment Yellow 139) . . . 11.8 parts by mass
Resin (Disperbyk-111, manufactured by BYK-Chemie GmbH) . . . 9.1 parts by mass
PGMEA . . . 79.1 parts by mass Pigment Dispersion Liquid 1-2

The mixed liquid having the following composition was mixed and dispersed for three hours with a beads mill (high-pressure dispersing machine NANO-3000-10 (manufactured by Beryu corp.) with a pressure reducing mechanism) by using zirconia beads having a diameter of 0.3 mm to prepare a pigment dispersion liquid 1-2.

Mixed pigment including a blue pigment (C. I. Pigment Blue 15:6) and a violet pigment (C. I. Pigment Violet 23) . . . 12.6 parts by mass
Resin (Disperbyk-111, manufactured by BYK-Chemie GmbH) . . . 2.0 parts by mass
Resin A . . . 3.3 parts by mass
Cyclohexanone . . . 31.2 parts by mass
PGMEA . . . 50.9 parts by mass Resin A: Resin having the following structure (Mw=14,000, a numerical value in the repeating unit is a molar ratio)

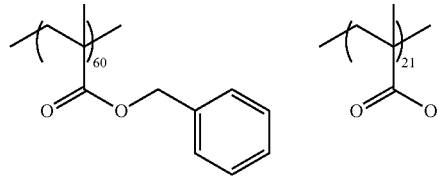

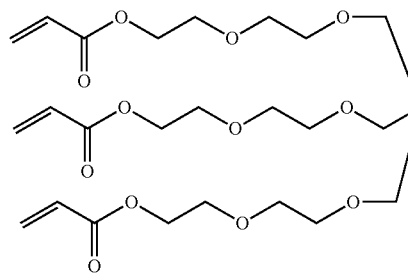

Polymerizable compound 11: KAYARAD DPHA (manufactured by Nippon Kayaku Co., Ltd.)

Polymerizable compound 14: Compound having the following structure

Polymerizable compound 15: Compound having the following structure (a mixture of a molar ratio of the left compound and the right compound is 7:3)

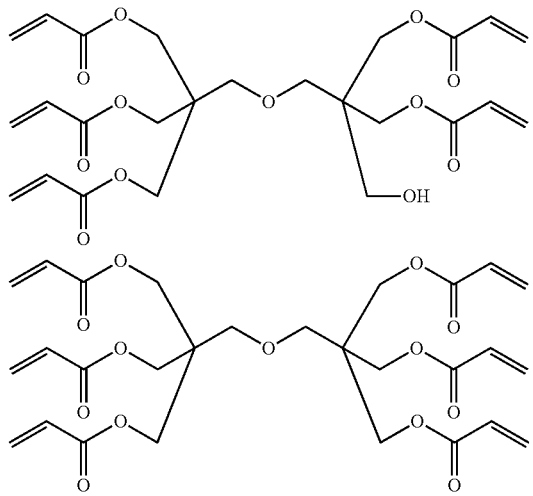

Resin 14: Resin having the following structure (Acid value: 70 mg KOH/g, Mw=11,000, a numerical value in the repeating unit is a molar ratio)

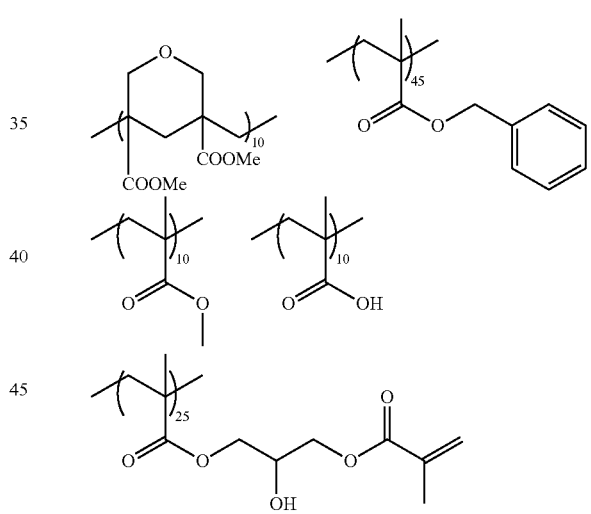

Photopolymerization initiator 11: IRGACURE-OXE01 (manufactured by BASF SE)

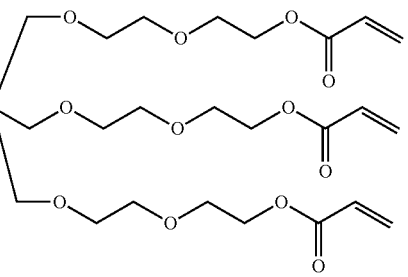

Photopolymerization initiator 12: Compound having the following structure

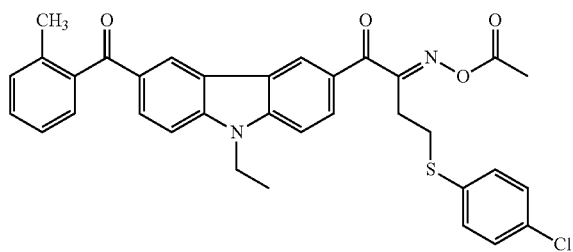 [SMILES: CCn1c2ccc(C(=O)/C(CCSc3ccc(Cl)cc3)=N/OC(C)=O)cc2c2cc(C(=O)c3ccccc3C)ccc21]

Surfactant 11: 1 mass % PGMEA solution of the mixture (Mw=14,000). In the following formula, % that indicates a proportion of the repeating unit is mol %.

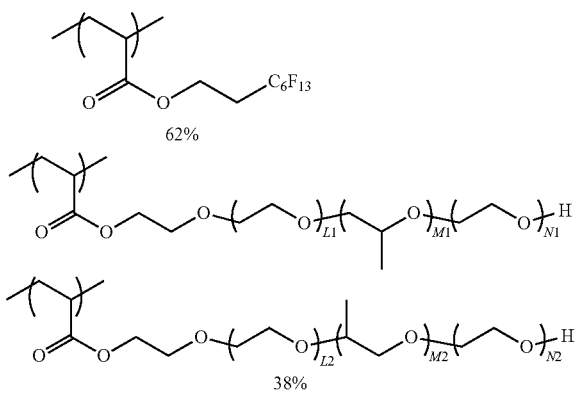

L1 + N1 = L2 + N2 = 14
M1 = M2 = 17

Silane coupling agent: Compound having the following structure. In the following structural formula, Et represents an ethyl group.

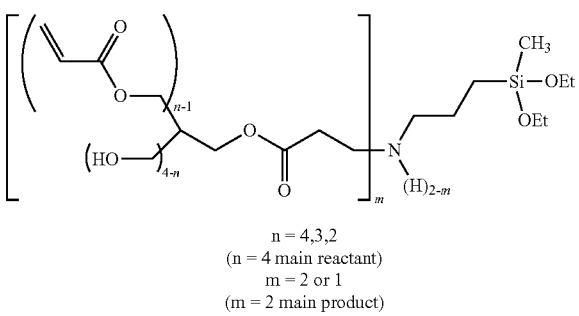

n = 4,3,2
(n = 4 main reactant)
m = 2 or 1
(m = 2 main product)

EXPLANATION OF REFERENCES

110: solid-state imaging element
111: near infrared cut filter
112: color filter
114: infrared transmitting filter
115: microlens
116: planarizing layer
201: substrate
202: base film
203, 231: near infrared cut filter
204a, 204b, 204c: color filter
205: infrared transmitting filter
250: microlens
260: oxygen shielding layer
265: partition wall
270: layer of low refractive index
271: dielectric multilayer film
272: planarizing layer

What is claimed is:

1. A resin composition comprising:
an organic pigment;
a resin; and
a solvent,
wherein the organic pigment includes a near infrared absorbing organic pigment having a maximum absorption wavelength in a wavelength range of 700 to 1000 nm, and the near infrared absorbing organic pigment includes at least one compound selected from the group consisting of a compound represented by Formula (PP), a compound represented by Formula (SQ), and a compound represented by Formula (C), and
wherein a content of a Na atom is 0.01 to 50 mass ppm with respect to a total solid content of the resin composition,

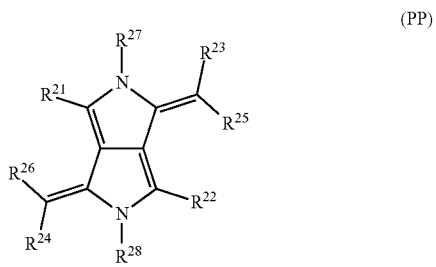

(PP)

in Formula (PP), $R^{21}$ and $R^{22}$ each independently represent an alkyl group, an aryl group or a heteroaryl group,
$R^{23}$, $R^{24}$, $R^{25}$, $R^{26}$ each independently represent a cyano group, an acyl group, an alkoxycarbonyl group, an alkyl sulfinyl group, an arylsulfinyl group or a heteroaryl group,
$R^{27}$ and $R^{28}$ each independently represent a hydrogen atom, an alkyl group, an aryl group, a heteroaryl group, —$BR^{29}R^{30}$, or a metal atom,
$R^{27}$ optionally forms a covalent bond or a coordinate bond with $R^{21}$, $R^{23}$, or $R^{25}$,
$R^{28}$ optionally forms a covalent bond or a coordinate bond with $R^{22}$, $R^{24}$, or $R^{26}$, and
$R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ are optionally bonded to each other to form a ring,

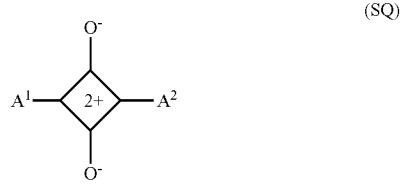

(SQ)

in Formula (SQ), $A^1$ and $A^2$ each independently represent an aryl group, a heteroaryl group, or a group represented by Formula (A-1); and

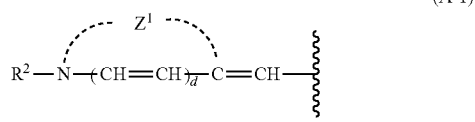

(A-1)

in Formula (A-1), $Z^1$ represents a nonmetallic atomic group forming a nitrogen-containing heterocyclic ring, $R^2$ represents an alkyl group, an alkenyl group, or an aralkyl group, d represents 0 or 1, and a wavy line represents a linking hand, and
Formula (C)

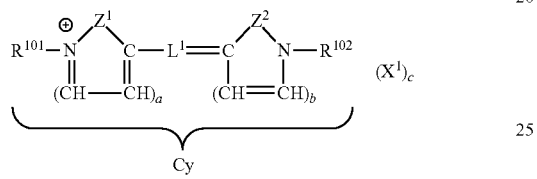

in Formula (C), $Z^1$ and $Z^2$ are each independently a nonmetallic atomic group forming a 5-membered or 6-membered nitrogen-containing heterocyclic ring that is optionally fused,
$R^{101}$ and $R^{102}$ each independently represent an alkyl group, an alkenyl group, an alkynyl group, an aralkyl group, or an aryl group,
$L^1$ represents a methine chain having an odd number of methine groups,
a and b are each independently 0 or 1,
in a case where a is 0, a carbon atom and a nitrogen atom are bonded to each other by a double bond, and in a case where b is 0, a carbon atom and a nitrogen atom are bonded to each other by a single bond, and
in a case where a moiety represented by Cy in the formula is a cation moiety, $X^1$ represents an anion, and c represents the number necessary for balancing the charge, in a case where the moiety represented by Cy in the formula is an anion moiety, $X^1$ represents a cation, c represents a number necessary for balancing the charge, and in a case where the moiety represented by Cy in the formula is neutralized in the molecule, c is 0.

2. The resin composition according to claim 1, wherein the content of the Na atom is 0.03 to 30 mass ppm with respect to the total solid content of the resin composition.

3. The resin composition according to claim 1, wherein the content of the Na atom is 0.1 to 10 mass ppm with respect to the total solid content of the resin composition.

4. The resin composition according to claim 1, wherein a content of a K atom is 10 mass ppm or less with respect to the total solid content of the resin composition.

5. The resin composition according to claim 1, wherein a content of a Li atom is 10 mass ppm or less with respect to the total solid content of the resin composition.

6. The resin composition according to claim 1, further comprising:
a pigment derivative.

7. A resin film obtained from the resin composition according to claim 1.

8. A resin film comprising:
an organic pigment; and
a resin,
wherein the organic pigment includes a near infrared absorbing organic pigment having a maximum absorption wavelength in a wavelength range of 700 to 1000 nm, and the near infrared absorbing organic pigment includes at least one compound selected from the group consisting of a compound represented by Formula (PP), a compound represented by Formula (SQ), and a compound represented by Formula (C), and
wherein a content of a Na atom is 0.01 to 50 mass ppm with respect to a total solid content of the resin film

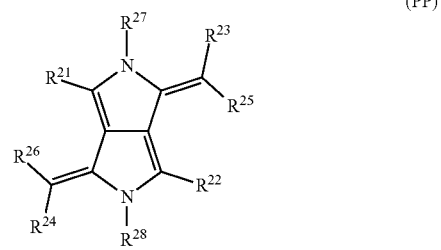

(PP)

in Formula (PP), $R^{21}$ and $R^{22}$ each independently represent an alkyl group, an aryl group or a heteroaryl group,
$R^{23}$, $R^{24}$, $R^{25}$, $R^{26}$ each independently represent a cyano group, an acyl group, an alkoxycarbonyl group, an alkyl sulfinyl group, an arylsulfinyl group or a heteroaryl group,
$R^{27}$ and $R^{28}$ each independently represent a hydrogen atom, an alkyl group, an aryl group, a heteroaryl group, $-BR^{29}R^{30}$, or a metal atom,
$R^{27}$ optionally forms a covalent bond or a coordinate bond with $R^{21}$, $R^{23}$, $R^{25}$,
$R^{28}$ optionally forms a covalent bond or a coordinate bond with $R^{22}$, $R^{24}$, or $R^{26}$, and
$R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ are optionally bonded to each other to form a ring,

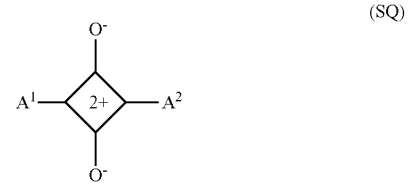

(SQ)

in Formula (SQ), $A^1$ and $A^2$ each independently represent an aryl group, a heteroaryl group, or a group represented by Formula (A-1); and

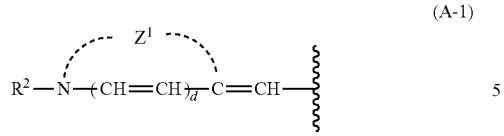

(A-1)

in Formula (A-1), $Z^1$ represents a nonmetallic atomic group forming a nitrogen-containing heterocyclic ring, $R^2$ represents an alkyl group, an alkenyl group, or an aralkyl group, d represents 0 or 1, and a wavy line represents a linking hand, and Formula (C)

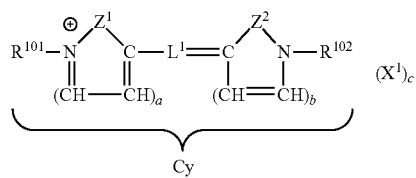

(X$^1$)$_c$ in Formula (C), $Z^1$ and $Z^2$ are each independently a nonmetallic atomic group forming a 5-membered or 6-membered nitrogen-containing heterocyclic ring that is optionally fused, $R^{101}$ and $R^{102}$ each independently represent an alkyl group, an alkenyl group, an alkynyl group, an aralkyl group, or an aryl group, $L^1$ represents a methine chain having an odd number of methine groups, a and b are each independently 0 or 1, in a case where a is 0, a carbon atom and a nitrogen atom are bonded to each other by a double bond, and in a case where b is 0, a carbon atom and a nitrogen atom are bonded to each other by a single bond, and in a case where a moiety represented by Cy in the formula is a cation moiety, $X^1$ represents an anion, and c represents the number necessary for balancing the charge, in a case where the moiety represented by Cy in the formula is an anion moiety, $X^1$ represents a cation, c represents a number necessary for balancing the charge, and in a case where the moiety represented by Cy in the formula is neutralized in the molecule, c is 0.

9. A method of manufacturing a resin film, comprising:
applying a resin composition including an organic pigment, a resin, and a solvent, onto a support, to manufacture a resin film including 0.01 to 50 mass ppm of a Na atom with respect to a total solid content of the resin film,
wherein the organic pigment includes a near infrared absorbing organic pigment having a maximum absorption wavelength in a wavelength range of 700 to 1000 nm, and the near infrared absorbing organic pigment includes at least one compound selected from the group consisting of a compound represented by Formula (PP), a compound represented by Formula (SQ), and a compound represented by Formula (C), and
wherein a resin composition in which a content of the Na atom is 0.01 to 50 mass ppm with respect to the total solid content of the resin composition is used as the resin composition, or in a case of manufacturing the resin film, the Na atom is transferred from a layer or a member adjacent to the resin film to the resin film, so as to adjust the content of the Na atom in the resin film to 0.01 to 50 mass ppm with respect to the total solid content of the resin film,

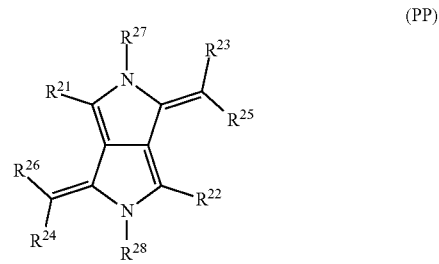

(PP)

in Formula (PP), $R^{21}$ and $R^{22}$ each independently represent an alkyl group, an aryl group or a heteroaryl group, $R^{23}$, $R^{24}$, $R^{25}$, $R^{26}$ each independently represent a cyano group, an acyl group, an alkoxycarbonyl group, an alkyl sulfinyl group, an arylsulfinyl group or a heteroaryl group, $R^{27}$ and $R^{28}$ each independently represent a hydrogen atom, an alkyl group, an aryl group, a heteroaryl group, —BR$^{29}$R$^{30}$, or a metal atom, $R^{27}$ optionally forms a covalent bond or a coordinate bond with $R^{21}$, $R^{23}$, or $R^{25}$, $R^{28}$ optionally forms a covalent bond or a coordinate bond with $R^{22}$, $R^{24}$, or $R^{26}$, and $R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ are optionally bonded to each other to form a ring,

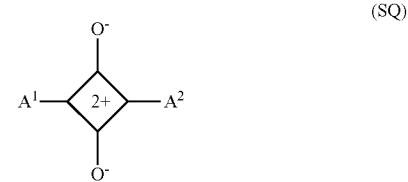

(SQ)

in Formula (SQ), $A^1$ and $A^2$ each independently represent an aryl group, a heteroaryl group, or a group represented by Formula (A-1); and

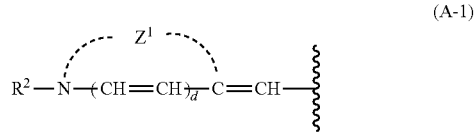

(A-1)

in Formula (A-1), $Z^1$ represents a nonmetallic atomic group forming a nitrogen-containing heterocyclic ring, $R^2$ represents an alkyl group, an alkenyl group, or an aralkyl group, d represents 0 or 1, and a wavy line represents a linking hand, and Formula (C)

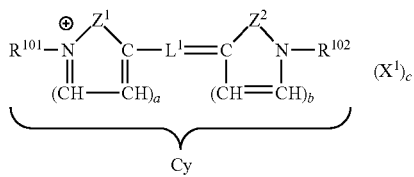

in Formula (C), $Z^1$ and $Z^2$ are each independently a nonmetallic atomic group forming a 5-membered or 6-membered nitrogen-containing heterocyclic ring that is optionally fused, $R^{101}$ and $R^{102}$ each independently represent an alkyl group, an alkenyl group, an alkynyl group, an aralkyl group, or an aryl group, $L^1$ represents a methine chain having an odd number of methine groups, a and b are each independently 0 or 1, in a case where a is 0, a carbon atom and a nitrogen atom are bonded to each other by a double bond, and in a case where b is 0, a carbon atom and a nitrogen atom are bonded to each other by a single bond, and in a case where a moiety represented by Cy in the formula is a cation moiety, $X^1$ represents an anion, and c represents the number necessary for balancing the charge, in a case where the moiety represented by Cy in the formula is an anion moiety, $X^1$ represents a cation, c represents a number necessary for balancing the charge, and in a case where the moiety represented by Cy in the formula is neutralized in the molecule, c is 0.

10. An optical filter comprising:
the resin film according to claim 7.

11. The optical filter according to claim 10,
wherein the optical filter is a color filter, a near infrared cut filter, or an infrared transmitting filter.

12. A solid-state imaging element comprising:
the resin film according to claim 7.

13. An image display device comprising:
the resin film according to claim 7.

14. An infrared sensor comprising:
the resin film according to claim 7.

15. The resin composition according to claim 1,
wherein the near infrared absorbing organic pigment includes the compound represented by Formula (PP).

16. The resin composition according to claim 1,
wherein the near infrared absorbing organic pigment includes the compound represented by Formula (SQ).

17. The resin composition according to claim 1,
wherein the near infrared absorbing organic pigment includes the compound represented by Formula (C).

18. The resin composition according to claim 1, further comprising:
an ultraviolet absorbing agent,
wherein the ultraviolet absorbing agent includes at least one compound selected from the group consisting of a conjugated diene compound, an amino butadiene compound, a methyl dibenzoyl compound, a coumarin compound, a salicylate compound, a benzophenone compound, a benzotriazole compound, an acrylonitrile compound, and a hydroxyphenyl triazine compound.

19. The resin composition according to claim 18,
wherein the ultraviolet absorbing agent includes at least one compound selected from the group consisting of the amino butadiene compound and the methyl dibenzoyl compound.

20. The resin composition according to claim 1, further comprising:
a coloring material that transmits at least part of light in near infrared range and shields light in visible range.

21. The resin composition according to claim 1,
wherein the organic pigment includes two or more kinds of the near infrared absorbing organic pigments having different maximum absorption wavelengths.

* * * * *